US012660695B2

(12) United States Patent
Ohmori

(10) Patent No.: US 12,660,695 B2
(45) Date of Patent: Jun. 16, 2026

(54) SEMICONDUCTOR DEVICE

(71) Applicant: ROHM CO., LTD., Kyoto (JP)

(72) Inventor: Kengo Ohmori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 698 days.

(21) Appl. No.: 18/006,963

(22) PCT Filed: Jul. 29, 2021

(86) PCT No.: PCT/JP2021/027995
§ 371 (c)(1),
(2) Date: Jan. 26, 2023

(87) PCT Pub. No.: WO2022/030339
PCT Pub. Date: Feb. 10, 2022

(65) Prior Publication Data
US 2023/0307424 A1 Sep. 28, 2023

(30) Foreign Application Priority Data

Aug. 6, 2020 (JP) ................................. 2020-133964

(51) Int. Cl.
H10W 90/00 (2026.01)
H10W 72/00 (2026.01)
(Continued)

(52) U.S. Cl.
CPC ........... H10W 90/00 (2026.01); H10W 74/47 (2026.01); H10W 90/701 (2026.01);
(Continued)

(58) Field of Classification Search
CPC ................. H01L 25/072; H01L 23/293; H01L 23/49811; H01L 24/32; H01L 24/48;
(Continued)

(56) References Cited

U.S. PATENT DOCUMENTS

2009/0237900 A1 9/2009 Origuchi et al.
2011/0227069 A1 9/2011 Hashimoto
(Continued)

FOREIGN PATENT DOCUMENTS

JP 2009260318 A 11/2009
JP 2011198891 A 10/2011
(Continued)

OTHER PUBLICATIONS

Office Action mailed Mar. 18, 2025 in corresponding Japanese patent application No. 2022-541477 (9 pages; with English machine translation).

(Continued)

*Primary Examiner* — Timor Karimy
(74) *Attorney, Agent, or Firm* — XSENSUS LLP

(57) ABSTRACT

A semiconductor device is provided with: a first switching element; a driver positioned so as to be displaced with respect to the first switching element in the z-direction, the driver driving the first switching element; a first resin layer for encapsulating the first switching element; and a first control via conductor extending through the first resin layer in the z-direction and electrically connecting the first switching element and the driver.

10 Claims, 30 Drawing Sheets

(51) Int. Cl.
  *H10W 74/40* (2026.01)
  *H10W 74/47* (2026.01)

(52) U.S. Cl.
  CPC .......... *H10W 72/884* (2026.01); *H10W 74/40* (2026.01); *H10W 90/734* (2026.01); *H10W 90/753* (2026.01)

(58) Field of Classification Search
  CPC ........... H01L 24/73; H01L 2224/32225; H01L 2224/4837; H01L 2224/73265; H01L 2924/13064; H01L 2924/186; H10W 90/00; H10W 90/701; H10W 90/753; H10W 90/734; H10W 74/47; H10W 74/40; H10W 72/884
  See application file for complete search history.

(56) References Cited

U.S. PATENT DOCUMENTS

| | | | |
|---|---|---|---|
| 2013/0193479 | A1 | 8/2013 | Hashimoto |
| 2014/0367685 | A1 | 12/2014 | Hashimoto |
| 2015/0366067 | A1* | 12/2015 | Herbert .............. H01L 23/4822 |
| | | | 361/761 |
| 2016/0352321 | A1 | 12/2016 | Yamaguchi |
| 2017/0287874 | A1* | 10/2017 | Fang ...................... H01L 24/11 |
| 2020/0105677 | A1 | 4/2020 | Chiba et al. |
| 2021/0028150 | A1* | 1/2021 | Yen .................... H01L 23/5386 |

FOREIGN PATENT DOCUMENTS

| | | |
|---|---|---|
| JP | 2020053593 A | 4/2020 |
| WO | 2015122483 A1 | 8/2015 |

OTHER PUBLICATIONS

International Search Report and Written Opinion issued for International Patent Application No. PCT/JP2021/027995, Date of mailing: Oct. 5, 2021, 9 pages including English translation of Search Report.

* cited by examiner

Fig.24

SEMICONDUCTOR DEVICE

TECHNICAL FIELD

The present disclosure relates to a semiconductor device. 5

BACKGROUND ART

It is known in the prior art that a semiconductor device is packaged by encapsulating a plurality of semiconductor elements with an encapsulation resin. Patent literature 1 describes an example of a semiconductor device in which a switching element and a driver that drives the switching element are encapsulated by an encapsulation resin. The switching element is a transistor and includes a control pad electrode (gate electrode). The driver includes a pad electrode that is electrically connected to the control pad electrode. The control pad electrode of the switching element and the pad electrode of the driver are connected by a bonding wire.

CITATION LIST

Patent Literature

Patent Literature 1: Japanese Laid-Open Patent Publication No. 2011-198891

SUMMARY OF INVENTION

Technical Problem

When the control pad electrode of the switching element and the pad electrode of the driver are connected by a bonding wire, the wire is curved and bent. Hence, it is difficult to shorten the wire. Accordingly, it is difficult to shorten a conductive path between the control pad electrode of the switching element and the pad electrode of the driver. There is room for improvement in reduction in inductance related to the length of the conductive path.

It is an objective of the present disclosure to provide a semiconductor device that reduces inductance.

Solution to Problem

To achieve the above objective, a semiconductor device includes a switching element and a resin layer encapsulating at least the switching element. A thickness-wise direction of the resin layer is defined as a height-wise direction of the semiconductor device. The semiconductor device further includes a driver that drives the switching element, the driver and the switching element being disposed at different positions in the height-wise direction of the semiconductor device, and a control via conductor extending through the resin layer in the height-wise direction of the semiconductor device and electrically connecting the switching element to the driver.

In this structure, the switching element and the driver are located at different positions in the height-wise direction of the semiconductor device, and the switching element and the driver are electrically connected by the control via conductor, which extends through the resin layer in the height-wise direction of the semiconductor device. This shortens a conductive path between the switching element and the driver as compared to a structure in which the switching element and the driver are disposed coplanar with each other and connected to each other by a wire. Accordingly, inductance caused by the length of the conductive path is reduced.

Advantageous Effects of Invention

The semiconductor device described above reduces inductance.

BRIEF DESCRIPTION OF DRAWINGS

FIG. 24 is a plan view of a resin layer on which a driver of the semiconductor device shown in FIG. 23 is mounted.

DESCRIPTION OF EMBODIMENTS

An embodiment of a semiconductor device will be described below with reference to the drawings. The embodiment described below exemplifies configurations and methods for embodying a technical concept and is not intended to limit the material, shape, structure, layout, dimensions, and the like of each component to those described below. The embodiment described below may undergo various modifications.

Structure of Semiconductor Device

An embodiment of a semiconductor device 10 will now be described with reference to FIGS. 1 to 9.

Figure 1:
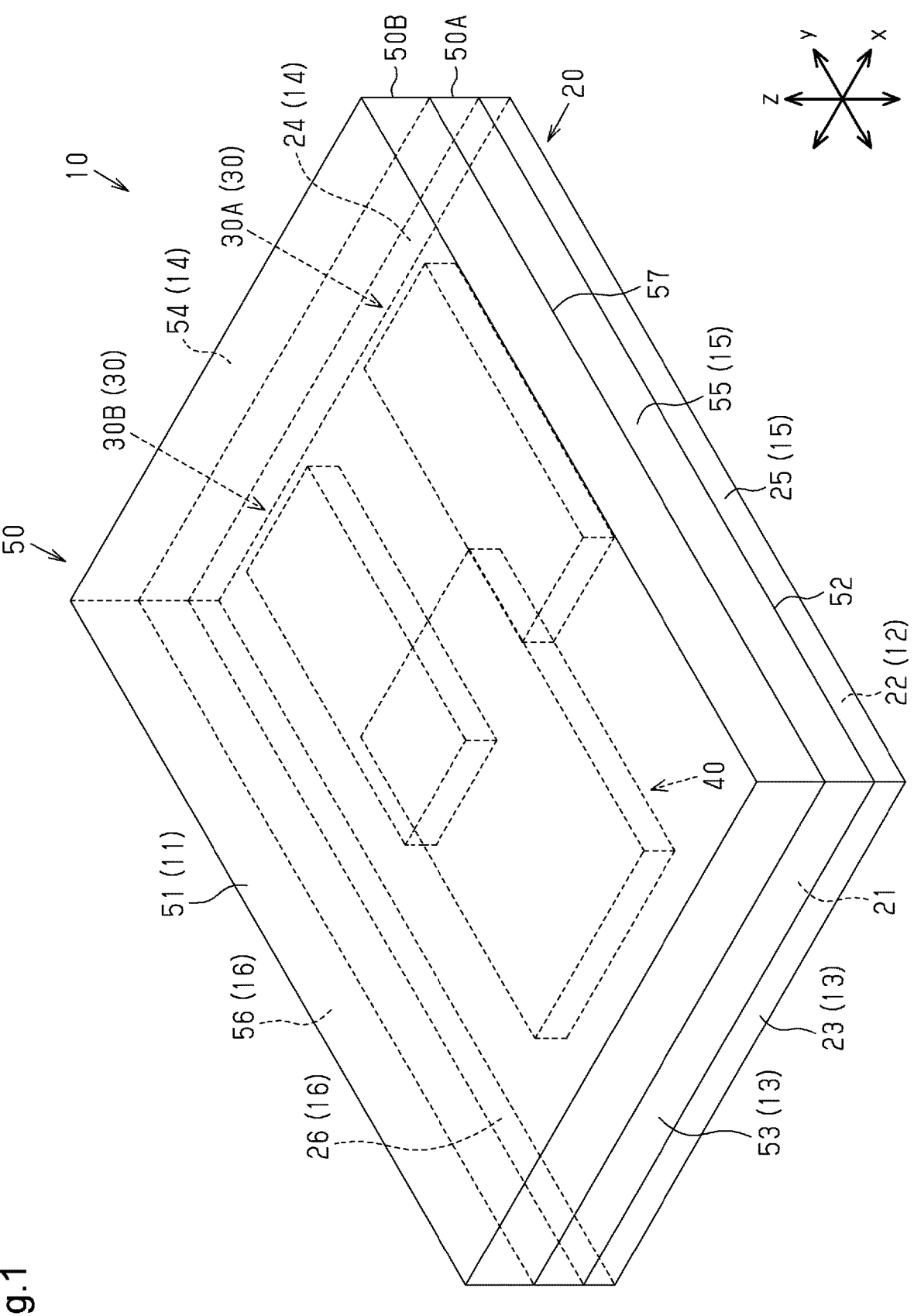
FIG. 1 is a perspective view of an embodiment of a semiconductor device showing a perspective structure.

As shown in FIG. 1, the semiconductor device 10 is rectangular and flat. The semiconductor device 10 includes a device main surface 11 and a device back surface 12, which face in opposite directions, and device side surfaces 13 to 16, which extend in directions that intersect with the device main surface 11 and the device back surface 12. In the present embodiment, the device side surfaces 13 to 16 extend in directions orthogonal to the device main surface 11 and the device back surface 12.

The device main surface 11 and the device back surface 12 are spaced apart from each other. In the description hereafter, the direction in which the device main surface 11 and the device back surface 12 are arranged is referred to as the z-direction. The z-direction may also be referred to as the height-wise direction of the semiconductor device 10. Two directions that are orthogonal to each other and orthogonal to the z-direction are referred to as the x-direction and the y-direction. In the present embodiment, as viewed in the z-direction, the device side surfaces 13 and 14 extend in the x-direction, and the device side surfaces 15 and 16 extend in the y-direction. The device side surfaces 13 and 14 face in opposite directions in the y-direction. The device side surfaces 15 and 16 face in opposite directions in the x-direction. In the present embodiment, as viewed in the z-direction, the semiconductor device 10 is rectangular such that the short sides extend in the x-direction and the long sides extend in the y-direction.

The semiconductor device 10 includes a substrate 20, a switching element 30 mounted on the substrate 20, a driver 40 that drives the switching element 30, and an encapsulation resin 50 formed on the substrate 20 to encapsulate the switching element 30 and the driver 40. The encapsulation resin 50 is an example of a resin layer. In the present embodiment, the switching element 30 includes a first switching element 30A and a second switching element 30B. That is, the semiconductor device 10 includes a plurality of switching elements 30. The driver 40 includes a drive circuit that drives each of the switching elements 30. More specifically, the driver 40 includes a drive circuit that drives the first switching element 30A and the second switching element 30B.

The substrate 20 is formed from an electrically-insulative material and is formed from, for example, an epoxy resin. The substrate 20 includes conductive portions 60 that electrically connect the switching element 30 to the driver 40. The substrate 20 may be referred to as a wiring layer that electrically connects the switching element 30 to the driver 40.

Figure 2:
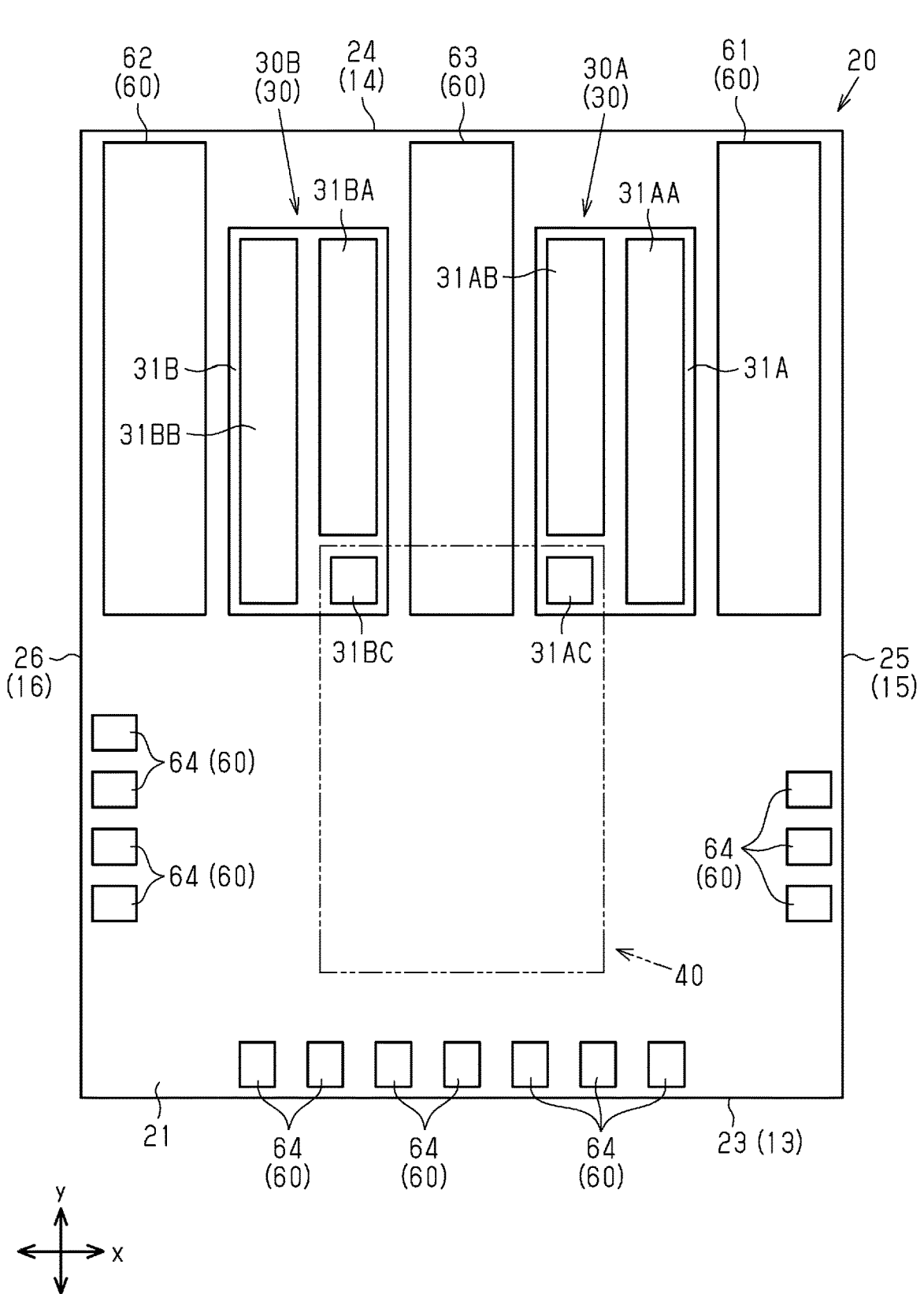
FIG. 2 is a plan view of a substrate on which switching elements of the semiconductor device shown in FIG. 1 are mounted.

As shown in FIG. 2, the substrate 20 is rectangular and flat and defines the device back surface 12 and a portion of each of the device side surfaces 13 to 16 in the z-direction. The substrate 20 includes a substrate main surface 21 and a substrate back surface 22 (refer to FIG. 5), which face in opposite directions in the z-direction, and substrate side surfaces 23 to 26, which extend in directions orthogonal to the substrate main surface 21 and the substrate back surface 22. The substrate main surface 21 and the device main surface 11 (refer to FIG. 1) face in the same direction. The substrate back surface 22 and the device back surface 12 (refer to FIG. 1) face in the same direction. That is, the substrate back surface 22 defines the device back surface 12. The substrate side surface 23 and the device side surface 13 face in the same direction. The substrate side surface 24 and the device side surface 14 face in the same direction. The substrate side surface 25 and the device side surface 15 face in the same direction. The substrate side surface 26 and the device side surface 16 face in the same direction. As viewed in the z-direction, the substrate 20 is rectangular such that the short sides extend in the x-direction and the long sides extend in the y-direction.

As shown in FIG. 1, the encapsulation resin 50 is rectangular and flat and defines the device main surface 11 and a portion of each of the device side surfaces 13 to 16 in the z-direction. The encapsulation resin 50 is formed on the substrate main surface 21 of the substrate 20. The encapsulation resin 50 is greater than the substrate 20 in dimension in the z-direction. In other words, the encapsulation resin 50 has a greater thickness than the substrate 20. The encapsulation resin 50 is formed from an electrically-insulative material and, in the present embodiment, formed from a black epoxy resin.

Figure 4:
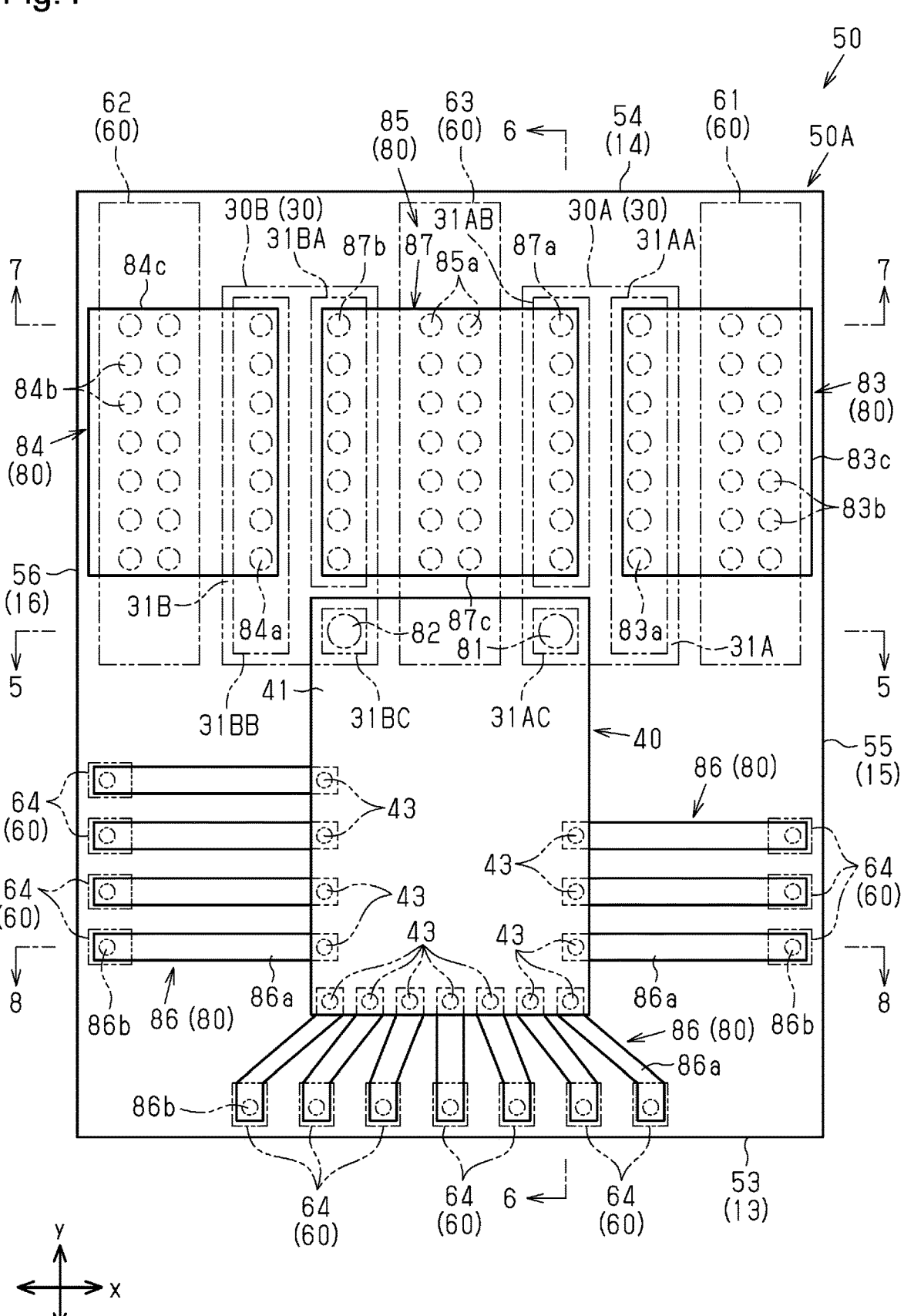
FIG. 4 is a plan view of a resin layer on which a driver of the semiconductor device shown in FIG. 1 is mounted.

As shown in FIGS. 1 and 4, the encapsulation resin 50 includes a resin main surface 51 (refer to FIG. 5) and a resin back surface 52, which face in opposite directions in the z-direction, and resin side surfaces 53 to 56, which extend in directions orthogonal to the resin main surface 51 and the resin back surface 52. The resin main surface 51 and the device main surface 11 (the substrate main surface 21) face in the same direction. The resin back surface 52 and the device back surface 12 (the substrate back surface 22) face in the same direction. That is, the resin main surface 51 defines the device main surface 11. The resin side surface 53 and the device side surface 13 (the substrate side surface 23) face in the same direction. The resin side surface 54 and the device side surface 14 (the substrate side surface 24) face in the same direction. The resin side surface 55 and the device side surface 15 (the substrate side surface 25) face in the same direction. The resin side surface 56 and the device side surface 16 (the substrate side surface 26) face in the same direction. As viewed in the z-direction, the encapsulation resin 50 is rectangular such that the long sides extend in the y-direction and the short sides extend in the x-direction. As shown in FIG. 1, in the present embodiment, the resin side surface 53 is flush with the substrate side surface 23. The resin side surface 54 is flush with the substrate side surface 24. The resin side surface 55 is flush with the substrate side surface 25. The resin side surface 56 is flush with the substrate side surface 26.

Figure 5:
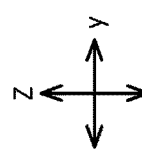
FIG. 5 is a cross-sectional view of the semiconductor device taken along line 5-5 in FIG. 4.

As shown in FIGS. 1 and 5, the encapsulation resin 50 includes a first resin layer 50A that is formed on the substrate main surface 21 and a second resin layer 50B that is formed on the first resin layer 50A. As shown in FIG. 5, the first resin layer 50A has a thickness-wise direction conforming to the z-direction. In other words, the thickness-wise direction of the first resin layer 50A refers to the height-wise direction of the semiconductor device 10. As shown in FIG. 5, the first resin layer 50A is smaller than the second resin layer 50B in dimension in the z-direction. In other words, the first resin layer 50A has a smaller thickness than the second resin layer 50B. The border between the first resin layer 50A and the second resin layer 50B defines an interface 57.

The internal structure of the semiconductor device 10 will now be described.

Figure 3:
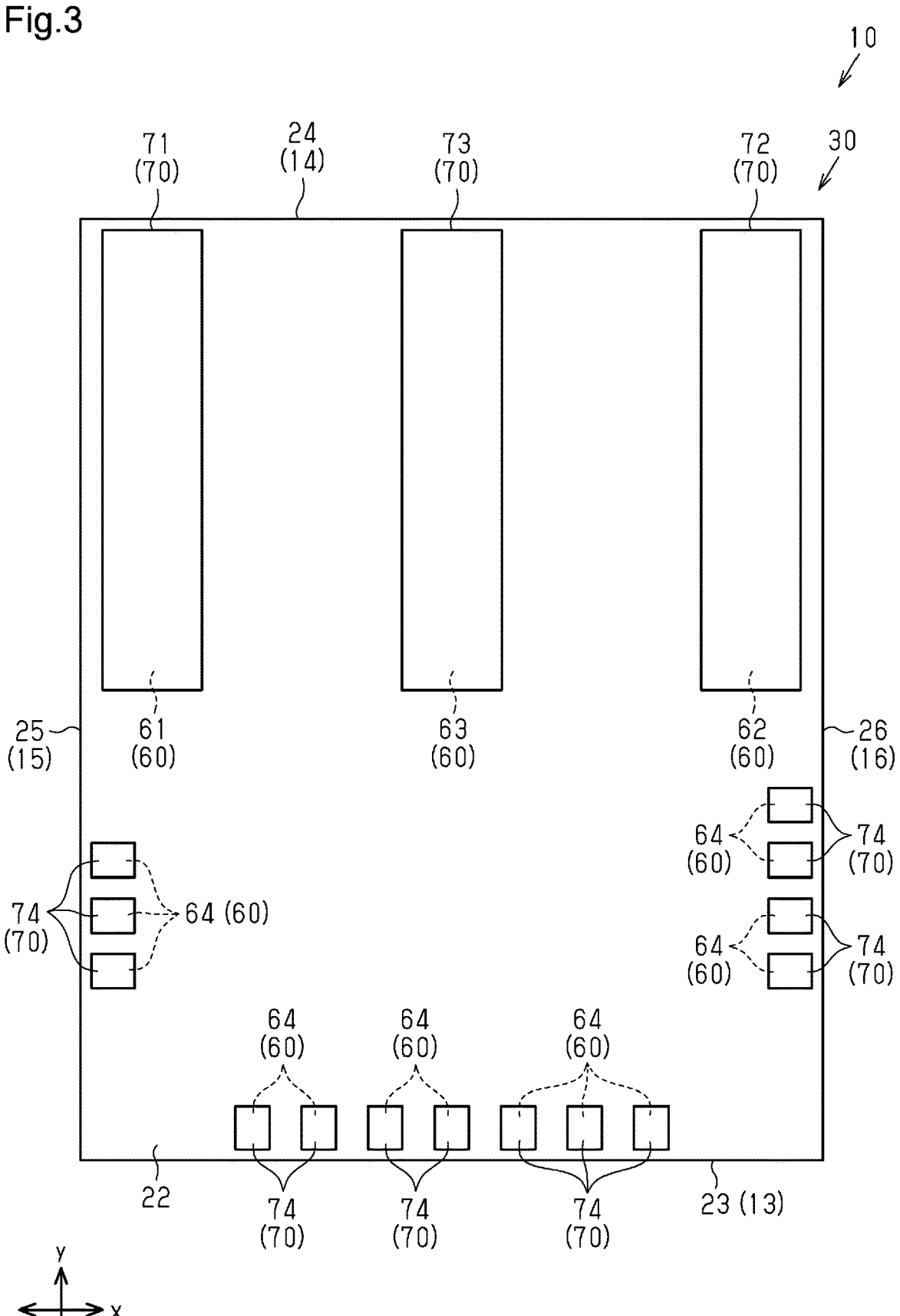
FIG. 3 is a bottom view of the semiconductor device shown in FIG. 1.

As shown in FIGS. 2 and 3, the conductive portions 60 extend through the substrate 20 in the z-direction. In other words, the conductive portions 60 are exposed from both the substrate main surface 21 and the substrate back surface 22. The conductive portions 60 are formed from a conductive material, which is, for example, a lamination of titanium (Ti) and copper (Cu). The conductive portions 60 include a power supply wire 61, a ground wire 62, an output wire 63, and multiple (in the present embodiment, fourteen) control wires 64.

The power supply wire 61, the ground wire 62, and the output wire 63 form a drive wire included in the conductive portions 60 of the semiconductor device 10. Drive current flows through the drive wire and is supplied to the switching element 30. As shown in FIG. 2, the power supply wire 61, the ground wire 62, and the output wire 63 are disposed closer to the substrate side surface 24 than the substrate side surface 23 in the y-direction. In the present embodiment, the power supply wire 61, the ground wire 62, and the output wire 63 are disposed toward the substrate side surface 24 with respect to the center of the substrate main surface 21 in the y-direction. The power supply wire 61, the ground wire 62, and the output wire 63 are aligned with each other in the y-direction and spaced apart from each other in the x-direction.

As viewed in the z-direction, the power supply wire 61, the ground wire 62, and the output wire 63 are strip-shaped and extend in the y-direction. In the present embodiment, the power supply wire 61, the ground wire 62, and the output wire 63 are equal to each other in dimension in the x-direction. In other words, the power supply wire 61, the ground wire 62, and the output wire 63 have the same width-wise dimension. Alternatively, the output wire 63 may be greater than the power supply wire 61 and the ground wire 62 in dimension in the x-direction. In other words, the output wire 63 may be greater than the power supply wire 61 and the ground wire 62 in the width-wise dimension. The power supply wire 61, the ground wire 62, and the output wire 63 are equal to each other in dimension in the y-direction.

The output wire 63 is located between the power supply wire 61 and the ground wire 62 in the x-direction. The power supply wire 61 is located closer to the substrate side surface 25 than the output wire 63. The ground wire 62 is located closer to the substrate side surface 26 than the output wire 63.

The control wires 64 are disposed closer to the substrate side surface 23 than the substrate side surface 24 in the y-direction. In the present embodiment, the control wires 64 are disposed toward the substrate side surface 23 with respect to the center of the substrate main surface 21 in the y-direction. The control wires 64 are disposed closer to the substrate side surface 23 than the power supply wire 61, the ground wire 62, and the output wire 63 in the y-direction. Two or more of the control wires 64 are disposed on each of the opposite ends of the substrate main surface 21 in the x-direction. Two or more of the control wires 64 are disposed on one of the opposite ends of the substrate main surface 21 in the y-direction that is located closer to the substrate side surface 23. In the present embodiment, on one of the opposite ends of the substrate main surface 21 in the x-direction that is located closer to the substrate side surface 25, three control wires 64 are aligned with each other in the x-direction and spaced apart from each other in the y-direction. On one of the opposite ends of the substrate main surface 21 in the x-direction that is located closer to the substrate side surface 26, four control wires 64 are aligned with each other in the x-direction and spaced apart from each other in the y-direction. On one of the opposite ends of the substrate main surface 21 in the y-direction that is located closer to the substrate side surface 23, seven control wires 64 are aligned with each other in the y-direction and spaced apart from each other in the x-direction.

As shown in FIG. 3, external terminals 70 are disposed on the substrate back surface 22 so as to electrically connect the semiconductor device 10 to an external electronic device. The external terminals 70 are formed of, for example, a lamination of a nickel (Ni) layer, a palladium (Pd) layer, and a gold (Au) layer.

The external terminals 70 include a power supply terminal 71, a ground terminal 72, an output terminal 73, and multiple (in the present embodiment, fourteen) control terminals 74. As shown in FIGS. 5 to 8, the power supply terminal 71 is formed on a surface of the power supply wire 61 that is exposed from the substrate back surface 22. The ground terminal 72 is formed on a surface of the ground wire 62 that is exposed from the substrate back surface 22. The output terminal 73 is formed on a surface of the output wire 63 that is exposed from the substrate back surface 22. The control terminals 74 are separately formed on surfaces of the control wires 64 that are exposed from the substrate back surface 22. Thus, the power supply terminal 71 is electrically connected to the power supply wire 61. The ground terminal 72 is electrically connected to the ground wire 62. The output terminal 73 is electrically connected to the output wire 63. The control terminals 74 are separately electrically connected to the control wires 64.

As shown in FIG. 2, the first switching element 30A and the second switching element 30B are mounted on the substrate main surface 21. In the present embodiment, each of the switching elements 30A and 30B are bonded to the substrate main surface 21 by a bonding material. An example of the bonding material is an epoxy resin adhesive or a silicone resin adhesive. The switching elements 30A and 30B are each, for example, a transistor. In the present embodiment, the switching elements 30A and 30B each include a gallium nitride high electron mobility transistor (GaN HEMT). In the present embodiment, GaN HEMTs that have the same size are used in the switching elements 30A and 30B. As viewed in the z-direction, the switching elements 30A and 30B are rectangular and have a long-side direction and a short-side direction. In the present embodiment, the switching elements 30A and 30B are disposed on the substrate main surface 21 so that the long-side direction conforms to the y-direction and the short-side direction conforms to the x-direction. As shown in FIG. 2, in the present embodiment, the switching elements 30A and 30B are smaller than the power supply wire 61, the ground wire 62, and the output wire 63 in dimension in the y-direction.

As shown in FIG. 2, the first switching element 30A is disposed between the power supply wire 61 and the output wire 63 in the x-direction. The center of the first switching element 30A in the y-direction is located closer to the substrate side surface 23 in the y-direction than the center of the power supply wire 61 and the center of the output wire 63 in the y-direction. In the present embodiment, the first switching element 30A includes a first element main surface 31A and a first control pad electrode 31AC and is disposed on the substrate main surface 21 so that the first control pad electrode 31AC is disposed on one of the four corners of the first element main surface 31A that is located close to the substrate side surface 23 and the substrate side surface 26.

The second switching element 30B is disposed between the output wire 63 and the ground wire 62 in the x-direction. The center of the second switching element 30B in the y-direction is located closer to the substrate side surface 23 than the center of the output wire 63 and the center of the ground wire 62 in the y-direction. In the present embodiment, the second switching element 30B includes a second element main surface 31B and a second control pad electrode 31BC and is disposed on the substrate main surface 21 so that the second control pad electrode 31BC is disposed on one of the four corners of the second element main surface 31B that is located close to the substrate side surface 23 and the substrate side surface 25.

The first switching element 30A includes the first element main surface 31A and a first element back surface 32A that face in opposite directions in the z-direction. The first element main surface 31A and the device main surface 11 (the substrate main surface 21) face in the same direction. The first element back surface 32A and the device back surface 12 (the substrate back surface 22) face in the same direction. The first control pad electrode 31AC, a first drive pad electrode 31AA, and a second drive pad electrode 31AB are formed on the first element main surface 31A. In the present embodiment, the first drive pad electrode 31AA includes a drain electrode of the first switching element 30A, the second drive pad electrode 31AB includes a source electrode of the first switching element 30A, and the first control pad electrode 31AC includes a gate electrode of the first switching element 30A.

As viewed in the z-direction, the first control pad electrode 31AC is disposed on one of the four corners of the first element main surface 31A. The first drive pad electrode 31AA and the second drive pad electrode 31AB are disposed in the short-side direction of the first switching element 30A. The first drive pad electrode 31AA is located closer to the power supply wire 61 than the second drive pad electrode 31AB in the short-side direction of the first switching element 30A. In other words, the second drive pad electrode 31AB is located closer to the output wire 63 than the first drive pad electrode 31AA. The first control pad electrode 31AC is surrounded by the first drive pad electrode 31AA and the second drive pad electrode 31AB from one side in the long-side direction of the first switching element 30A and one side in the short-side direction of the first switching element 30A, respectively.

The second switching element 30B includes the second element main surface 31B and a second element back surface 32B that face in opposite directions in the z-direction. The second element main surface 31B and the device main surface 11 (the substrate main surface 21) face in the same direction. The second element back surface 32B and the device back surface 12 (the substrate back surface 22) face in the same direction. The second control pad electrode 31BC, a first drive pad electrode 31BA, and a second drive pad electrode 31BB are formed on the second element main surface 31B. In the present embodiment, the first drive pad electrode 31BA includes a drain electrode of the second switching element 30B, the second drive pad electrode 31BB includes a source electrode of the second switching element 30B, and the second control pad electrode 31BC includes a gate electrode of the second switching element 30B.

As viewed in the z-direction, the second control pad electrode 31BC is disposed on one of the four corners of the second element main surface 31B. The first drive pad electrode 31BA and the second drive pad electrode 31BB are disposed in the short-side direction of the second switching element 30B. The first drive pad electrode 31BA is located closer to the output wire 63 than the second drive pad electrode 31BB in the short-side direction of the second switching element 30B. In other words, the second drive pad electrode 31BB is located closer to the ground wire 62 than the first drive pad electrode 31BA. The second control pad electrode 31BC is surrounded by the first drive pad electrode 31BA and the second drive pad electrode 31BB from one side in the long-side direction of the second switching element 30B and one side in the short-side direction of the second switching element 30B, respectively.

As described above, each of the switching elements 30A and 30B is a lateral transistor in which the drain electrode, the source electrode, and the gate electrode are formed on the same surface facing in the z-direction.

The switching elements 30A and 30B are not limited to a gallium nitride high electron mobility transistor and may include a metal-oxide-semiconductor field-effect transistor (MOSFET) that includes silicon (Si) or a MOSFET that includes silicon carbide (SiC).

As shown in FIG. 5, the switching elements 30A and 30B are encapsulated by the first resin layer 50A. The first resin layer 50A is formed on the entirety of the substrate main surface 21. That is, the conductive portions 60 are covered by the first resin layer 50A.

As shown in FIGS. 2 and 4, as viewed in the z-direction, the driver 40 overlaps a portion of each of the switching elements 30A and 30B. More specifically, as viewed in the z-direction, the driver 40 is disposed to overlap the first control pad electrode 31AC of the first switching element 30A and the second control pad electrode 31BC of the second switching element 30B. As shown in FIGS. 1 and 2, the driver 40 is rectangular and flat so that the dimension in the z-direction is smaller than the dimensions in the x-direction and the y-direction. As shown in FIG. 2, in the present embodiment, as viewed in the z-direction, the driver 40 is rectangular such that the long sides extend in the y-direction and the short sides extend in the x-direction. The shape of the driver 40 as viewed in the z-direction may be changed in any manner. In an example, as viewed in the z-direction, the driver 40 is rectangular such that the short sides extend in the x-direction and the long sides extend in the y-direction. The shape of the driver 40 as viewed in the z-direction may be changed in any manner. In an example, as viewed in the z-direction, the driver 40 is square.

As shown in FIG. 5, the driver 40 includes a driver main surface 41 and a driver back surface 42 that face in opposite directions in the z-direction. The driver main surface 41 and the device main surface 11 face in the same direction. The driver back surface 42 and the device back surface 12 face in the same direction. The driver 40 further includes driver pad electrodes 43. The driver pad electrodes 43 are exposed from the driver back surface 42.

Figure 6:
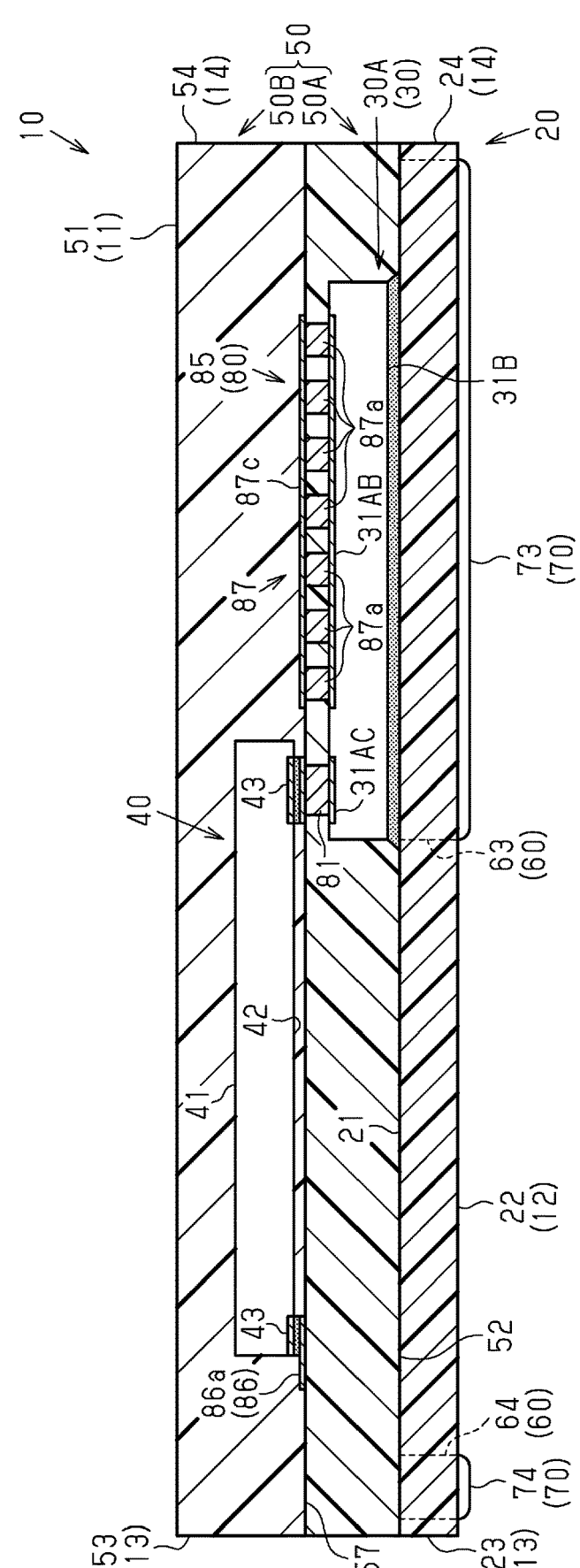
FIG. 6 is a cross-sectional view of the semiconductor device taken along line 6-6 in FIG. 4.

As shown in FIGS. 2 and 4, the driver 40 is disposed in the center of the semiconductor device 10 in the x-direction. The driver 40 is disposed toward the device side surface 13 (the substrate side surface 23 and the resin side surface 53) with respect to the switching elements 30A and 30B in the y-direction. As shown in FIGS. 5 and 6, the driver 40 and each of the switching elements 30A and 30B are disposed at different positions in the z-direction. Thus, as shown in FIG. 6, the driver 40 and each of the switching elements 30A and 30B are disposed at different positions in the y-direction and the z-direction.

As shown in FIG. 5, the driver 40 is disposed closer to the device main surface 11 than the switching elements 30A and 30B in the z-direction. In the present embodiment, the driver 40 is disposed closer to the device main surface 11 than the first element main surface 31A of the first switching element 30A and the second element main surface 31B of the second switching element 30B in the z-direction. More specifically, the driver 40 is disposed closer to the device main surface 11 than the element main surfaces 31A and 31B of the switching elements 30A and 30B in the z-direction and is spaced apart from the element main surfaces 31A and 31B in the z-direction. More specifically, the driver 40 is disposed on the first resin layer 50A and is encapsulated by the second resin layer 50B. The driver 40 is bonded to a wiring portion 80 by, for example, a conductive bonding material of solder or Ag paste.

As shown in FIG. 5, in the present embodiment, the portion of the first resin layer 50A that covers the switching elements 30A and 30B has a smaller thickness than the portion of the second resin layer 50B that covers the driver 40. This decreases the distance from the driver back surface 42 of the driver 40 to the element main surfaces 31A and 31B of the switching elements 30A and 30B in the z-direction. The thickness of the portion of the first resin layer 50A that covers the switching elements 30A and 30B is specified by the distance in the z-direction from the element main surfaces 31A and 31B of the switching elements 30A and 30B to the interface 57 between the first resin layer 50A and the second resin layer 50B. The thickness of the portion of the second resin layer 50B that covers the driver 40 is specified by a distance D in the z-direction from the driver main surface 41 of the driver 40 to a surface of the second resin layer 50B located at a side opposite from the first resin layer 50A.

In the present embodiment, the driver 40 includes an integrated circuit including a drive circuit that drives the switching elements 30A and 30B. The driver 40 activates and deactivates the switching elements 30A and 30B in a complementary manner based on a signal received from the outside of the semiconductor device 10.

As shown in FIG. 4, the semiconductor device 10 includes the wiring portion 80 that electrically connects the switching elements 30A and 30B, the driver 40, and the conductive portions 60. The wiring portion 80 is disposed on the encapsulation resin 50. More specifically, the switching elements 30A and 30B, the driver 40, and the conductive portions 60 are electrically connected in the semiconductor device 10. The wiring portion 80 is formed of, for example, a lamination of Ti and Cu.

The wiring portion 80 includes a first control via conductor 81, a second control via conductor 82, a power supply connection conductor 83, a ground connection conductor 84, an output connection conductor 85, and control connection conductors 86.

As shown in FIG. 5, the first control via conductor 81 electrically connects the first control pad electrode 31AC of the first switching element 30A to one of the driver pad electrodes 43 of the driver 40. The first control via conductor 81 extends through the first resin layer 50A in the z-direction. In other words, the first control via conductor 81 extends in the z-direction through a portion of the first resin layer 50A that covers the first element main surface 31A of the first switching element 30A. More specifically, the first control via conductor 81 is disposed to join the first control pad electrode 31AC of the first switching element 30A to the interface 57 between the first resin layer 50A and the second resin layer 50B. Thus, the first control via conductor 81 extends in the z-direction through the portion of the first resin layer 50A located between the first element main surface 31A of the first switching element 30A and the interface 57.

Specifically, a through hole 58a extends in the z-direction through the portion of the first resin layer 50A located between the first element main surface 31A of the first switching element 30A and the interface 57, that is, a portion of the first resin layer 50A that covers the first element main surface 31A of the first switching element 30A. As viewed in the z-direction from the interface 57, the through hole 58a exposes the first control pad electrode 31AC of the first switching element 30A. In the present embodiment, the first control via conductor 81 is embedded in the through hole 58a. More specifically, the first control via conductor 81 fills the entirety of the through hole 58a. In the present embodiment, the first control via conductor 81 extends in the z-direction. The first control via conductor 81 has a dimension in the z-direction that is less than 1 mm. In the present embodiment, the dimension of the first control via conductor 81 in the z-direction is approximately a few hundred μm. As shown in FIGS. 2 and 4, in the present embodiment, the first control via conductor 81 is circular as viewed in the z-direction. In the present embodiment, the first control via conductor 81 has a diameter that is greater than or equal to 100 μm and less than or equal to 200 μm. The diameter of the first control via conductor 81 may be changed in any manner.

The first control via conductor 81 is opposed to the driver pad electrode 43 of the driver 40 in the z-direction. In other words, as viewed in the z-direction, the first control via conductor 81 overlaps the driver pad electrode 43. As described above, the driver 40 is disposed so that the driver pad electrode 43 is opposed to the first control via conductor 81 in the z-direction. In other words, the driver 40 is disposed so that the driver pad electrode 43 overlaps the first control via conductor 81 as viewed in the z-direction. The driver pad electrode 43 opposed to the first control via conductor 81 corresponds to a first driver pad electrode.

A connection conductor 88a is disposed on the first control via conductor 81. The connection conductor 88a is formed of, for example, a lamination of Ti and Cu. The connection conductor 88a is in contact with the first control via conductor 81. The connection conductor 88a covers the entire surface of the first control via conductor 81 in the z-direction. The driver pad electrode 43 of the driver 40 is mounted on the connection conductor 88*a* via a conductive bonding material such as solder. Thus, the first control via conductor 81 and the driver pad electrode 43 are electrically connected by the connection conductor 88*a* and the conductive bonding material.

As shown in FIG. 5, in the present embodiment, the dimension of the first control via conductor 81 in the z-direction is equal to the thickness of the portion of the first resin layer 50A covering the first element main surface 31A of the first switching element 30A. Therefore, the dimension of the first control via conductor 81 in the z-direction is smaller than the distance D between the driver main surface 41 of the driver 40 and the second resin layer 50B in the z-direction.

The second control via conductor 82 electrically connects the second control pad electrode 31BC of the second switching element 30B to one of the driver pad electrodes 43 of the driver 40. The second control via conductor 82 extends through the first resin layer 50A in the z-direction. In other words, the second control via conductor 82 extends in the z-direction through the portion of the first resin layer 50A that covers the second element main surface 31B of the second switching element 30B. More specifically, the second control via conductor 82 is disposed to join the second control pad electrode 31BC of the second switching element 30B to the interface 57 between the first resin layer 50A and the second resin layer 50B. Thus, the second control via conductor 82 extends in the z-direction through the portion of the first resin layer 50A located between the second element main surface 31B of the second switching element 30B and the interface 57.

Specifically, a through hole 58*b* extends in the z-direction through the portion of the first resin layer 50A located between the second element main surface 31B of the second switching element 30B and the interface 57, that is, the portion of the first resin layer 50A covering the second element main surface 31B of the second switching element 30B. As viewed in the z-direction from the interface 57, the through hole 58*b* exposes the second control pad electrode 31BC of the second switching element 30B. In the present embodiment, the second control via conductor 82 is embedded in the through hole 58*b*. More specifically, the second control via conductor 82 fills the entirety of the through hole 58*b*. In the present embodiment, the second control via conductor 82 extends in the z-direction. The second control via conductor 82 has a dimension in the z-direction that is less than 1 mm. In the present embodiment, the dimension of the second control via conductor 82 in the z-direction is approximately a few hundred μm. As shown in FIGS. 2 and 4, in the present embodiment, the second control via conductor 82 is circular as viewed in the z-direction. In the present embodiment, the second control via conductor 82 has a diameter that is greater than or equal to 100 μm and less than or equal to 200 μm. The diameter of the second control via conductor 82 is equal to the diameter of the first control via conductor 81. The diameter of the second control via conductor 82 may be changed in any manner.

The second control via conductor 82 is opposed to the driver pad electrode 43 of the driver 40 in the z-direction. In other words, as viewed in the z-direction, the second control via conductor 82 overlaps the driver pad electrode 43. As described above, the driver 40 is disposed so that the driver pad electrode 43 is opposed to the second control via conductor 82 in the z-direction. In other words, the driver 40 is disposed so that the driver pad electrode 43 overlaps the second control via conductor 82 as viewed in the z-direction.

The driver pad electrode 43 opposed to the second control via conductor 82 corresponds to a second driver pad electrode.

A connection conductor 88*b* is disposed on the second control via conductor 82. The connection conductor 88*b* is formed of, for example, a copper foil. The connection conductor 88*b* is in contact with the second control via conductor 82. The connection conductor 88*b* covers the entirety of the second control via conductor 82 in the z-direction. The driver pad electrode 43 of the driver 40 is mounted on the connection conductor 88*b* via a conductive bonding material. Thus, the second control via conductor 82 and the driver pad electrode 43 are electrically connected by the connection conductor 88*b* and the conductive bonding material.

As shown in FIG. 5, in the present embodiment, the dimension of the second control via conductor 82 in the z-direction is equal to the thickness of the portion of the first resin layer 50A covering the second element main surface 31B of the second switching element 30B. Therefore, the dimension of the second control via conductor 82 in the z-direction is smaller than the distance D between the driver main surface 41 of the driver 40 and the second resin layer 50B in the z-direction. The second control via conductor 82 is equal to the first control via conductor 81 in dimension in the z-direction.

Figure 7:
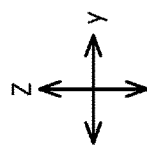
FIG. 7 is a cross-sectional view of the semiconductor device taken along line 7-7 in FIG. 4.

As shown in FIGS. 4 and 7, the power supply connection conductor 83 electrically connects the first drive pad electrode 31AA of the first switching element 30A to the power supply wire 61.

The power supply connection conductor 83 includes first power supply via conductors 83*a* connected to the first drive pad electrode 31AA of the first switching element 30A, second power supply via conductors 83*b* connected to the power supply wire 61, and a power supply connection wire 83*c* connecting the first power supply via conductors 83*a* to the second power supply via conductors 83*b*.

As shown in FIG. 4, as viewed in the z-direction, the first power supply via conductors 83*a* overlap the first drive pad electrode 31AA of the first switching element 30A. As viewed in the z-direction, the first power supply via conductors 83*a* are aligned with each other in the x-direction and spaced apart from each other in the y-direction. In the present embodiment, each first power supply via conductor 83*a* is circular as viewed in the z-direction. The first power supply via conductor 83*a* has a diameter that is, for example, greater than or equal to 100 μm and less than or equal to 200 μm.

As shown in FIG. 7, each first power supply via conductor 83*a* extends through the first resin layer 50A in the z-direction. In other words, the first power supply via conductor 83*a* extends through a portion of the first resin layer 50A that covers the first element main surface 31A of the first switching element 30A. More specifically, the first power supply via conductor 83*a* is disposed to join the first drive pad electrode 31AA of the first switching element 30A to the interface 57 between the first resin layer 50A and the second resin layer 50B. Thus, the first power supply via conductor 83*a* extends in the z-direction through the portion of the first resin layer 50A located between the first element main surface 31A of the first switching element 30A and the interface 57.

Specifically, through holes 58*c* extend in the z-direction through the portion of the first resin layer 50A located between the first element main surface 31A of the first switching element 30A and the interface 57, that is, the portion of the first resin layer 50A covering the first element main surface 31A of the first switching element 30A. As viewed in the z-direction from the interface 57, the through holes 58c expose the first drive pad electrode 31AA of the first switching element 30A. In the present embodiment, the first power supply via conductors 83a are separately embedded in the through holes 58c. More specifically, each first power supply via conductor 83a fills the entirety of the through hole 58c. In the present embodiment, the first power supply via conductors 83a extend in the z-direction. The first power supply via conductors 83a are equal to the first control via conductor 81 in dimension in the z-direction. Each of the first power supply via conductors 83a is in contact with the first drive pad electrode 31AA of the first switching element 30A.

As shown in FIG. 4, as viewed in the z-direction, the second power supply via conductors 83b are disposed to overlap the power supply wire 61. As viewed in the z-direction, the second power supply via conductors 83b are spaced apart from each other in the x-direction and the y-direction. In the present embodiment, the second power supply via conductors 83b are each circular as viewed in the z-direction. The second power supply via conductors 83b and the first power supply via conductors 83a have the same diameter.

As shown in FIG. 7, each second power supply via conductor 83b extends through the first resin layer 50A in the z-direction. More specifically, the second power supply via conductor 83b is disposed to join the resin back surface 52 of the encapsulation resin 50 to the interface 57 between the first resin layer 50A and the second resin layer 50B. Thus, the second power supply via conductor 83b is equal to the first resin layer 50A in dimension in the z-direction. The second power supply via conductor 83b is greater than the first power supply via conductor 83a in dimension in the z-direction.

As viewed in the z-direction, through holes 58d are disposed in portions of the first resin layer 50A that overlap the power supply wire 61. The through holes 58d extend through the first resin layer 50A. Thus, as viewed in the z-direction from the interface 57, the power supply wire 61 is exposed in the through holes 58d. In the present embodiment, the second power supply via conductors 83b are separately embedded in the through holes 58d. More specifically, each second power supply via conductor 83b fills the entirety of the through hole 58d. In the present embodiment, the second power supply via conductor 83b extends in the z-direction. The second power supply via conductor 83b is in contact with the power supply wire 61.

The power supply connection wire 83c is disposed on the first resin layer 50A. As shown in FIG. 4, as viewed in the z-direction, the power supply connection wire 83c extends in the x-direction. The power supply connection wire 83c is in contact with the first power supply via conductors 83a and the second power supply via conductors 83b. Thus, the power supply connection wire 83c entirely covers the first power supply via conductors 83a in the z-direction and also entirely covers the second power supply via conductors 83b in the z-direction. Therefore, the dimension of the power supply connection wire 83c in the y-direction is greater than the total length of the diameter of the first power supply via conductors 83a and the total length of the diameter of the second power supply via conductors 83b.

As shown in FIGS. 4 and 6, the ground connection conductor 84 electrically connects the second drive pad electrode 31BB of the second switching element 30B to the ground wire 62.

The ground connection conductor 84 includes first ground via conductors 84a connected to the second drive pad electrode 31BB of the second switching element 30B, second ground via conductors 84b connected to the ground wire 62, and a ground connection wire 84c that connects the first ground via conductors 84a to the second ground via conductors 84b.

As shown in FIG. 4, as viewed in the z-direction, the first ground via conductors 84a are disposed to overlap the second drive pad electrode 31BB of the second switching element 30B. As viewed in the z-direction, the first ground via conductors 84a are aligned with each other in the x-direction and spaced apart from each other in the y-direction. In the present embodiment, the first ground via conductors 84a are each circular as viewed in the z-direction. The first ground via conductor 84a has a diameter that is, for example, greater than or equal to 100 μm and less than or equal to 200 μm.

As shown in FIG. 7, each first ground via conductor 84a extends through the first resin layer 50A in the z-direction. In other words, the first ground via conductor 84a extends through a portion of the first resin layer 50A that covers the second element main surface 31B of the second switching element 30B. More specifically, the first ground via conductor 84a is disposed to join the second drive pad electrode 31BB of the second switching element 30B to the interface 57 between the first resin layer 50A and the second resin layer 50B. Thus, the first ground via conductors 84a extend in the z-direction through the portion of the first resin layer 50A located between the second element main surface 31B of the second switching element 30B and the interface 57.

Specifically, through holes 58e extend in the z-direction through the portion of the first resin layer 50A located between the second element main surface 31B of the second switching element 30B and the interface 57, that is, the portion of the first resin layer 50A covering the second element main surface 31B of the second switching element 30B. As viewed in the z-direction from the interface 57, the through holes 58e expose the second drive pad electrode 31BB of the second switching element 30B. In the present embodiment, the first ground via conductors 84a are separately embedded in the through holes 58e. More specifically, each first ground via conductor 84a fills the entirety of the through hole 58e. In the present embodiment, the first ground via conductors 84a extend in the z-direction. Each of the first ground via conductors 84a is equal to the second control via conductor 82 in dimension in the z-direction. The first ground via conductors 84a are in contact with the second drive pad electrode 31BB of the second switching element 30B.

As shown in FIG. 4, as viewed in the z-direction, the second ground via conductors 84b are disposed to overlap the ground wire 62. As viewed in the z-direction, the second ground via conductors 84b are spaced apart from each other in the x-direction and the y-direction. In the present embodiment, the second ground via conductors 84b are each circular as viewed in the z-direction. The second ground via conductors 84b and the first ground via conductors 84a have the same diameter.

As shown in FIG. 7, each second ground via conductor 84b extends through the first resin layer 50A in the z-direction. More specifically, the second ground via conductor 84b is disposed to join the resin back surface 52 of the encapsulation resin 50 to the interface 57 between the first resin layer 50A and the second resin layer 50B. Thus, the second ground via conductor 84b is equal to the first resin layer 50A in dimension in the z-direction. The second ground via conductor 84b is greater than the first ground via conductor 84a in dimension in the z-direction. The second ground via conductor 84b is equal to the second power supply via conductor 83b in dimension in the z-direction.

As viewed in the z-direction, through holes 58f are disposed in portions of the first resin layer 50A that overlap the ground wire 62. The through holes 58f extend through the first resin layer 50A. Thus, as viewed in the z-direction from the interface 57, the ground wire 62 is exposed in the through holes 58f. In the present embodiment, the second ground via conductors 84b are separately embedded in the through holes 58f. More specifically, each second ground via conductor 84b fills the entirety of the through hole 58f. In the present embodiment, the second ground via conductors 84b extend in the z-direction. The second ground via conductors 84b are in contact with the ground wire 62.

The ground connection wire 84c is disposed on the first resin layer 50A. As shown in FIG. 4, as viewed in the z-direction, the ground connection wire 84c extends in the x-direction. The ground connection wire 84c is in contact with the first ground via conductors 84a and the second ground via conductors 84b. Thus, the ground connection wire 84c entirely covers the first ground via conductors 84a in the z-direction and also entirely covers the second ground via conductors 84b in the z-direction. Therefore, the dimension of the ground connection wire 84c in the y-direction is greater than the total length of the diameter of the first ground via conductors 84a and the total length of the diameter of the second ground via conductors 84b. In the present embodiment, the ground connection wire 84c is equal to the power supply connection wire 83c in dimension in the y-direction.

As shown in FIGS. 4, 6, and 7, the output connection conductor 85 electrically connects the output wire 63 to the second drive pad electrode 31AB of the first switching element 30A and the first drive pad electrode 31BA of the second switching element 30B.

The output connection conductor 85 includes an element connection conductor 87 and output via conductors 85a. The element connection conductor 87 connects the second drive pad electrode 31AB of the first switching element 30A to the first drive pad electrode 31BA of the second switching element 30B. The output via conductors 85a connect the element connection conductor 87 to the output wire 63.

As viewed in the z-direction, the element connection conductor 87 extends over the output wire 63 in the x-direction. The element connection conductor 87 includes first drive via conductors 87a that are connected to the second drive pad electrode 31AB of the first switching element 30A, second drive via conductors 87b that are connected to the first drive pad electrode 31BA of the second switching element 30B, and a drive connection wire 87c that connects the first drive via conductors 87a to the second drive via conductors 87b.

As shown in FIG. 4, as viewed in the z-direction, the first drive via conductors 87a are disposed to overlap the second drive pad electrode 31AB of the first switching element 30A. As viewed in the z-direction, the first drive via conductors 87a are aligned with each other in the x-direction and spaced apart from each other in the y-direction. In the present embodiment, the first drive via conductors 87a are each circular as viewed in the z-direction. The first drive via conductor 87a has a diameter that is, for example, greater than or equal to 100 μm and less than or equal to 200 μm.

As shown in FIG. 6, the first drive via conductors 87a extend through the first resin layer 50A in the z-direction. In other words, the first drive via conductors 87a extend in the z-direction through portions of the first resin layer 50A that cover the first element main surface 31A of the first switching element 30A. More specifically, the first drive via conductors 87a are disposed to join the second drive pad electrode 31AB of the first switching element 30A to the interface 57 between the first resin layer 50A and the second resin layer 50B. Thus, the first drive via conductors 87a extend in the z-direction through portions of the first resin layer 50A located between the first element main surface 31A of the first switching element 30A and the interface 57.

Specifically, as viewed in the z-direction, through holes 58g extend in the z-direction through portions of the first resin layer 50A that overlap the second drive pad electrode 31AB of the first switching element 30A, that is, portions of the first resin layer 50A that cover the first element main surface 31A of the first switching element 30A. The through holes 58g extend in the z-direction through portions of the first resin layer 50A located between the first element main surface 31A of the first switching element 30A and the interface 57. As viewed in the z-direction from the interface 57, the second drive pad electrode 31AB of the first switching element 30A is exposed in the through holes 58g. In the present embodiment, the first drive via conductors 87a are separately embedded in the through holes 58g. More specifically, each first drive via conductor 87a fills the entirety of the through hole 58g. In the present embodiment, the first drive via conductor 87a extends in the z-direction. The first drive via conductor 87a is equal to the first control via conductor 81 in dimension in the z-direction. The first drive via conductor 87a is in contact with the second drive pad electrode 31AB of the first switching element 30A.

As shown in FIG. 4, as viewed in the z-direction, the second drive via conductors 87b are disposed to overlap the first drive pad electrode 31BA of the second switching element 30B. As viewed in the z-direction, the second drive via conductors 87b are aligned with each other in the x-direction and are spaced apart from each other in the y-direction. In the present embodiment, the second drive via conductors 87b are each circular as viewed in the z-direction. The second drive via conductors 87b and the first drive via conductors 87a have the same diameter.

As shown in FIG. 7, each second drive via conductor 87b extends through the first resin layer 50A in the z-direction. In other words, the second drive via conductor 87b extends in the z-direction through a portion of the first resin layer 50A that covers the second element main surface 31B of the second switching element 30B. More specifically, the second drive via conductor 87b is disposed to join the first drive pad electrode 31BA of the second switching element 30B to the interface 57 between the first resin layer 50A and the second resin layer 50B. Thus, the second drive via conductor 87b extends in the z-direction through a portion of the first resin layer 50A located between the second element main surface 31B of the second switching element 30B and the interface 57.

Specifically, as viewed in the z-direction, through holes 58h extend in the z-direction through portions of the first resin layer 50A that overlap the first drive pad electrode 31BA of the second switching element 30B, that is, portions of the first resin layer 50A that cover the second element main surface 31B of the second switching element 30B. The through holes 58h extend in the z-direction through portions of the first resin layer 50A located between the second element main surface 31B of the second switching element 30B and the interface 57. As viewed in the z-direction from the interface 57, the first drive pad electrode 31BA of the second switching element 30B is exposed in the through holes 58*h*. In the present embodiment, the second drive via conductors 87*b* are separately embedded in the through holes 58*h*. More specifically, each second drive via conductor 87*b* fills the entirety of the through hole 58*h*. In the present embodiment, the second drive via conductor 87*b* extends in the z-direction. The second drive via conductor 87*b* is equal to the second control via conductor 82 in dimension in the z-direction. The second drive via conductor 87*b* is in contact with the first drive pad electrode 31BA of the second switching element 30B.

The drive connection wire 87*c* is disposed on the first resin layer 50A. As shown in FIG. 4, as viewed in the z-direction, the drive connection wire 87*c* extends in the x-direction. The drive connection wire 87*c* is in contact with the first drive via conductors 87*a* and the second drive via conductors 87*b*. Thus, the drive connection wire 87*c* entirely covers the first drive via conductors 87*a* in the z-direction and also entirely covers the second drive via conductors 87*b* in the z-direction. Therefore, the dimension of the drive connection wire 87*c* in the y-direction is greater than the total length of the diameter of the first drive via conductors 87*a* and the total length of the diameter of the second drive via conductors 87*b*. In the present embodiment, the drive connection wire 87*c* is equal to the power supply connection wire 83*c* and the ground connection wire 84*c* in dimension in the y-direction. As viewed in the z-direction, the drive connection wire 87*c* includes a portion that overlaps the second drive pad electrode 31AB of the first switching element 30A, a portion that overlaps the first drive pad electrode 31BA of the second switching element 30B, and a portion that overlaps the output wire 63.

The output via conductor 85*a* connect the output wire 63 to a portion of the drive connection wire 87*c* that overlaps the output wire 63 as viewed in the z-direction. As shown in FIG. 4, as viewed in the z-direction, the output via conductor 85*a* is disposed to overlap both the drive connection wire 87*c* and the output wire 63. As viewed in the z-direction, the output via conductors 85*a* are spaced apart from each other in the x-direction and the y-direction. In the present embodiment, the output via conductors 85*a* are each circular as viewed in the z-direction. The output via conductor 85*a* has a diameter that is, for example, greater than or equal to 100 μm and less than or equal to 200 μm.

As shown in FIGS. 6 and 7, the output via conductors 85*a* extend through the first resin layer 50A in the z-direction. More specifically, the output via conductors 85*a* are disposed to join the resin back surface 52 of the encapsulation resin 50 to the interface 57 between the first resin layer 50A and the second resin layer 50B. Thus, the output via conductor 85*a* is equal to the first resin layer 50A in dimension in the z-direction. The output via conductor 85*a* is greater than each of the first drive via conductor 87*a* and the second drive via conductor 87*b* in dimension in the z-direction. The output via conductor 85*a* is equal to the second ground via conductor 84*b* and the second power supply via conductor 83*b* in dimension in the z-direction. The output via conductors 85*a* are in contact with the drive connection wire 87*c* and the output wire 63.

Specifically, as viewed in the z-direction, through holes 58*i* extend through the first resin layer 50A in the z-direction in portions of the first resin layer 50A that overlap both the drive connection wire 87*c* and the output wire 63. As viewed in the z-direction from the interface 57, the output wire 63 is exposed in the through holes 58*i*. As viewed in the z-direction from the substrate 20, the drive connection wire 87*c* is exposed in the through holes 58*i*. In the present embodiment, the output via conductors 85*a* are separately embedded in the through holes 58*i*. More specifically, each output via conductor 85*a* fills the entirety of the through hole 58*i*. In the present embodiment, the output via conductor 85*a* extends in the z-direction.

As shown in FIG. 4, the control connection conductors 86 separately connect the control wires 64 to the driver pad electrodes 43, which are formed on the driver back surface 42 of the driver 40.

Each of the control connection conductors 86 includes a control connection wire 86*a* and a connection via conductor 86*b*.

Figure 8:
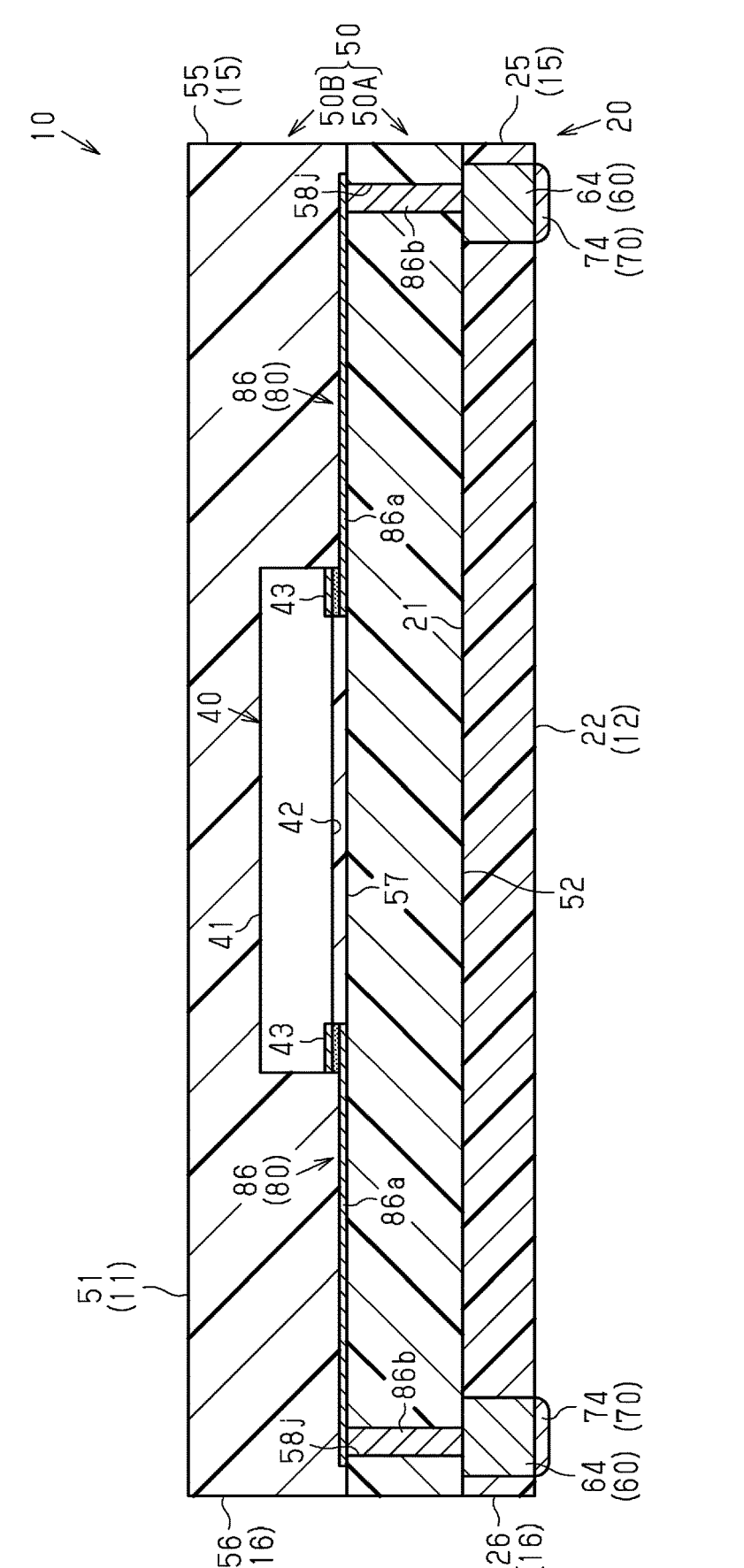
FIG. 8 is a cross-sectional view of the semiconductor device taken along line 8-8 in FIG. 4.

As shown in FIG. 8, the control connection wires 86*a* are disposed on the first resin layer 50A and are electrically connected to the driver pad electrodes 43 of the driver 40. As shown in FIG. 4, as viewed in the z-direction, each control connection wire 86*a* includes a portion that overlaps the driver pad electrode 43 of the driver 40, a portion that overlaps the control wire 64, and a portion that joins the two portions. The control connection wire 86*a* is connected to the driver pad electrode 43 by a conductive bonding material.

As shown in FIG. 4, as viewed in the z-direction, the connection via conductors 86*b* are disposed to overlap the control connection wires 86*a* and the control wires 64. In the present embodiment, the connection via conductors 86*b* are each circular as viewed in the z-direction. The connection via conductor 86*b* has a diameter that is greater than or equal to 100 μm and less than or equal to 200 μm.

As shown in FIG. 8, the connection via conductors 86*b* extend through the first resin layer 50A in the z-direction. More specifically, the connection via conductors 86*b* are disposed to join the resin back surface 52 of the encapsulation resin 50 to the interface 57 between the first resin layer 50A and the second resin layer 50B. Thus, the connection via conductors 86*b* are equal to the first resin layer 50A in dimension in the z-direction. The connection via conductors 86*b* are equal to the second ground via conductors 84*b* and the second power supply via conductors 83*b* in dimension in the z-direction. Each of the connection via conductors 86*b* is in contact with the control connection wire 86*a* and the control wire 64.

Specifically, as viewed in the z-direction, through holes 58*j* extend through the first resin layer 50A in the z-direction in portions of the first resin layer 50A that overlap the control connection wires 86*a* and the control wires 64. As viewed in the z-direction from the interface 57, the control wires 64 are exposed in the through holes 58*j*. As viewed in the z-direction from the substrate 20, the control connection wires 86*a* are exposed in the through holes 58*j*. In the present embodiment, the connection via conductors 86*b* are separately embedded in the through holes 58*j*. More specifically, each connection via conductor 86*b* fills the entirety of the through hole 58*j*. In the present embodiment, the connection via conductor 86*b* extends in the z-direction.

Figure 9:
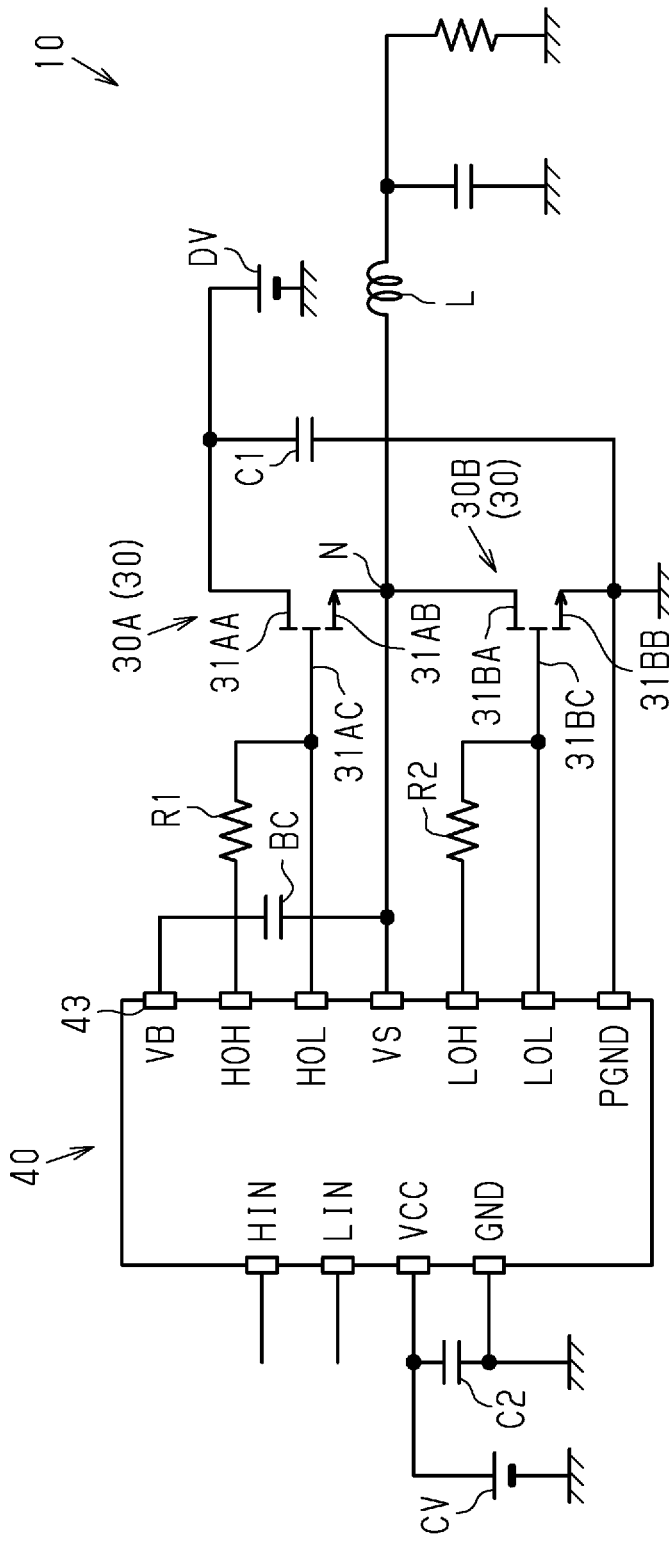
FIG. 9 is a circuit diagram showing an example of a circuit configuration of the semiconductor device shown in FIG. 1.

An example of a circuit configuration of the semiconductor device 10 will now be described with reference to FIG. 9.

The first drive pad electrode 31AA (drain electrode) of the first switching element 30A is electrically connected to a positive terminal of a driving power supply DV, which is a direct current power supply. The second drive pad electrode 31AB (source electrode) of the first switching element 30A is electrically connected to the first drive pad electrode 31BA (drain electrode) of the second switching element 30B. The second drive pad electrode 31BB (source electrode) of the second switching element 30B is connected to ground. Thus, the first switching element 30A and the second switching element 30B are connected in series.

A capacitor C1 is connected to the first switching element 30A and the second switching element 30B that are connected in series. The capacitor C1 serves to remove noise from voltage that is supplied from the driving power supply DV to the first drive pad electrode 31AA of the first switching element 30A.

A node N is disposed between the second drive pad electrode 31AB of the first switching element 30A and the first drive pad electrode 31BA of the second switching element 30B and is electrically connected to a load L to which the semiconductor device 10 supplies electric power. The load L is arranged outside the semiconductor device 10. An example of the load L is a motor.

The driver 40 is electrically connected to the first control pad electrode 31AC (gate electrode) of the first switching element 30A and the second control pad electrode 31BC (gate electrode) of the second switching element 30B. The driver 40 generates a gate voltage that controls activation and deactivation of the switching elements 30A and 30B based on a signal from a signal generation circuit (not shown) arranged outside the semiconductor device 10. The driver 40 supplies the gate voltage to the control pad electrodes 31AC and 31BC.

The driver pad electrodes 43 of the driver 40 include a first signal input terminal HIN, a second signal input terminal LIN, a control-side power terminal VCC, a control-side ground terminal GND, a bootstrapping terminal VB, a first signal output terminal HOH, a second signal output terminal HOL, an output-side power terminal VS, a third signal output terminal LOH, a fourth signal output terminal LOL, and an output-side ground terminal PGND. The driver pad electrodes 43 may include other terminals in addition to the terminals described above.

The first signal input terminal HIN receives a high-potential signal from the signal generation circuit. The second signal input terminal LIN receives a low-potential signal from the signal generation circuit. The driver 40 generates a gate voltage based on the high-potential signal and the low-potential signal received from the signal generation circuit through the signal input terminals HIN and LIN and outputs the gate voltage to the control pad electrodes 31AC and 31BC of the switching elements 30A and 30B.

The control-side power terminal VCC is electrically connected to a positive terminal of a control power supply CV, which is a direct current power supply arranged outside the semiconductor device 10. A negative terminal of the control power supply CV is connected to ground. A capacitor C2 is disposed between the control-side power terminal VCC and the control power supply CV. The capacitor C2 and the control power supply CV are connected in parallel. The capacitor C2 serves to remove noise from voltage that is supplied from the control power supply CV to the control-side power terminal VCC. The capacitor C2 has a first terminal connected to a positive terminal of the control-side power terminal VCC. The capacitor C2 has a second terminal connected to ground. The control-side ground terminal GND is connected to ground. More specifically, the control-side ground terminal GND is electrically connected to the second terminal of the capacitor C2. The driver 40 is driven by voltage (for example, 5 V) supplied from the control power supply CV.

The output-side power terminal VS serves as a power supply of the load L. The output-side power terminal VS is connected to the node N disposed between the second drive pad electrode 31AB of the first switching element 30A and the first drive pad electrode 31BA of the second switching element 30B.

The first signal output terminal HOH and the second signal output terminal HOL supply a gate voltage that is generated in the driver 40 to the first control pad electrode 31AC of the first switching element 30A. The signal output terminals HOH and HOL are electrically connected to the first control pad electrode 31AC. A current limiting resistor R1 is disposed between the first signal output terminal HOH and the first control pad electrode 31AC.

The third signal output terminal LOH and the fourth signal output terminal LOL supply a gate voltage that is generated in the driver 40 to the second control pad electrode 31BC of the second switching element 30B. The signal output terminals LOH and LOL are electrically connected to the second control pad electrode 31BC. A current limiting resistor R2 is disposed between the third signal output terminal LOH and the second control pad electrode 31BC.

The bootstrapping terminal VB is connected to a bootstrap capacitor BC. The bootstrap capacitor BC forms a bootstrapping circuit (not shown) that generates a gate voltage that has a high potential and is output from the first signal output terminal HOH and the second signal output terminal HOL. The driver 40 includes a bootstrap diode forming the bootstrapping circuit. The bootstrap capacitor BC has a first terminal connected to the bootstrapping terminal VB. The bootstrap capacitor BC has a second terminal connected to the node N disposed between the second drive pad electrode 31AB of the first switching element 30A and the first drive pad electrode 31BA of the second switching element 30B.

The output-side ground terminal PGND is electrically connected to the second drive pad electrode 31BB (source electrode) of the second switching element 30B. That is, the output-side ground terminal PGND is connected to ground.

With this configuration, when a high-potential signal and a low-potential signal from the signal generation circuit are input into the driver 40, the driver 40 generates a gate voltage based on the signals and supplies the gate voltage to the control pad electrodes 31AC and 31BC of the switching elements 30A and 30B. The switching elements 30A and 30B are activated and deactivated based on the gate voltage.

Semiconductor Device Manufacturing Method

An example of a method for manufacturing the semiconductor device 10 will now be described with reference to FIGS. 10 to 21.

The method for manufacturing the semiconductor device 10 mainly includes a wiring layer forming step, a switching element mounting step, a first resin layer forming step, a connection conductor forming step, a driver mounting step, a second resin layer forming step, an external terminal forming step, and a cutting step.

Figure 10:
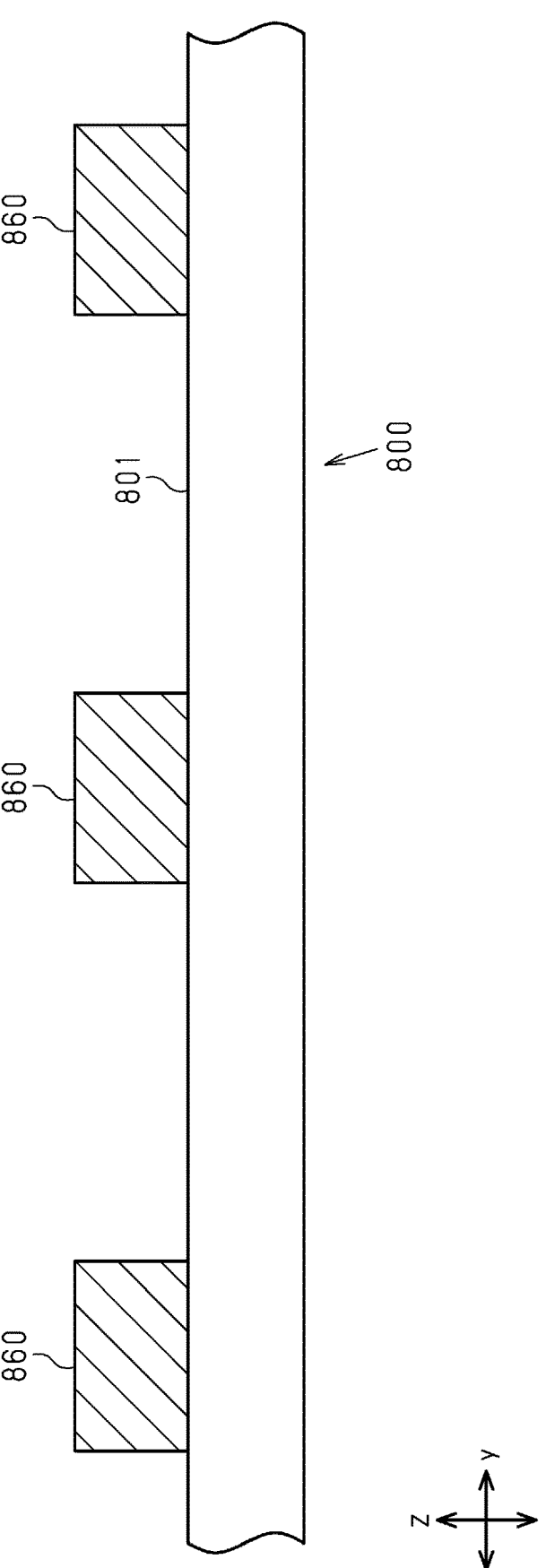
FIG. 10 is a diagram showing an example of a manufacturing step in a method for manufacturing the semiconductor device in the embodiment.
Figure 11:
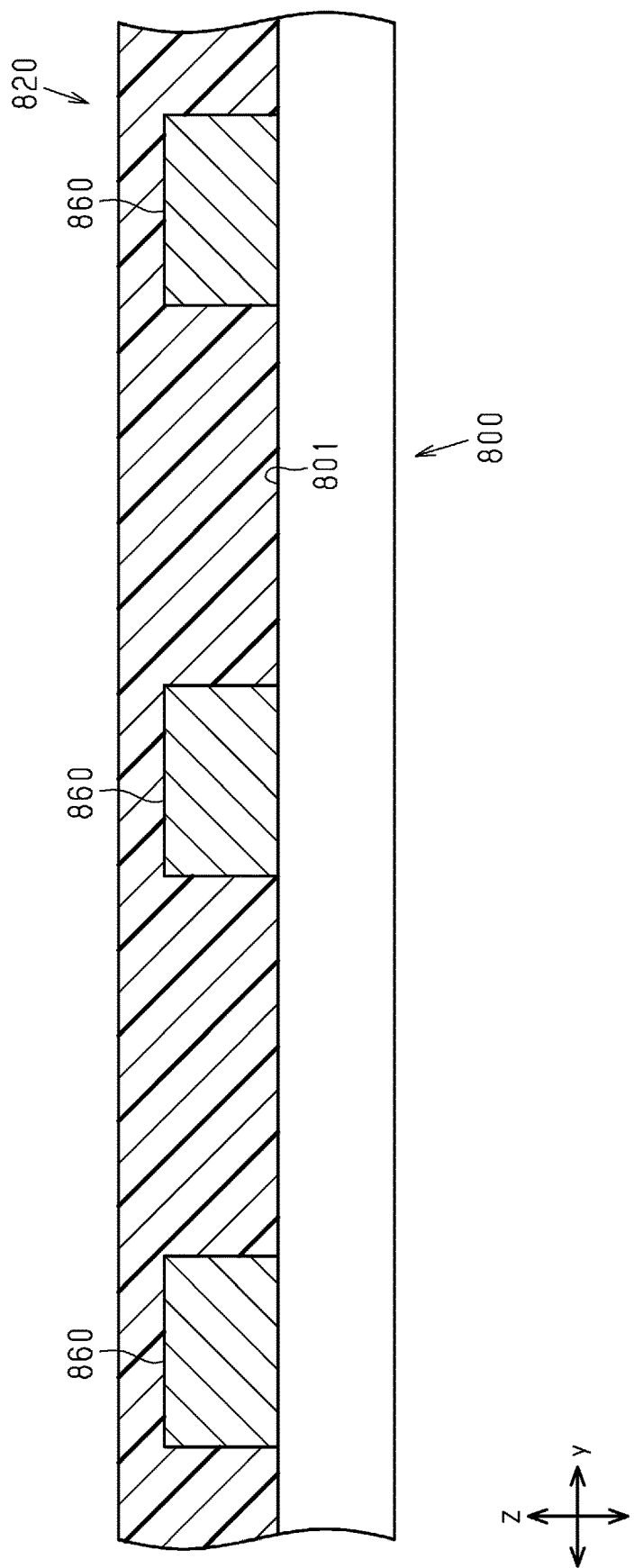
FIG. 11 is a diagram showing an example of a manufacturing step in the method for manufacturing the semiconductor device.
Figure 12:
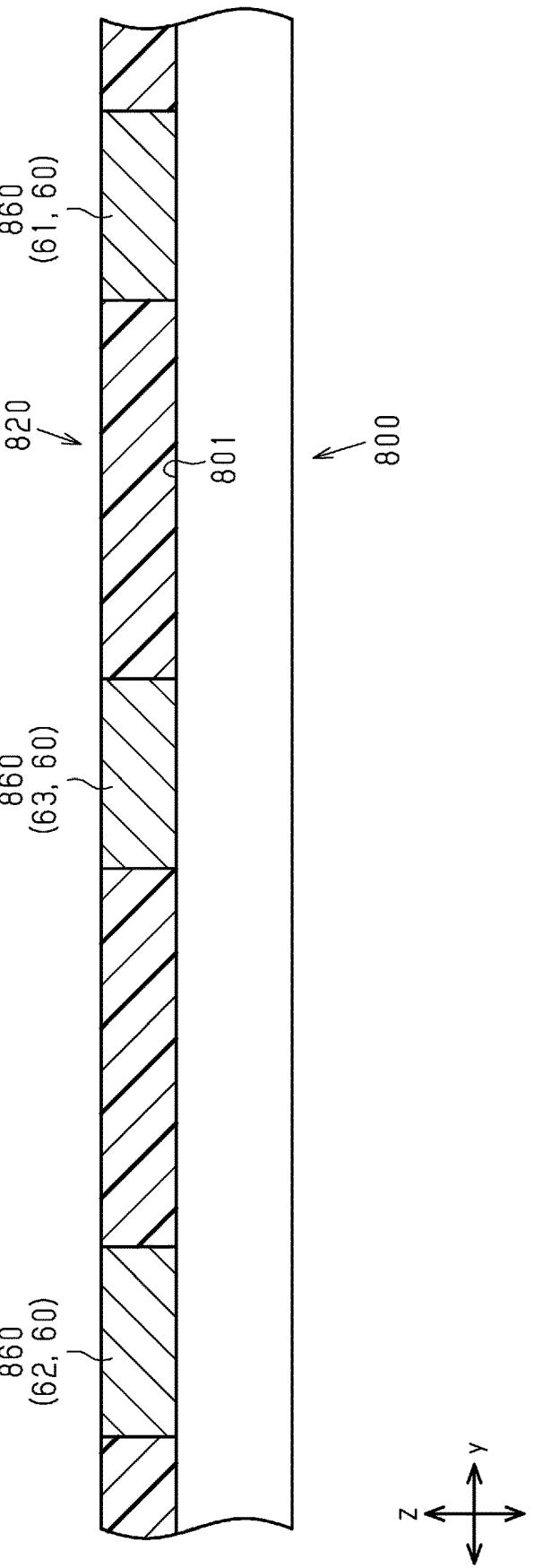
FIG. 12 is a diagram showing an example of a manufacturing step in the method for manufacturing the semiconductor device.

The wiring layer forming step includes a conductive portion forming step shown in FIG. 10, a base member forming step shown in FIG. 11, and a grinding step shown in FIG. 12.

FIG. 10 shows an example of the conductive portion forming step in which a support substrate 800 formed of Si is prepared. The support substrate 800 includes a substrate main surface 801 facing one side in the z-direction. Conductive portions 860 are formed on the substrate main surface 801. More specifically, first, an insulation film (not shown) is formed on the substrate main surface 801. The insulation film is obtained by coating the entire substrate main surface 801 with an oxide film through thermal oxidation and then coating the oxide film with a nitride film through plasma chemical vapor deposition (CVD). Then, a seed layer is formed on the insulation film. The seed layer is obtained by coating the entire insulation film with a barrier layer through sputtering and then coating the barrier layer with a seed layer through sputtering. The seed layer is formed of, for example, Ti. Then, a plated layer is formed on the seed layer. The plated layer is obtained by performing lithography patterning on the seed layer and then performing electrolytic plating that uses the seed layer as a conductive path. The plated layer is formed of Cu. The plated layer is formed on portions of the seed layer corresponding to the conductive portions 60 of the semiconductor device 10. Portions of the barrier layer and the seed layer that are not covered by the plated layer are removed. Thus, the conductive portions 860 are formed of a lamination of the seed layer and the plated layer. Alternatively, the conductive portions 860 may be formed of copper pillars. In the conductive portion forming step, the conductive portion 860 is greater than the conductive portion 60 in dimension in the z-direction.

FIG. 10 shows the conductive portions 860 that correspond to the power supply wire 61, the ground wire 62, and the output wire 63 (refer to FIG. 5) of the conductive portions 60. Although not shown, the conductive portion forming step also forms conductive portions 860 that correspond to the control wires 64 (refer to FIG. 8) of the conductive portions 60.

As shown in FIG. 11, the base member forming step forms a base member 820 on the substrate main surface 801. The base member 820 forms the substrate 20 of the semiconductor device 10 and is formed from, for example, an epoxy resin. The base member 820 is formed to encapsulate the conductive portions 860. More specifically, the base member 820 covers an end surface of each conductive portion 860 located at the opposite side from the support substrate 800 in the z-direction. The base member 820 is formed through, for example, transfer molding or compression molding. Although not shown in FIG. 11, the base member 820 also covers the conductive portions 860 corresponding to the control wires 64 of the conductive portions 60.

As shown in FIG. 12, in the grinding step, the base member 820 and the conductive portions 860 are removed in the z-direction. More specifically, a grinding machine is used to remove part of the base member 820 located at the opposite side from the support substrate 800 in the z-direction. At this time, part of the conductive portions 860 located at the opposite side from the support substrate 800 in the z-direction is also removed. This decreases the dimension of the base member 820 and the dimension of the conductive portions 860 in the z-direction and exposes the conductive portions 860 from the base member 820 in the z-direction. As a result, the base member 820 becomes equal to the substrate 20 in dimension in the z-direction, and the conductive portions 860 become equal to the conductive portions 60 in dimension in the z-direction. The steps described above form the conductive portions 60.

Figure 13:
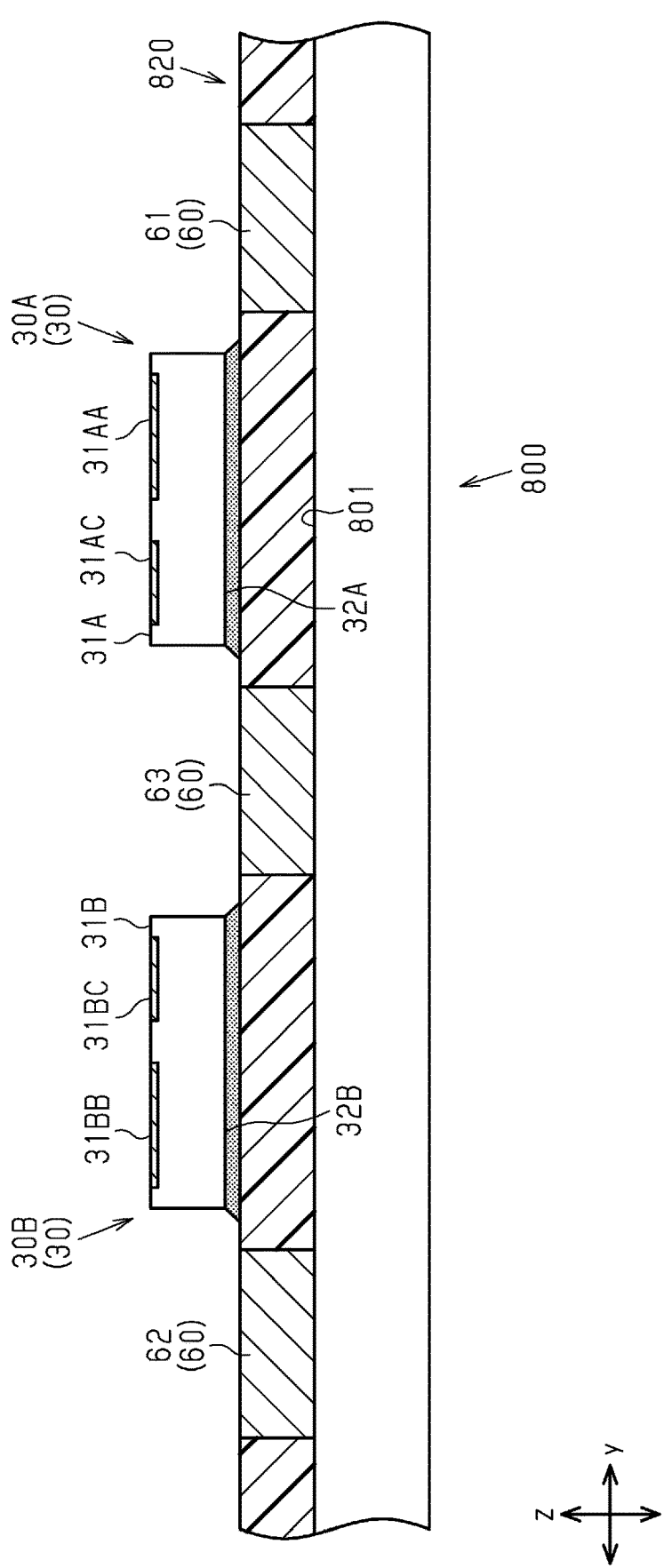
FIG. 13 is a diagram showing an example of a manufacturing step in the method for manufacturing the semiconductor device.

As shown in FIG. 13, in the switching element mounting step, the first switching element 30A and the second switching element 30B are mounted on the base member 820. More specifically, a bonding material formed of an adhesive is applied to positions of the base member 820 on which the switching elements 30A and 30B will be mounted. The switching elements 30A and 30B are mounted on the bonding material. The bonding material is cured and bonded to the switching elements 30A and 30B. Thus, the bonding material bonds the switching elements 30A and 30B to the base member 820.

Figure 14:
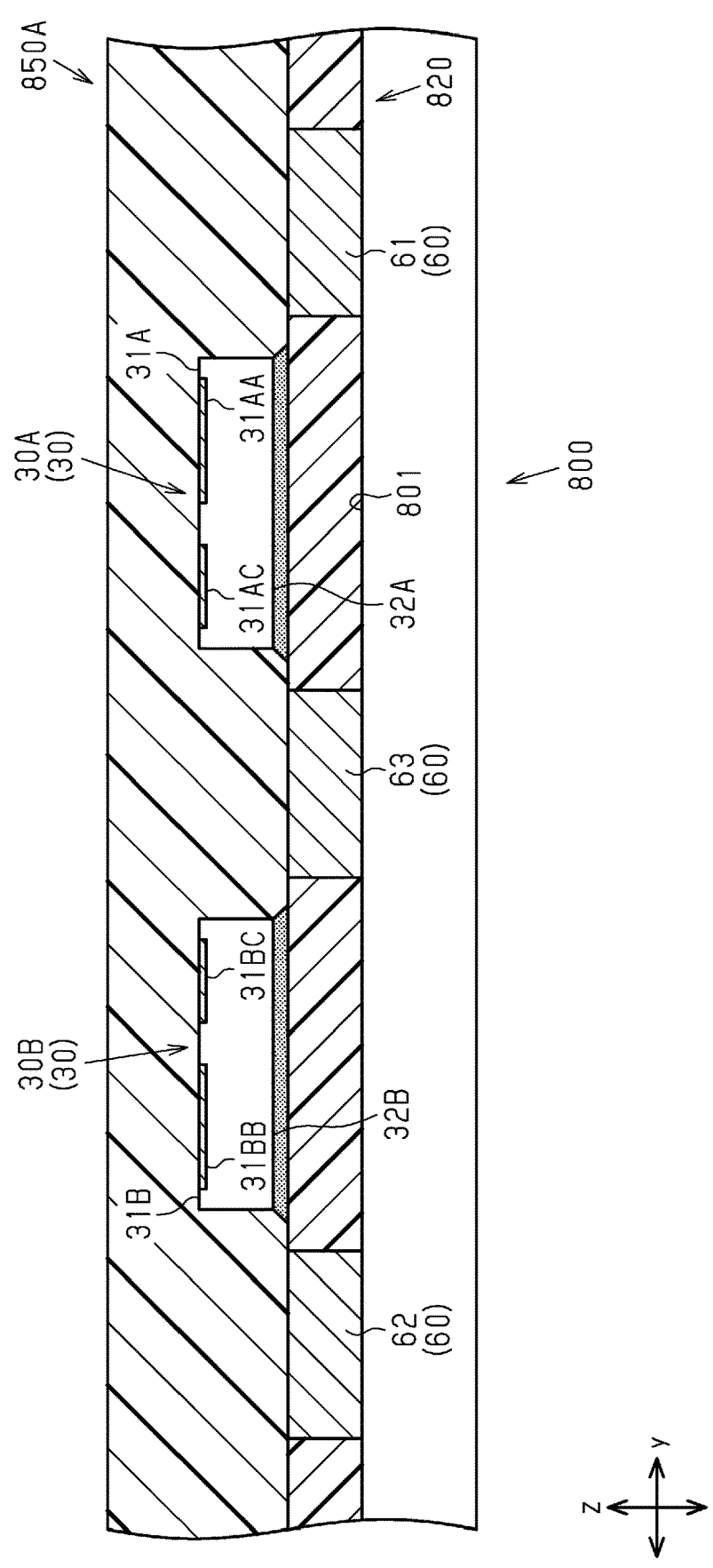
FIG. 14 is a diagram showing an example of a manufacturing step in the method for manufacturing the semiconductor device.
Figure 15:
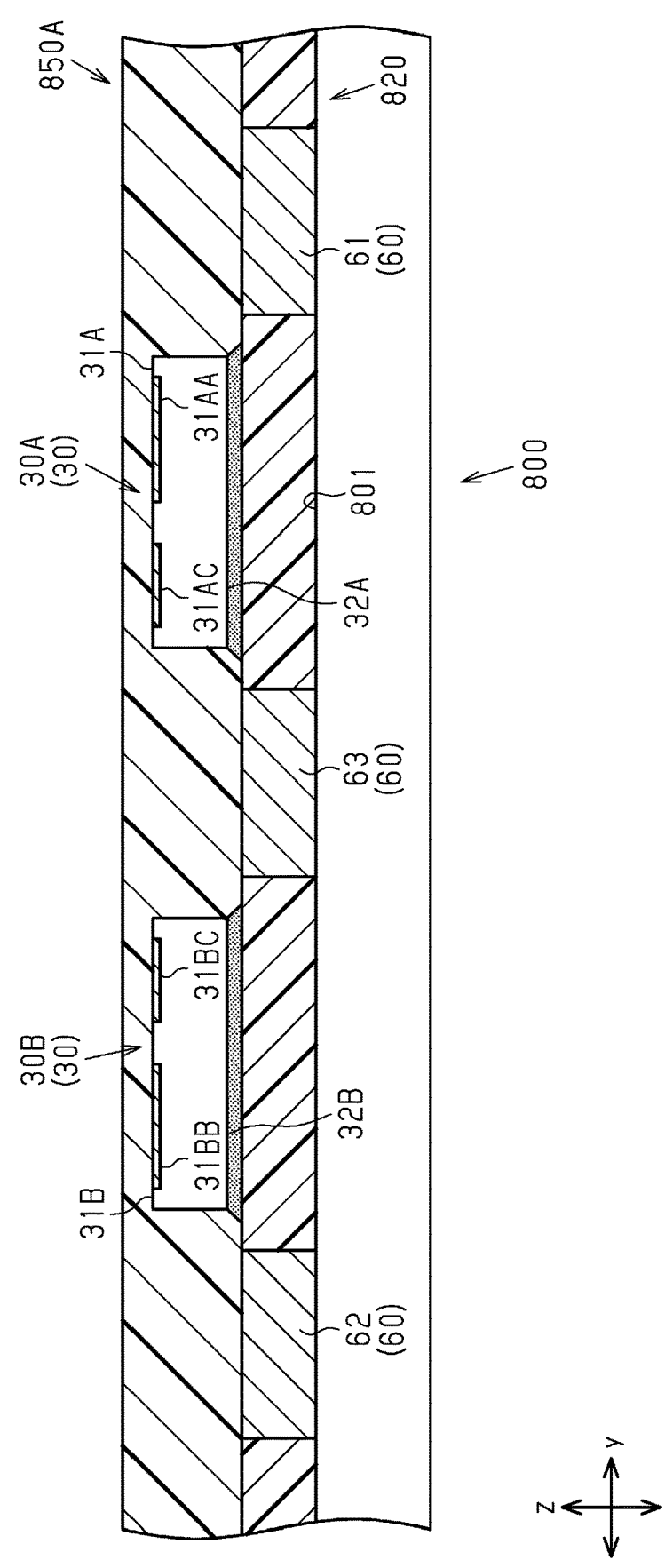
FIG. 15 is a diagram showing an example of a manufacturing step in the method for manufacturing the semiconductor device.

The first resin layer forming step includes a resin layer forming step shown in FIG. 14 and the grinding step shown in FIG. 15.

As shown in FIG. 14, the resin layer forming step forms a first resin layer 850A that encapsulates the switching elements 30A and 30B. The first resin layer 850A is a layer forming the first resin layer 50A of the semiconductor device 10 and is formed from, for example, a black epoxy resin. The first resin layer 850A is greater than the first resin layer 50A in dimension in the z-direction. The first resin layer 850A is formed through, for example, transfer molding or compression molding.

As shown in FIG. 15, in the grinding step, the first resin layer 850A is removed in the z-direction. More specifically, a grinding machine is used to remove part of the first resin layer 850A located at the opposite side from the base member 820 in the z-direction. This shortens the distance from the first resin layer 850A to the element main surfaces 31A and 31B of the switching elements 30A and 30B in the z-direction. The first resin layer 850A is removed until the distance becomes, for example, approximately a few hundred µm. Thus, the first resin layer 850A becomes equal in dimension in the z-direction to the first resin layer 50A. As described above, the portion of the first resin layer 850A that covers the element main surfaces 31A and 31B of the switching elements 30A and 30B is reduced in thickness.

Figure 16:
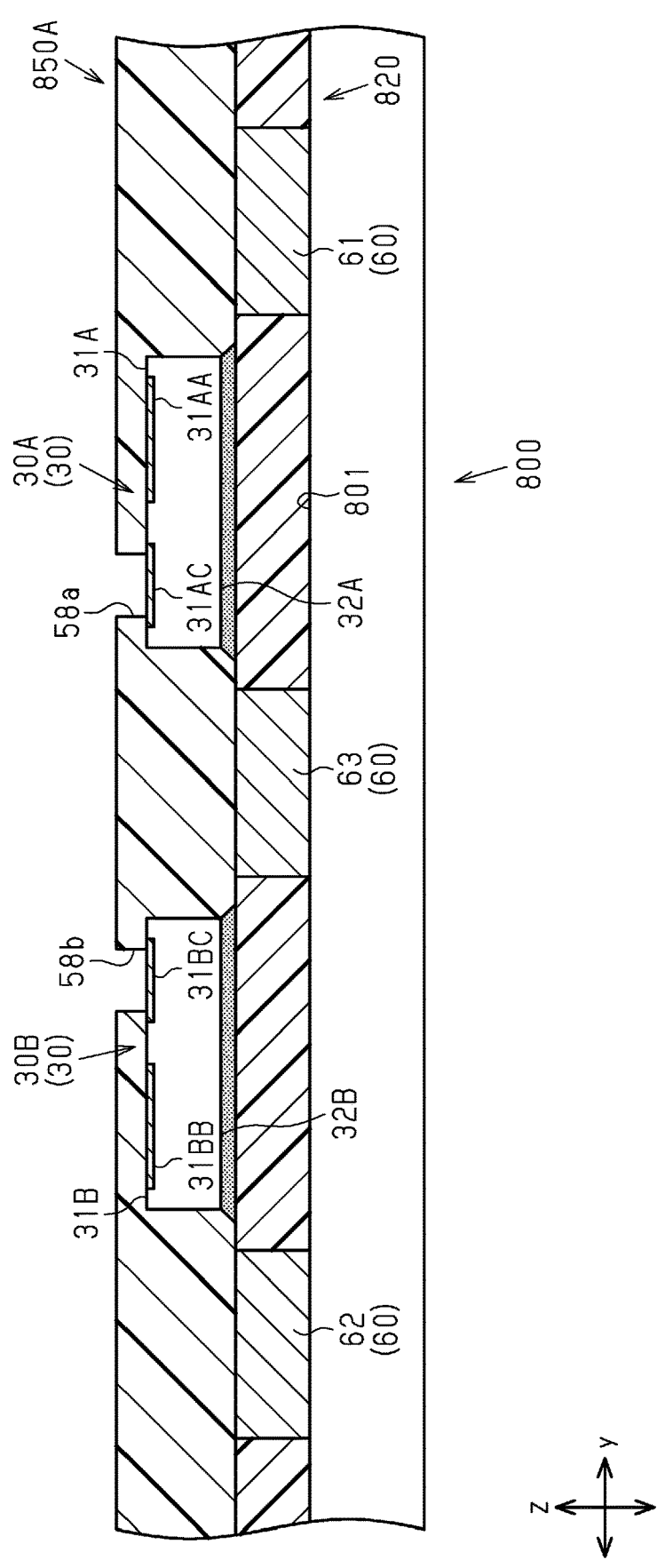
FIG. 16 is a diagram showing an example of a manufacturing step in the method for manufacturing the semiconductor device.
Figure 17:
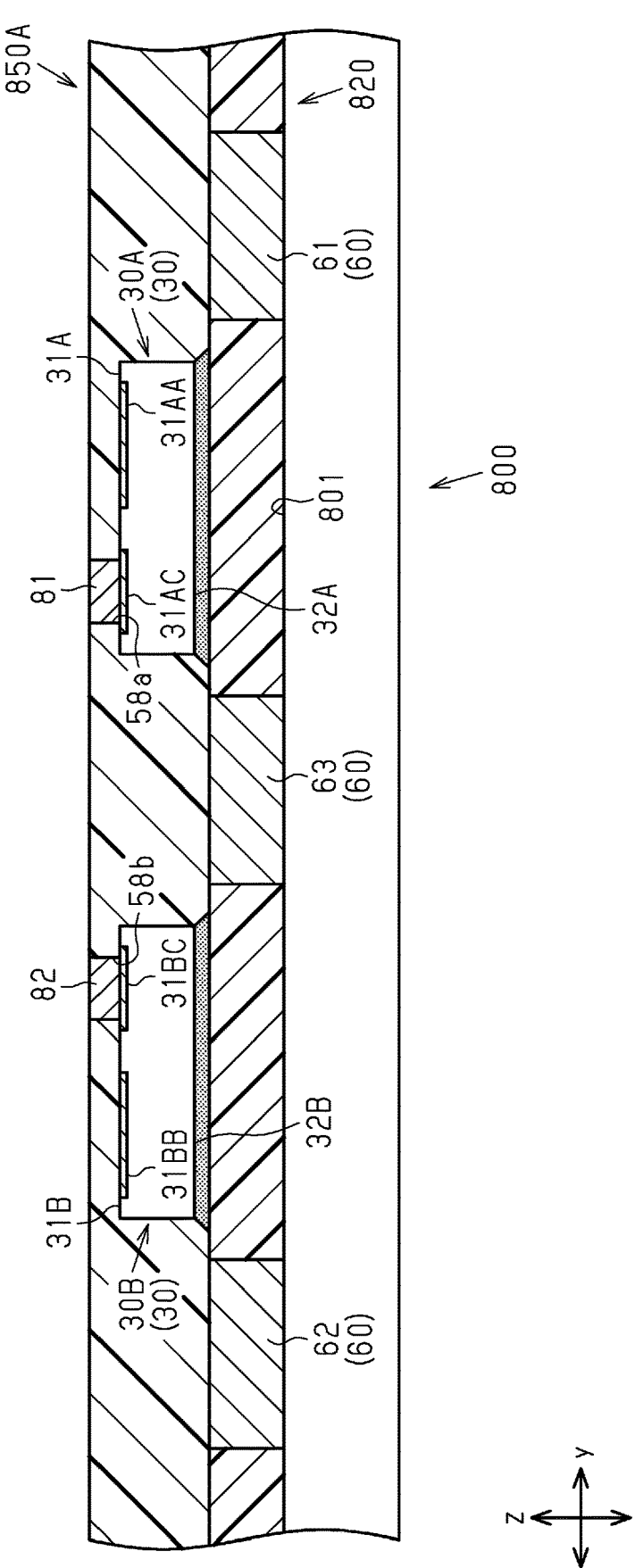
FIG. 17 is a diagram showing an example of a manufacturing step in the method for manufacturing the semiconductor device.
Figure 18:
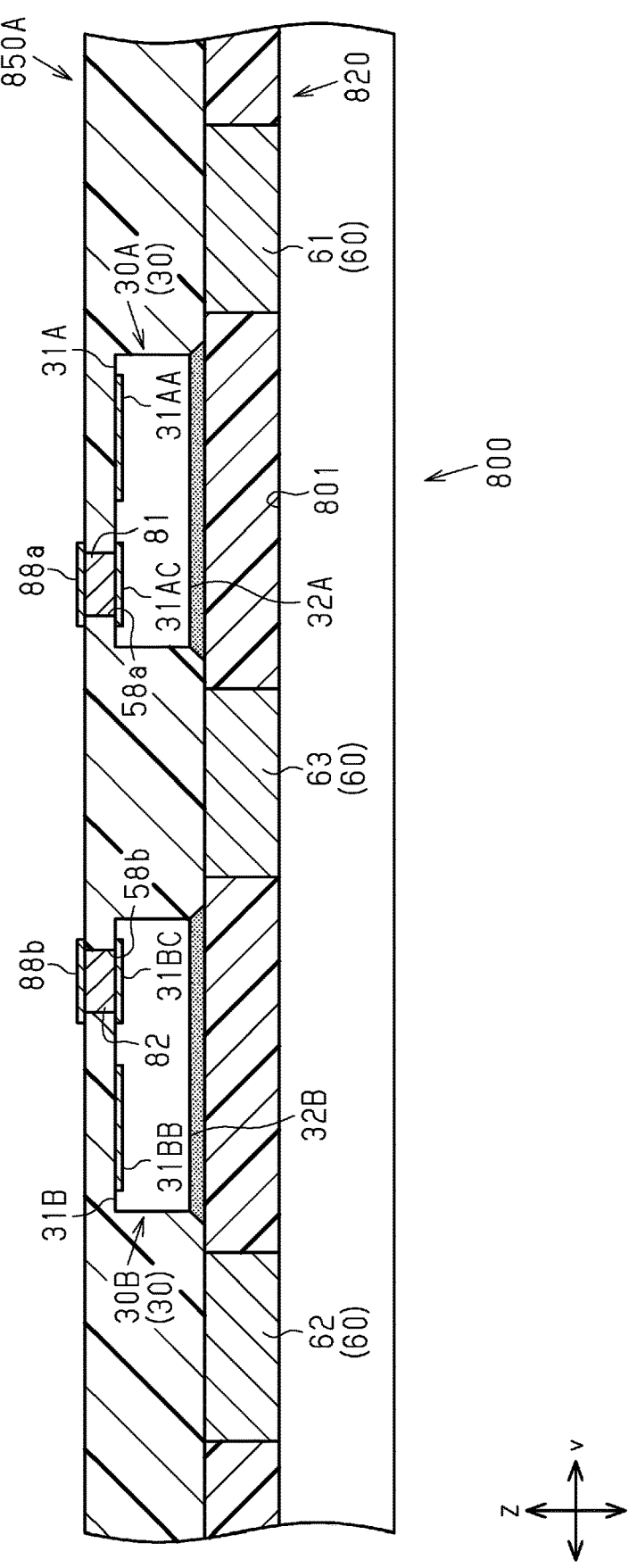
FIG. 18 is a diagram showing an example of a manufacturing step in the method for manufacturing the semiconductor device.

The connection conductor forming step includes a through hole forming step shown in FIG. 16, a via conductor forming step shown in FIG. 17, and a wire forming step shown in FIG. 18.

As shown in FIG. 16, in the through hole forming step, the through holes 58a to 58j are formed in the first resin layer 850A by, for example, boring such as laser cutting. In FIG. 16, the through hole 58a and the through hole 58b are formed in the first resin layer 850A to expose the first control pad electrode 31AC of the first switching element 30A and the second control pad electrode 31BC of the second switching element 30B, respectively, in the z-direction. The through holes 58a and 58b extend in the z-direction through the respective portions of the first resin layer 850A that cover the element main surfaces 31A and 31B of the switching elements 30A and 30B.

Although not shown, the through holes 58c to 58j are also formed in the first resin layer 850A. In the same manner as the through holes 58a and 58b, the through holes 58c, 58e, 58g, and 58h extend in the z-direction through the respective portions of the first resin layer 850A that cover the element main surfaces 31A and 31B of the switching elements 30A and 30B. The through holes 58d, 58f, 58i, and 58j are formed to extend through the first resin layer 850A in the z-direction. That is, the through holes 58d, 58f, 58i, and 58j extend in the z-direction through the first resin layer 850A excluding the portions that cover the element main surfaces 31A and 31B of the switching elements 30A and 30B.

As shown in FIG. 17, in the via conductor forming step, via conductors are embedded in the through holes 58a to 58j. More specifically, as shown in FIG. 17, the first control via conductor 81 is embedded in the through hole 58a, and the second control via conductor 82 is embedded in the through hole 58b.

Although not shown, in the same manner as the control via conductors 81 and 82, the power supply via conductors 83a and 83b, the ground via conductors 84a and 84b, the output via conductors 85a, the connection via conductors 86b, and the drive via conductors 87a and 87b, which are via conductors embedded in the through holes 58c to 58j, are also formed.

As shown in FIG. 18, in the wire forming step, the connection conductors 88a and 88b are formed in the same manner as the conductive portion forming step and the via conductor forming step. That is, the connection conductors 88a and 88b are formed of, a lamination of Ti and Cu. The connection conductors 88a and 88b are formed on the first resin layer 850A.

Although not shown, in the same manner as the connection conductors 88a and 88b, the power supply connection wire 83c, the ground connection wire 84c, the control connection wires 86a, and the drive connection wire 87c are also formed on the first resin layer 850A. As described above, since the connection conductors 88a and 88b, the power supply connection wire 83c, the ground connection wire 84c, the control connection wires 86a, and the drive connection wire 87c are formed on the first resin layer 850A, the conductors and the wires are simultaneously formed in the wire forming step.

Figure 19:
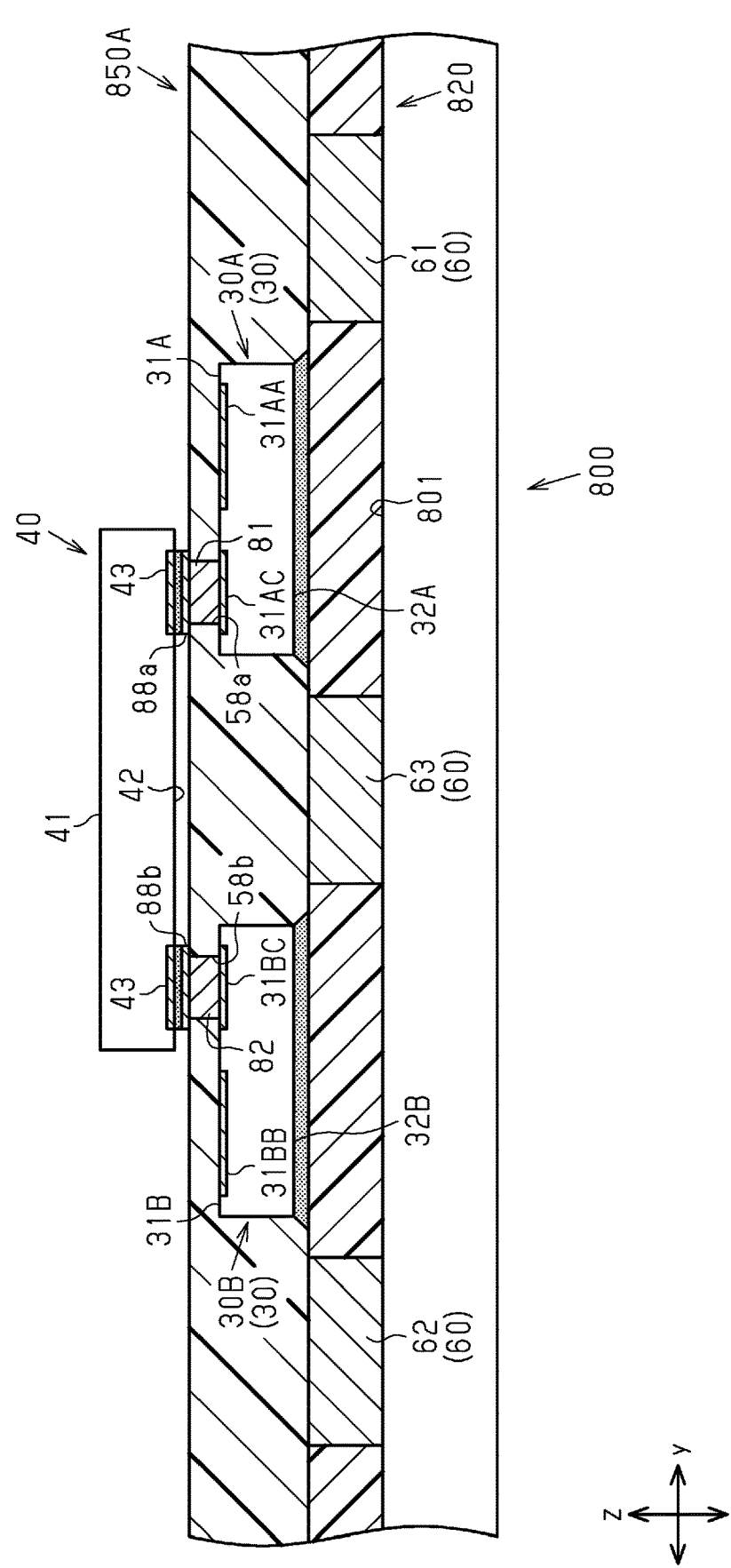
FIG. 19 is a diagram showing an example of a manufacturing step in the method for manufacturing the semiconductor device.

As shown in FIG. 19, in the driver mounting step, the driver 40 is mounted on the first resin layer 850A. More specifically, a conductive bonding material such as solder or Ag paste is applied to the connection conductors 88a and 88b and the control connection wires 86a at positions where the driver 40 will be mounted. The driver 40 is mounted on the conductive bonding material by, for example, flip-chip-bonding. The conductive bonding material is liquefied by reflowing. The conductive bonding material is cooled and solidified to bond the conductive bonding material to the driver 40. Thus, the driver 40 is bonded to the control connection wires 86a and the connection conductors 88a and 88b by the conductive bonding material.

Figure 20:
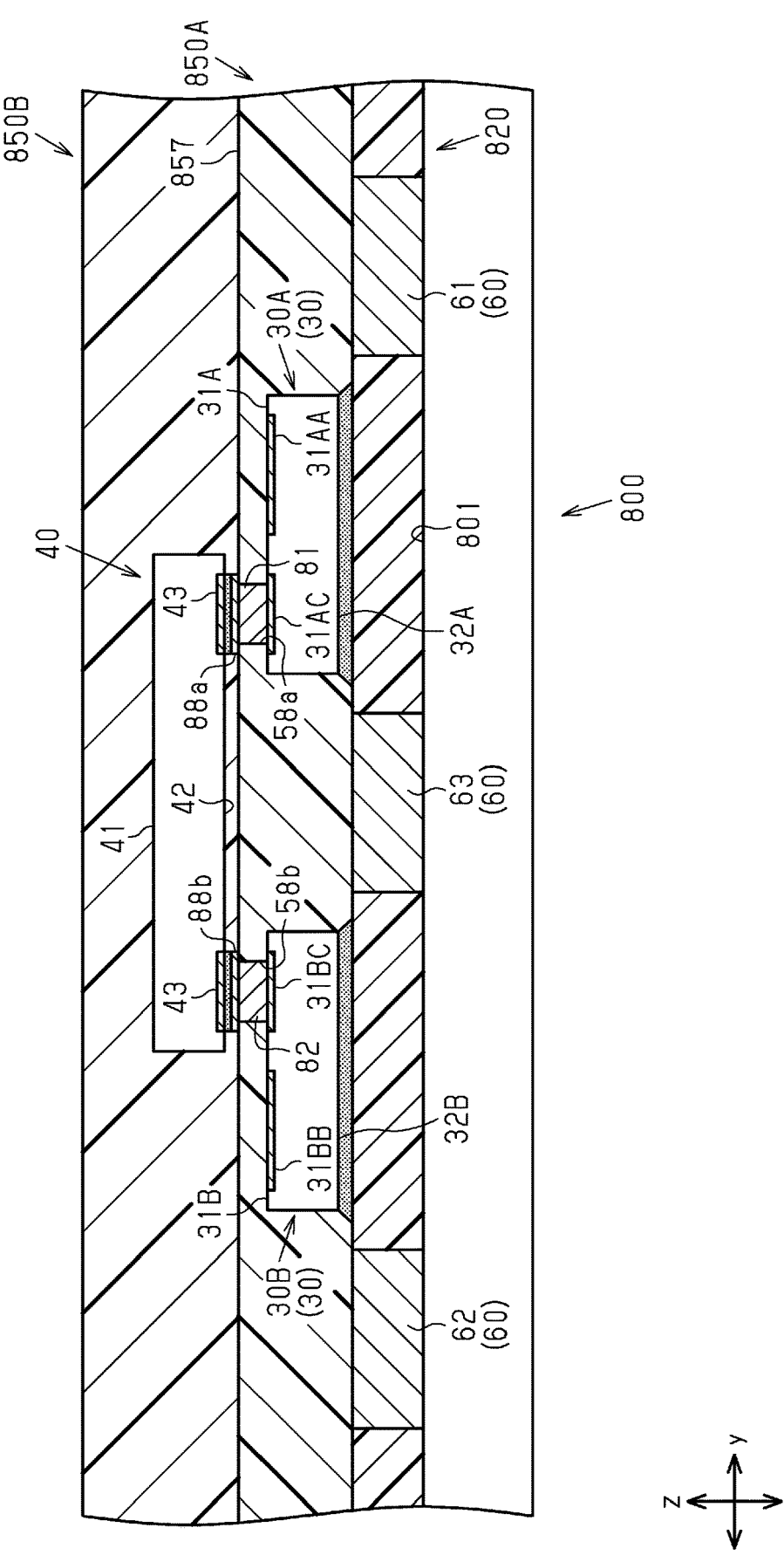
FIG. 20 is a diagram showing an example of a manufacturing step in the method for manufacturing the semiconductor device.

As shown in FIG. 20, the second resin layer forming step forms a second resin layer 850B on the first resin layer 850A. The second resin layer 850B is a layer forming the second resin layer 50B of the semiconductor device 10 and is formed from, for example, a black epoxy resin. In the present embodiment, the second resin layer 850B and the first resin layer 850A are formed from the same material. As viewed in the z-direction, the second resin layer 850B is formed on the entire first resin layer 850A. The second resin layer 850B encapsulates the driver 40. The second resin layer 850B is formed through, for example, transfer molding or compression molding. Thus, an interface 857 is defined between the first resin layer 850A and the second resin layer 850B in the z-direction. The second resin layer 850B is greater than the first resin layer 850A in dimension in the z-direction. In other words, the second resin layer 850B has a greater thickness than the first resin layer 850A. Also, as shown in FIG. 20, the portion of the second resin layer 850B that covers the driver main surface 41 of the driver 40 has a greater thickness than the portion of the first resin layer 850A that covers the element main surfaces 31A and 31B of the switching elements 30A and 30B. In other words, the portion of the first resin layer 850A covering the element main surfaces 31A and 31B of the switching elements 30A and 30B has a smaller thickness than the portion of the second resin layer 850B covering the driver main surface 41 of the driver 40.

Figure 21:
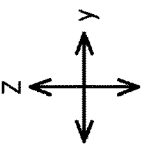
FIG. 21 is a diagram showing an example of a manufacturing step in the method for manufacturing the semiconductor device.

As shown in FIG. 21, in the external terminal forming step, the support substrate 800 is separated from the base member 820. In an example, the support substrate 800 is separated from the base member 820 by mechanical grinding or debonding. This exposes the conductive portions 60 from the surface of the base member 820 located at the opposite side from the first resin layer 850A. A plated layer is formed on the conductive portions 60 that are exposed from the surface of the base member 820 located at the opposite side from the first resin layer 850A. The plated layer is formed by, for example, depositing Ni, Pd, and Au in this order through electroless plating. This forms the external terminals 70. In FIG. 21, the power supply terminal 71, the ground terminal 72, and the output terminal 73 are formed as the external terminals 70. Although not shown, the control terminals 74 are formed in the same manner as the terminals 71 to 73.

As shown in FIG. 21, in the cutting step, dicing tape TP is applied to the second resin layer 850B. In an example, a dicing blade is used to cut the second resin layer 850B, the first resin layer 850A, and the base member 820 in this order along cutting lines CL indicated by the single-dashed lines shown in FIG. 21. Thus, the first resin layer 850A forms the first resin layer 50A, and the second resin layer 850B forms the second resin layer 50B. That is, the encapsulation resin 50 is formed. In addition, the base member 820 forms the substrate 20. The steps described above manufacture the semiconductor device 10.

Operation

The operation of the present embodiment of the semiconductor device 10 will now be described with reference to FIGS. 5 and 22.

Figure 22:
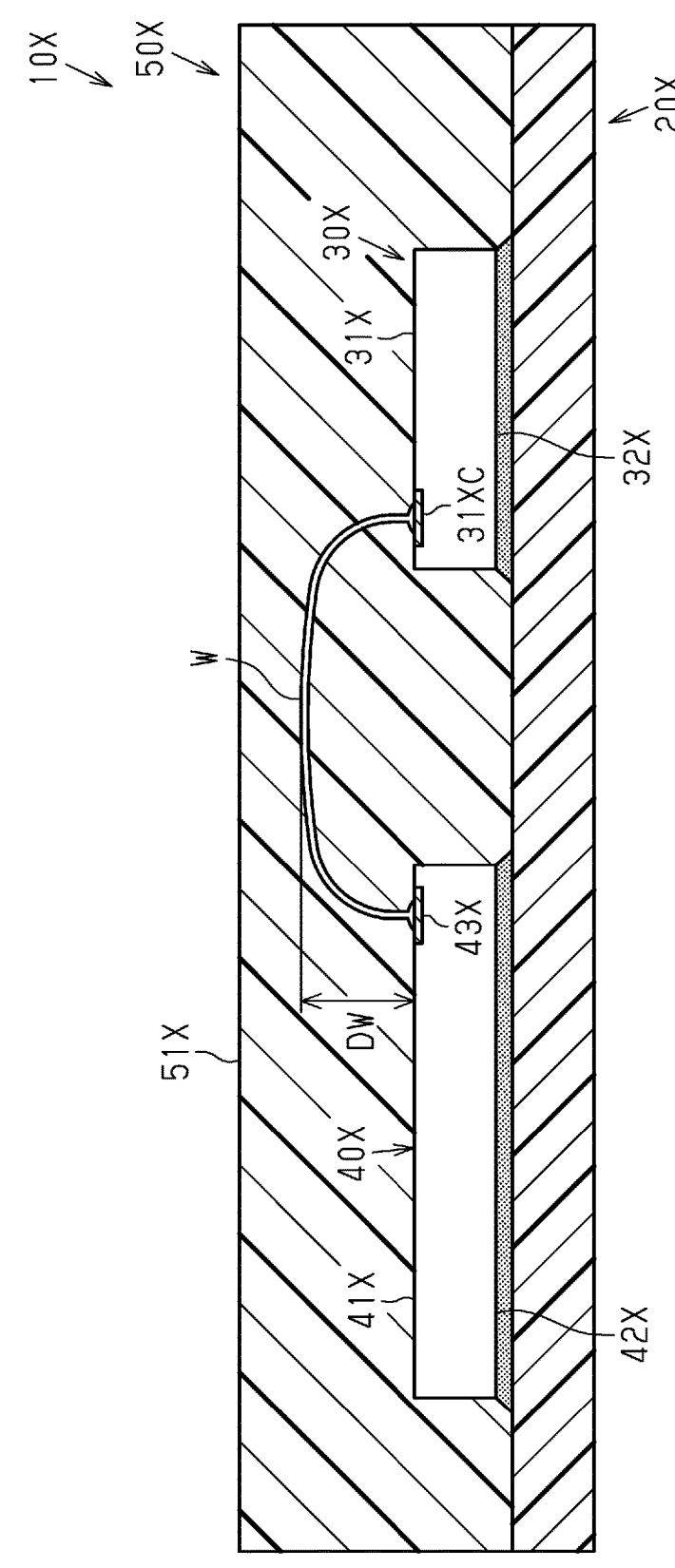
FIG. 22 is a cross-sectional view of a comparative example of a semiconductor device showing a cross-sectional structure.
Figure 22:
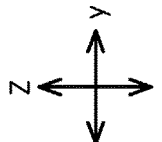

FIG. 22 is a cross-sectional view of a comparative example of a semiconductor device 10X showing a schematic cross-sectional structure of the semiconductor device 10X.

As shown in FIG. 22, the semiconductor device 10X includes a substrate 20X, a switching element 30X and a driver 40X that are mounted on the substrate 20X, and an encapsulation resin 50X encapsulating the switching element 30X and the driver 40X. As shown in FIG. 22, the switching element 30X and the driver 40X are coplanar with each other.

The switching element 30X and the driver 40X are aligned with each other in the z-direction and spaced apart from each other in the y-direction. The switching element 30X includes an element main surface 31X and an element back surface 32X that face in opposite directions in the z-direction. The switching element 30X is disposed on the substrate 20X so that the element back surface 32X faces the substrate 20X. A control pad electrode 31XC is formed on the element main surface 31X and is electrically connected to the driver 40X. The driver 40X includes a driver main surface 41X and a driver back surface 42X that face in opposite directions in the z-direction. The driver 40X is disposed on the substrate 20X so that the driver back surface 42X faces the substrate 20X. A driver pad electrode 43X is formed on the driver main surface 41X and is electrically connected to the control pad electrode 31XC.

The driver pad electrode 43X and the control pad electrode 31XC are connected by a wire W. The wire W is, for example, a bonding wire formed with a wire bonder. The wire bonder bonds a wire base material to the control pad electrode 31XC. The wire bonder moves the wire base material so that the wire base material extends in a direction away from the control pad electrode 31XC in the z-direction and toward the driver pad electrode 43X. The wire bonder bonds the wire base material to the driver pad electrode 43X and then cuts the wire base material. This forms the wire W. Thus, as shown in FIG. 22, the wire W is curved toward the resin main surface 51X of the encapsulation resin 50X. As a result, a maximum value DW of the distance between the element main surface 31X and the wire W in the z-direction and a maximum value DW of the distance between the driver main surface 41X and the wire W in the z-direction are each greater than or equal to 1 mm. In FIG. 22, since the element main surface 31X and the driver main surface 41X are aligned with each other in the z-direction, the maximum value DW of the distance between the element main surface 31X and the wire W in the z-direction is equal to the maximum value DW of the distance between the driver main surface 41X and the wire W in the z-direction. In addition, since the wire W is formed as described above, the switching element 30X and the driver 40X need to be spaced apart in the y-direction to allow for formation of the curved wire W. Due to such restrictions, the wire W has a length of a few mm (for example, 3 mm or greater and 5 mm or less).

As the length of the wire W increases, parasitic inductance of the wire W increases. The parasitic inductance causes a surge in a gate voltage supplied to the control pad electrode 31XC of the switching element 30X. That is, increases in the length of the wire W may increase the surge in the gate voltage.

The surge is proportional to a change rate of the gate voltage. Hence, the surge is increased as the switching element 30X is activated and deactivated at a higher rate. Therefore, when the switching element 30X is a switching element that is not activated and deactivated at a high frequency such as an insulated gate bipolar transistor (IGBT) or a bipolar transistor, the surge will not be excessively increased in the gate voltage. This reduces the effect of the surge in the gate voltage on the activation and deactivation of the switching element 30X. In contrast, when the switching element 30X is a switching element that is activated and deactivated at a high frequency such as a GaN HEMT or a SiC MOSFET, the surge may be excessively increased in the gate voltage. This increases the effect of the surge in the gate voltage on the activation and deactivation of the switching element 30X. In an example, when a switching element that is activated and deactivated at a high frequency such as a GaN HEMT is used as the switching element 30X, activation and deactivation of the switching element 30X are greatly affected by inductance of a few nH caused by the wire W.

From the viewpoint for reducing the surge contained in the gate voltage, the inductance caused by the conductive path between the control pad electrode 31XC and the driver pad electrode 43X need to be decreased.

In this regard, in the present embodiment, as shown in FIG. 5, the first control pad electrode 31AC of the first switching element 30A and the driver pad electrodes 43 of the driver 40 are connected by the first control via conductor 81. The second control pad electrode 31BC of the second switching element 30B and the driver pad electrodes 43 of the driver 40 are connected by the second control via conductor 82. The height of the control via conductors 81 and 82 (the dimension of the control via conductors 81 and 82 in the z-direction) is approximately a few hundred μm. Thus, the length of the conductive path between the first control pad electrode 31AC and the driver pad electrodes 43 and the length of the conductive path between the second control pad electrode 31BC and the driver pad electrodes 43 are each less than the length of the wire W. This reduces inductance caused by the length of the conductive paths. In addition, each of the control via conductors 81 and 82 has a cross section cut along a plane (xy-plane) orthogonal to the z-direction that is greater in area than a cross section of the wire W cut along a plane orthogonal to a longitudinal direction of the wire W. Thus, each of the control via conductors 81 and 82 has a smaller inductance than the wire W. This decreases the surge contained in a gate voltage supplied to the first control pad electrode 31AC and the surge contained in a gate voltage supplied to the second control pad electrode 31BC.

In the present embodiment, when the switching elements 30A and 30B are connected to the driver 40 by the control via conductors 81 and 82, the inductance between the control pad electrodes 31AC and 31BC and the driver pad electrodes 43 is less than 1 nH. With this configuration, even when a switching element that is activated and deactivated at a high frequency such as a GaN HEMT is used as the switching elements 30A and 30B, the switching elements 30A and 30B will not be greatly affected by the inductance between the control pad electrodes 31AC and 31BC and the driver pad electrodes 43.

Advantages

The semiconductor device 10 of the present embodiment has the following advantages.

(1) The semiconductor device 10 includes the first switching element 30A, the second switching element 30B, the driver 40 configured to drive the switching elements 30A and 30B, the driver 40 and each of the switching elements 30A and 30B being disposed at different positions in the z-direction, the first resin layer 50A encapsulating at least the switching elements 30A and 30B, the first control via conductor 81, and the second control via conductor 82. The first control via conductor 81 and the second control via conductor 82 extend through the first resin layer 50A in the z-direction and electrically connect the switching elements 30A and 30B to the driver 40.

In this structure, each of the switching elements 30A and 30B and the driver 40 are disposed at different positions in the z-direction, that is, the height-wise direction of the semiconductor device 10. The control via conductors 81 and 82 extend through the first resin layer 50A in the z-direction. Thus, the switching elements 30A and 30B are electrically connected to the driver 40. With this structure, the conductive path between the driver 40 and the switching elements 30A and 30B is likely to be shortened as compared to the comparative example of the semiconductor device 10X shown in FIG. 22 in which the switching element 30X and the driver 40X are coplanar with each other and are connected by the wire W. More specifically, the dimension of the control via conductors 81 and 82 in the z-direction is smaller than the maximum value DW of the distance between the element main surface 31X and the wire W in the z-direction and the maximum value DW of the distance between the driver main surface 41X and the wire W in the z-direction. This shortens the conductive path between the driver 40 and the switching elements 30A and 30B. Accordingly, inductance caused by the length of the conductive path is reduced.

(2) The driver main surface 41 of the driver 40 and the element main surfaces 31A and 31B of the switching elements 30A and 30B face in the same direction. The driver back surface 42 of the driver 40 is located closer to the device main surface 11 than the element main surfaces 31A and 31B in the z-direction. The driver pad electrodes 43 are disposed on the driver back surface 42 of the driver 40. The first control pad electrode 31AC is disposed on the first element main surface 31A. The second control pad electrode 31BC is disposed on the second element main surface 31B.

With this structure, the switching elements 30A and 30B and the driver 40 are located closer to each other in a direction orthogonal to the z-direction. This shortens the conductive path between the first control pad electrode 31AC and one of the driver pad electrodes 43 and the conductive path between the second control pad electrode 31BC and another one of the driver pad electrodes 43. Accordingly, inductance caused by the length of the conductive paths is reduced.

(3) As viewed in the z-direction, the driver 40 is disposed to overlap with the switching elements 30A and 30B. This structure shortens the conductive path between the first control pad electrode 31AC of the first switching element 30A and one of the driver pad electrodes 43 of the driver 40 and the conductive path between the second control pad electrode 31BC of the second switching element 30B and another one of the driver pad electrodes 43 of the driver 40. Accordingly, inductance caused by the length of the conductive paths is reduced.

(4) As viewed in the z-direction, the first control pad electrode 31AC of the first switching element 30A is opposed to one of the driver pad electrodes 43 of the driver 40. The first control pad electrode 31AC and the driver pad electrode 43 are connected by the first control via conductor 81.

This structure further shortens the conductive path between the first control pad electrode 31AC and the driver pad electrode 43, thereby further reducing inductance caused by the conductive path.

As viewed in the z-direction, the second control pad electrode 31BC of the second switching element 30B is opposed to another one of the driver pad electrodes 43 of the driver 40, and the second control pad electrode 31BC and the driver pad electrode 43 are connected by the second control via conductor 82.

This structure further shortens the conductive path between the second control pad electrode 31BC and the driver pad electrode 43, thereby further reducing inductance caused by the conductive path.

(5) The encapsulation resin 50 includes the first resin layer 50A encapsulating the switching elements 30A and 30B and the second resin layer 50B formed on the first resin layer 50A and encapsulating the driver 40. With this structure, even though the driver 40 and the switching elements 30A and 30B are disposed at different positions in the z-direction, all of the switching elements 30A and 30B and the driver 40 are protected by the encapsulation resin 50.

The second resin layer 50B encapsulates the power supply connection wire 83c of the power supply connection conductor 83, the ground connection wire 84c of the ground connection conductor 84, the control connection wires 86a of the control connection conductors 86, and the drive connection wire 87c of the element connection conductor 87. Thus, the wires 83c, 84c, 86a, and 87c are protected by the second resin layer 50B.

(6) The first control via conductor 81 is disposed to join the interface 57 between the first resin layer 50A and the second resin layer 50B to the first control pad electrode 31AC of the first switching element 30A. The second control via conductor 82 is disposed to join the interface 57 between the first resin layer 50A and the second resin layer 50B to the second control pad electrode 31BC of the second switching element 30B. With this structure, in the method for manufacturing the semiconductor device 10, the thickness of the first resin layer 850A corresponding to the first resin layer 50A is decreased so that the thickness of the portion of the first resin layer 850A that covers the element main surfaces 31A and 31B of the switching elements 30A and 30B is decreased. The control via conductors 81 and 82 extend through the thickness-reduced portion of the first resin layer 850A. This decreases the dimension of the control via conductors 81 and 82 in the z-direction.

(7) The dimension of the control via conductors 81 and 82 in the z-direction is smaller than the distance D between the driver 40 and the second resin layer 50B in the z-direction. More specifically, the portion of the first resin layer 50A covering the switching elements 30A and 30B is less in thickness than the portion of the second resin layer 50B covering the driver 40. The control via conductors 81 and 82 extend through the portions of the first resin layer 50A covering the switching elements 30A and 30B in the z-direction. This structure decreases the dimension of the control via conductors 81 and 82 in the z-direction, thereby shortening the conductive path between the first control pad electrode 31AC of the first switching element 30A and one of the driver pad electrodes 43 of the driver 40 and the conductive path between the second control pad electrode 31BC of the second switching element 30B and another one of the driver pad electrodes 43 of the driver 40. Accordingly, inductance caused by the length of the conductive paths is reduced.

(8) The first drive pad electrode 31AA of the first switching element 30A and the power supply wire 61 are connected by the power supply connection conductor 83. The power supply connection conductor 83 includes the first power supply via conductors 83a connected to the first drive pad electrode 31AA, the second power supply via conductors 83b connected to the power supply wire 61, and the power supply connection wire 83c connecting the first power supply via conductors 83a to the second power supply via conductors 83b. This structure shortens the conductive path between the first drive pad electrode 31AA of the first switching element 30A and the power supply wire 61 as compared to a structure that uses a wire to connect the first drive pad electrode 31AA of the first switching element 30A to the power supply wire 61. Accordingly, inductance caused by the length of the conductive path is reduced.

As viewed in the z-direction, the first power supply via conductors 83a are disposed to overlap the first drive pad electrode 31AA of the first switching element 30A. The power supply connection wire 83c is disposed on the first resin layer 50A. As viewed in the z-direction, the first power supply via conductors 83a and the power supply connection wire 83c overlap in contact with each other in the z-direction. As described above, the first power supply via conductors 83a are disposed in the portion of the first resin layer 50A covering the first element main surface 31A of the first switching element 30A, that is, the thin portion of the first resin layer 50A located close to the interface 57 between the first resin layer 50A and the second resin layer 50B. The first power supply via conductors 83a are directly connected to the power supply connection wire 83c. This shortens the conductive path between the first drive pad electrode 31AA of the first switching element 30A and the power supply connection wire 83c in the z-direction (the dimension of the first power supply via conductors 83a in the z-direction). Accordingly, inductance caused by the length of the conductive path is reduced.

(9) The second drive pad electrode 31BB of the second switching element 30B and the ground wire 62 are connected by the ground connection conductor 84. The ground connection conductor 84 includes the first ground via conductors 84a connected to the second drive pad electrode 31BB, the second ground via conductors 84b connected to the ground wire 62, and the ground connection wire 84c connecting the first ground via conductors 84a to the second ground via conductors 84b. With this structure, the conductive path between the second drive pad electrode 31BB of the second switching element 30B and the ground wire 62 is shortened as compared to a structure that uses a wire to connect the second drive pad electrode 31BB of the second switching element 30B to the ground wire 62. Accordingly, inductance caused by the length of the conductive path is reduced.

As viewed in the z-direction, the first ground via conductors 84a are disposed to overlap the second drive pad electrode 31BB of the second switching element 30B. The ground connection wire 84c is disposed on the first resin layer 50A. As viewed in the z-direction, the first ground via conductors 84a and the ground connection wire 84c overlap in contact with each other in the z-direction. As described above, the first ground via conductors 84a are disposed on the portion of the first resin layer 50A covering the second element main surface 31B of the second switching element 30B, that is, the thin portion of the first resin layer 50A located close to the interface 57 between the first resin layer 50A and the second resin layer 50B. The first ground via conductors 84a are directly connected to the ground connection wire 84c. This shortens the conductive path between the second drive pad electrode 31BB of the second switching element 30B and the ground connection wire 84c in the z-direction (the dimension of the first ground via conductors 84a in the z-direction). Accordingly, inductance caused by the length of the conductive path is reduced.

(10) The second drive pad electrode 31AB of the first switching element 30A and the first drive pad electrode 31BA of the second switching element 30B are connected by the element connection conductor 87. The element connection conductor 87 includes the first drive via conductors 87a connected to the second drive pad electrode 31AB of the first switching element 30A, the second drive via conductors 87b connected to the first drive pad electrode 31BA of the second switching element 30B, and the drive connection wire 87c connecting the first drive via conductors 87a to the second drive via conductors 87b. With this structure, the conductive path between the second drive pad electrode 31AB of the first switching element 30A and the first drive pad electrode 31BA of the second switching element 30B is shortened as compared to a structure that uses a wire to connect the second drive pad electrode 31AB of the first switching element 30A to the first drive pad electrode 31BA of the second switching element 30B. Accordingly, inductance caused by the length of the conductive path is reduced.

As viewed in the z-direction, the first drive via conductors 87a are disposed to overlap the second drive pad electrode 31AB of the first switching element 30A, the second drive via conductors 87b are disposed to overlap the first drive pad electrode 31BA of the second switching element 30B, and the drive connection wire 87c is disposed on the first resin layer 50A. As viewed in the z-direction, the drive via conductors 87a and 87b and the drive connection wire 87c overlap in contact with each other in the z-direction. As described above, the first drive via conductors 87a are disposed in the portion of the first resin layer 50A covering the first element main surface 31A of the first switching element 30A, that is, the thin portion of the first resin layer 50A located close to the interface 57 between the first resin layer 50A and the second resin layer 50B. The second drive via conductors 87b are disposed in the portion of the first resin layer 50A covering the second element main surface 31B of the second switching element 30B, that is, the thin portion of the first resin layer 50A located close to the interface 57 between the first resin layer 50A and the second resin layer 50B. The drive via conductors 87a and 87b are directly connected to the drive connection wire 87c. This shortens the conductive path between the second drive pad electrode 31AB of the first switching element 30A and the drive connection wire 87c in the z-direction (the dimension of the first drive via conductors 87a in the z-direction) and the conductive path between the first drive pad electrode 31BA of the second switching element 30B and the drive connection wire 87c in the z-direction (the dimension of the second drive via conductors 87b in the z-direction). Accordingly, inductance caused by the length of the conductive path is reduced.

(11) The power supply connection conductor 83 includes a plurality of first power supply via conductors 83a and a plurality of second power supply via conductors 83b. This structure reduces inductance of the conductive path between the power supply connection wire 83c and the first drive pad electrode 31AA of the first switching element 30A and inductance of the conductive path between the power supply connection wire 83c and the power supply wire 61.

(12) The ground connection conductor 84 includes a plurality of first ground via conductors 84a and a plurality of second ground via conductors 84b. This structure reduces inductance of the conductive path between the ground connection wire 84c and the second drive pad electrode 31BB of the second switching element 30B and inductance of the conductive path between the ground connection wire 84c and the ground wire 62.

(13) The element connection conductor 87 includes a plurality of first drive via conductors 87a and a plurality of second drive via conductors 87b. This structure reduces inductance of the conductive path between the drive connection wire 87c and the second drive pad electrode 31AB of the first switching element 30A and inductance of the conductive path between the drive connection wire 87c and the first drive pad electrode 31BA of the second switching element 30B.

(14) The second drive pad electrode 31AB of the first switching element 30A, the first drive pad electrode 31BA of the second switching element 30B, and the output wire 63 are connected by the output connection conductor 85. The output connection conductor 85 includes the element connection conductor 87 and the output via conductors 85a connecting the element connection conductor 87 to the output wire 63. With this structure, the conductive path between the second drive pad electrode 31AB of the first switching element 30A and the output wire 63 and the conductive path between the first drive pad electrode 31BA of the second switching element 30B and the output wire 63 are shortened as compared to a structure that uses one wire to connect the second drive pad electrode 31AB of the first switching element 30A to the output wire 63 and another wire to connect the first drive pad electrode 31BA of the second switching element 30B to the output wire 63. Accordingly, inductance caused by the length of the conductive paths is reduced.

(15) The output connection conductor 85 includes a plurality of output via conductors 85a. This structure reduces inductance of the conductive path between the drive connection wire 87c of the element connection conductor 87 and the output wire 63.

(16) Each driver pad electrode 43 of the driver 40 is connected to the control wire 64 by the control connection conductor 86. With this structure, the conductive path between the driver pad electrode 43 and the control wire 64 is shortened as compared to a structure that uses a wire to connect the driver pad electrode 43 to the control wire 64. Accordingly, inductance caused by the length of the conductive path is reduced.

(17) The output wire 63 is disposed between the first switching element 30A and the second switching element 30B in the x-direction. This structure shortens the conductive path between the second drive pad electrode 31AB of the first switching element 30A and the output wire 63 and the conductive path between the first drive pad electrode 31BA of the second switching element 30B and the output wire 63. Accordingly, inductance caused by the length of the conductive paths is reduced.

(18) The power supply connection wire 83c of the power supply connection conductor 83, the ground connection wire 84c of the ground connection conductor 84, the control connection wires 86a of the control connection conductors 86, and the drive connection wire 87c of the element connection conductor 87 are disposed on the first resin layer 50A. This structure allows the wires 83c, 84c, 86a, and 87c to be formed in the same step. Thus, the manufacturing step of the semiconductor device 10 is simplified.

(19) The method for manufacturing the semiconductor device 10 includes a step for forming the first resin layer 850A that encapsulates the switching elements 30A and 30B, a step for forming the through holes 58a and 58b in the first resin layer 850A so that the switching elements 30A and 30B are exposed, a step of embedding the first control via conductor 81 in the through hole 58a and the second control via conductor 82 in the through hole 58b, and a step for mounting the driver 40, which drives the switching elements 30A and 30B, on the first resin layer 850A so that the driver 40 is electrically connected to the control via conductors 81 and 82.

With this structure, the dimension of the control via conductors 81 and 82 in the z-direction is smaller than the maximum value DW of the distance between the element main surface 31X of the switching element 30X and the wire W in the z-direction and the maximum value DW of the distance between the driver main surface 41X of the driver 40X and the wire W in the z-direction, which are shown in FIG. 22. Thus, the conductive path between the driver 40 and the switching elements 30A and 30B is shortened as compared to when the switching element 30X and the driver 40X are connected by the wire W. Accordingly, inductance caused by the length of the conductive path is reduced.

(20) The method for manufacturing the semiconductor device 10 includes the grinding step that removes the first resin layer 850A in the z-direction. With this structure, the distance of the first resin layer 850A between the element main surfaces 31A and 31B of the switching elements 30A and 30B and the surface of the first resin layer 850A located at the opposite side from the base member 820 in the z-direction is shorter than the distance of the second resin layer 850B, which is not subjected to the grinding, between the driver main surface 41 of the driver 40 and the surface of the second resin layer 850B located at the opposite side from the first resin layer 850A in the z-direction. That is, the portion of the first resin layer 850A covering the switching elements 30A and 30B has a smaller thickness than the portion of the second resin layer 850B covering the driver 40. The control via conductors 81 and 82 extend in the z-direction through the portion of the first resin layer 850A covering the switching elements 30A and 30B. This shortens the distance between the driver back surface 42 of the driver 40 and the element main surfaces 31A and 31B of the switching elements 30A and 30B in the z-direction. Accordingly, the conductive path between the first control pad electrode 31AC, which is disposed on the first element main surface 31A, and one of the driver pad electrodes 43 disposed on the driver back surface 42 is shortened. Also, the conductive path between the second control pad electrode 31BC, which is disposed on the second element main surface 31B, and another one of the driver pad electrodes 43 disposed on the driver back surface 42 is shortened. Thus, inductance caused by the length of the conductive paths is reduced.

(21) In the method for manufacturing the semiconductor device 10, in the driver mounting step for mounting the driver 40 on the first resin layer 850A, the driver 40 is flip-chip-mounted on the first resin layer 850A. With this structure, the driver pad electrodes 43 are easily bonded to the control via conductors 81 and 82 (the connection conductors 88a and 88b) and the control wires 64 as compared to when the driver pad electrodes 43 of the driver 40 are connected to the control via conductors 81 and 82 (the connection conductors 88a and 88b) and the control wires 64 by, for example, wires.

Modified Examples

The above embodiment exemplifies, without any intention to limit, an applicable form of a semiconductor device according to the present disclosure. The semiconductor device according to the present disclosure may be applicable to forms differing from the above embodiment. In an example of such a form, the structure of the embodiment is partially replaced, changed, or omitted, or a further structure is added to the above embodiment. The modified examples described below may be combined with one another as long as there is no technical inconsistency. In the modified examples, the same reference characters are given to those components that are the same as the corresponding components of the above embodiment. Such components will not be described in detail.

Figure 23:
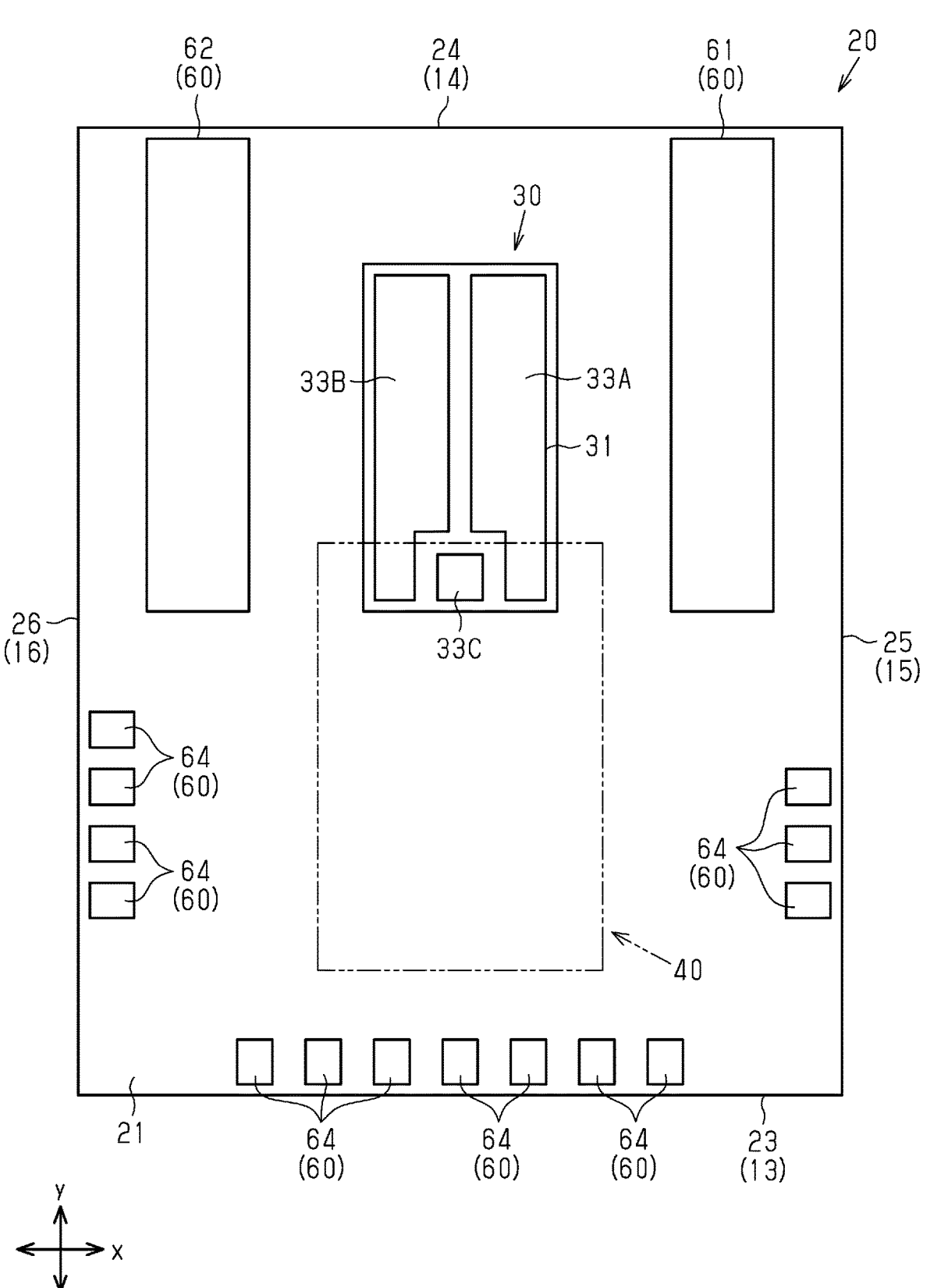
FIG. 23 is a plan view of a substrate on which a switching element of a semiconductor device is mounted in a modified example.

In the above embodiment, the semiconductor device 10 includes two switching elements 30, namely, the first switching element 30A and the second switching element 30B. Alternatively, for example, as shown in FIG. 23, the semiconductor device 10 may include one switching element 30.

The switching element 30 is disposed on the substrate main surface 21 of the substrate 20 in the center in the x-direction at a position closer to the substrate side surface 24 than to the substrate side surface 23 in the y-direction. The power supply wire 61 and the ground wire 62 of the conductive portions 60 are disposed on the substrate 20 at opposite sides of the switching element 30 in the x-direction. The power supply wire 61 is located closer to the substrate side surface 25 than the switching element 30 in the x-direction. The ground wire 62 is located closer to the substrate side surface 26 than the switching element 30 in the x-direction. The power supply wire 61 and the ground wire 62 are strip-shaped and extend in the y-direction in the same manner as the embodiment.

The switching element 30 includes, for example, a GaN HEMT in the same manner as the embodiment. As viewed in the z-direction, the switching element 30 is rectangular and has a long-side direction and a short-side direction. In the illustrated example, the switching element 30 is disposed on the substrate main surface 21 so that the long sides extend in the y-direction and the short sides extend in the x-direction. The switching element 30 includes an element main surface 31 on which a first drive pad electrode 33A, a second drive pad electrode 33B, and a control pad electrode 33C are formed. The first drive pad electrode 33A forms a drain electrode. The second drive pad electrode 33B forms a source electrode. The control pad electrode 33C forms a gate electrode. The first drive pad electrode 33A and the second drive pad electrode 33B are aligned with each other in the y-direction (the long-side direction of the switching element 30) and are spaced apart from each other in the x-direction (the short-side direction of the switching element 30). The first drive pad electrode 33A is located on the element main surface 31 closer to the power supply wire 61 than the second drive pad electrode 33B. In other words, the second drive pad electrode 33B is located on the element main surface 31 closer to the ground wire 62 than the first drive pad electrode 33A. The control pad electrode 33C is surrounded by the switching element 30 from both sides in the short-side direction and one side in the long-side direction. The control pad electrode 33C is disposed on an end of the switching element 30 located at the other side in the long-side direction. In the illustrated example, the control pad electrode 33C is disposed on an end of the element main surface 31 located close to the substrate side surface 23.

In the same manner as the embodiment, the driver 40 and the switching element 30 are located at different positions in the z-direction. The driver 40 is disposed on the first resin layer 50A (for example, refer to FIG. 5). Thus, the driver 40 is located closer to the device main surface 11 than the element main surface 31 of the switching element 30.

Figure 24:
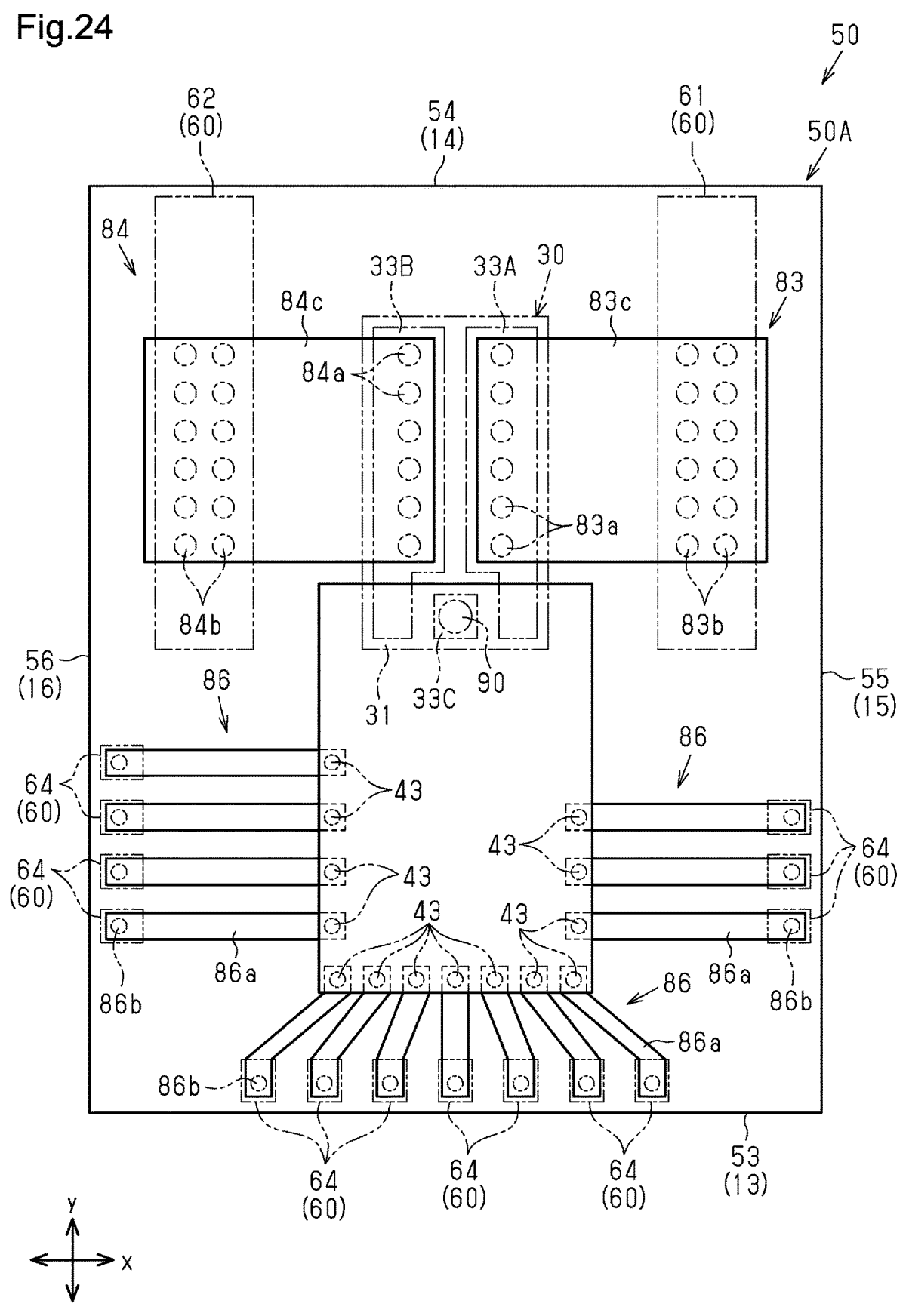

As shown in FIGS. 23 and 24, the driver 40 is disposed toward the substrate side surface 23 with respect to the switching element 30 in the y-direction. As viewed in the z-direction, the driver 40 overlaps one of the opposite ends of the switching element 30 in the y-direction located closer to the substrate side surface 23. As shown in FIG. 24, the driver 40 is disposed so that a driver pad electrode 43 is opposed to the control pad electrode 33C of the switching element 30 in the z-direction.

The driver pad electrode 43 is electrically connected to the control pad electrode 33C by a control via conductor 90. The control via conductor 90 and the control via conductors 81 and 82 are formed from the same material and have the same size. The control via conductor 90 extends through the portion of the first resin layer 50A at which the element main surface 31 of the switching element 30 is located. More specifically, the control via conductor 90 extends in the z-direction and joins the element main surface 31 to the interface 57 between the first resin layer 50A and the second resin layer 50B (refer to FIG. 5).

The first drive pad electrode 33A of the switching element 30 and the power supply wire 61 are connected by the power supply connection conductor 83. The connection structure is the same as that in the embodiment. The first power supply via conductors 83a of the power supply connection conductor 83 extend in the z-direction and are in contact with the first drive pad electrode 33A and the power supply connection wire 83c of the power supply connection conductor 83. The second power supply via conductors 83b of the power supply connection conductor 83 extend in the z-direction and are in contact with the power supply wire 61 and the power supply connection wire 83c.

The second drive pad electrode 33B of the switching element 30 and the ground wire 62 are connected by the ground connection conductor 84. The connection structure is the same as that in the embodiment. The first ground via conductors 84a of the ground connection conductor 84 extend in the z-direction and are in contact with the second drive pad electrode 33B and the ground connection wire 84c of the ground connection conductor 84. The second ground via conductors 84b of the ground connection conductor 84 extend in the z-direction and are in contact with the ground wire 62 and the ground connection wire 84c.

As viewed in the z-direction, control wires 64 are disposed on the substrate 20 at a position closer to the substrate side surface 23 with respect to the center in the y-direction. The control wires 64 of the modified example and the control wires 64 of the above embodiment are the same in material, size, number, and arrangement position.

The remaining driver pad electrodes 43 of the driver 40 are connected to the control wires 64 by the control connection conductors 86. The connection structure is the same as that in the embodiment. The control connection wires 86a of the control connection conductors 86 are connected to the driver pad electrodes 43 of the driver 40 by a conductive bonding material. The connection via conductors 86b of the control connection conductors 86 extend in the z-direction and are in contact with the control wires 64 and the control connection wires 86a.

The method for manufacturing the semiconductor device 10 of the modified example shown in FIGS. 23 and 24 is generally the same as that of the embodiment. More specifically, the method for manufacturing the semiconductor device 10 of the modified example mainly includes a wiring layer forming step, a switching element mounting step, a first resin layer forming step, a connection conductor forming step, a driver mounting step, a second resin layer forming step, an external terminal forming step, and a cutting step.

In the wiring layer forming step, the power supply wire 61 and the ground wire 62 are formed as the conductive portions 60, and the output wire 63 is not formed. The base member 820 is formed and ground in the same manner as the embodiment.

The switching element mounting step differs in that the switching element 30 is mounted on the base member 820 instead of the switching elements 30A and 30B. The switching element 30 is mounted in the same manner as the embodiment. The first resin layer forming step is the same as that of the embodiment.

The connection conductor forming step differs from that of the embodiment in that the control via conductor 90 is formed instead of the control via conductors 81 and 82 and that the output connection conductor 85 is not formed. The power supply connection conductor 83 and the ground connection conductor 84 are formed in the same manner as the embodiment. The driver mounting step and the second resin layer forming step are the same as those of the embodiment.

The external terminal forming step differs from that of the embodiment in that the output terminal 73 is not formed. The power supply terminal 71, the ground terminal 72, and the control terminals 74 are formed in the same manner as the embodiment. The cutting step is the same as the embodiment.

The semiconductor device 10 of the modified example shown in FIGS. 23 and 24 obtains advantages corresponding to the advantages (1) to (9), (11), (12), (16), and (19) to (21) of the embodiment.

In the above embodiment, the semiconductor device 10 includes two switching elements 30, namely, the first switching element 30A and the second switching element 30B, and one driver 40. Alternatively, for example, as shown in FIG. 25, the semiconductor device 10 may include four switching elements, namely, a first switching element 30A, a second switching element 30B, a third switching element 30C, and a fourth switching element 30D, and two drivers, namely, a first driver 40A and a second driver 40B.

The third switching element 30C and the first switching element 30A are the same in structure and size. The fourth switching element 30D and the second switching element 30B are the same in structure and size. The third switching element 30C includes a third element main surface 31C and a third element back surface (not shown) facing in opposite directions in the z-direction. A first drive pad electrode 31CA, a second drive pad electrode 31CB, and a third control pad electrode 31CC are formed on the third element main surface 31C. The fourth switching element 30D includes a fourth element main surface 31D and a fourth element back surface (not shown) facing in opposite directions in the z-direction. The first drive pad electrode 31DA, the second drive pad electrode 31DB, and the fourth control pad electrode 31DC are formed on the fourth element main surface 31D.

The first driver 40A drives the first switching element 30A and the second switching element 30B. The second driver 40B drives the third switching element 30C and the fourth switching element 30D. The first driver 40A and the second driver 40B have the same structure as the driver 40 of the embodiment.

Figure 25:
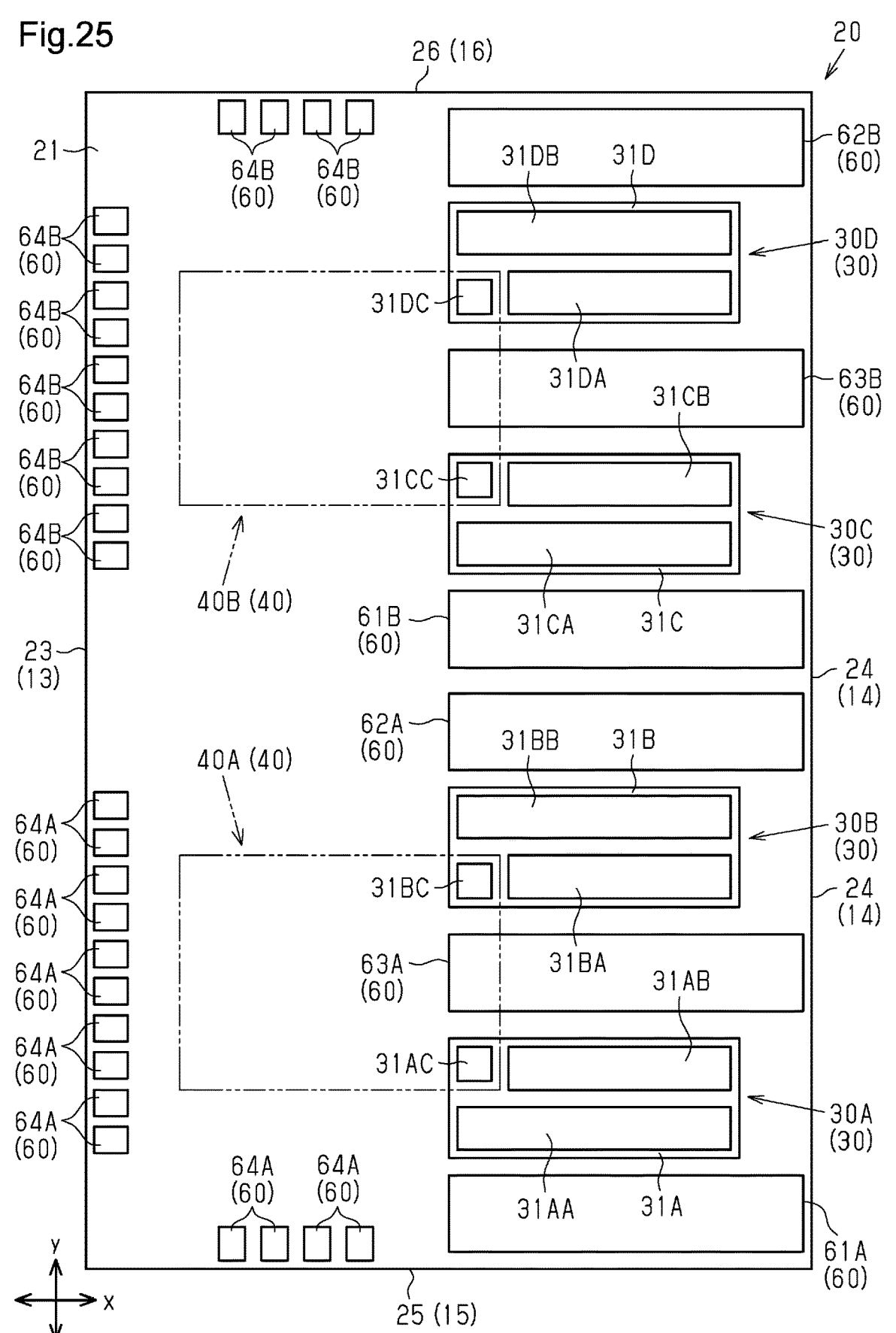
FIG. 25 is a plan view of a substrate on which switching elements of a semiconductor device are mounted in a modified example.

As shown in FIG. 25, as viewed in the z-direction, the semiconductor device 10 is rectangular such that the long sides extend in the x-direction and the short sides extend in the y-direction. Thus, as viewed in the z-direction, the substrate 20 and the encapsulation resin 50 are each rectangular so that the long sides extend in the x-direction and the short sides extend in the y-direction.

The substrate 20 includes a first power supply wire 61A, a first ground wire 62A, and a first output wire 63A that are electrically connected to the switching elements 30A and 30B; a second power supply wire 61B, a second ground wire 62B, and a second output wire 63B that are electrically connected to the switching elements 30C and 30D; first control wires 64A that are electrically connected to the first driver 40A; and second control wires 64B that are electrically connected to the second driver 40B.

The arrangement relationship of the switching elements 30A to 30D and the drivers 40A and 40B will now be described.

In the same manner as the embodiment, the switching elements 30A to 30D are mounted on the substrate main surface 21 of the substrate 20. The switching elements 30A to 30D are aligned with each other in the y-direction and spaced apart from each other in the x-direction. The switching elements 30A to 30D are located toward the substrate side surface 24 in the y-direction. In the x-direction, the first switching element 30A and the second switching element 30B are located closer to the substrate side surface 25 than the third switching element 30C and the fourth switching element 30D. In the x-direction, the first switching element 30A is located closer to the substrate side surface 25 than the second switching element 30B. In the x-direction, the third switching element 30C is located closer to the substrate side surface 25 than the fourth switching element 30D.

In the same manner as the driver 40 of the embodiment, the first driver 40A and the switching elements 30A and 30B are located at different positions in the z-direction. The first driver 40A is located closer to the device main surface 11 (refer to FIG. 5) than the element main surfaces 31A and 31B of the switching elements 30A and 30B. The first driver 40A is disposed on the first resin layer 50A.

In the same manner as the driver 40 of the embodiment, the second driver 40B and the switching elements 30C and 30D are located at different positions in the z-direction. The second driver 40B is located closer to the device main surface 11 than the element main surfaces 31C and 31D of the switching elements 30C and 30D. The second driver 40B is disposed on the first resin layer 50A. The second driver 40B and the first driver 40A are aligned in the z-direction.

Figure 26:
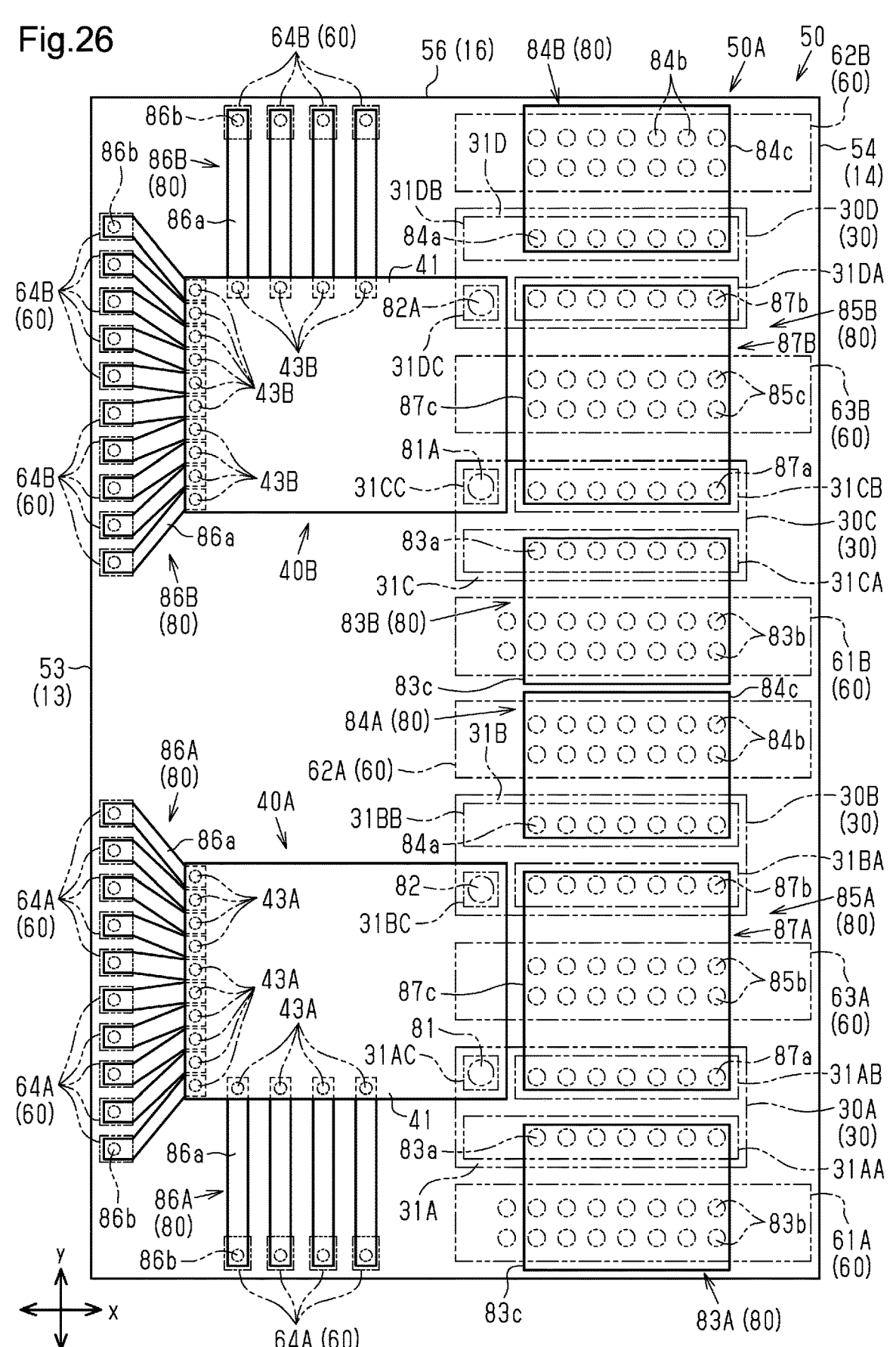
FIG. 26 is a plan view of a resin layer on which a driver of the semiconductor device shown in FIG. 25 is mounted.

As shown in FIGS. 25 and 26, as viewed in the z-direction, the first driver 40A and the second driver 40B are aligned with each other in the y-direction and spaced apart from each other in the x-direction.

As shown in FIG. 26, as viewed in the z-direction, the first driver 40A overlaps a portion of each of the switching elements 30A and 30B and is located at a position differing from the switching elements 30A and 30B in the y-direction. More specifically, in the same manner as the embodiment, the first driver 40A is disposed in relation to the switching elements 30A and 30B so that one driver pad electrode 43A is opposed to the first control pad electrode 31AC of the first switching element 30A in the z-direction and another driver pad electrode 43A is opposed to the second control pad electrode 31BC of the second switching element 30B in the z-direction. As viewed in the z-direction, the first driver 40A projects from the switching elements 30A and 30B toward the substrate side surface 23.

As viewed in the z-direction, the second driver 40B overlaps a portion of each of the switching elements 30C and 30D and is located at a position differing from the switching elements 30C and 30D in the y-direction. More specifically, in the same manner as the embodiment, the second driver 40B is disposed in relation to the switching elements 30C and 30D so that one driver pad electrode 43B is opposed to the third control pad electrode 31CC of the third switching element 30C in the z-direction and another driver pad electrode 43B is opposed to the fourth control pad electrode 31DC of the fourth switching element 30D in the z-direction. As viewed in the z-direction, the second driver 40B projects from the switching elements 30C and 30D toward the substrate side surface 23.

The electrical connection relationship of the semiconductor device 10 will now be described.

As shown in FIG. 26, the first switching element 30A and the second switching element 30B are electrically connected to the first driver 40A. More specifically, the first control pad electrode 31AC of the first switching element 30A is electrically connected to one of the driver pad electrodes 43A of the first driver 40A. The second control pad electrode 31BC of the second switching element 30B is electrically connected to another one of the driver pad electrodes 43A of the first driver 40A. The arrangement relationship and the connection structure of the first switching element 30A and the second switching element 30B with the first driver 40A are the same as the arrangement relationship and the connection structure of the switching elements 30A and 30B with the driver 40 of the embodiment. That is, the first control pad electrode 31AC and one of the driver pad electrodes 43A are electrically connected by the first control via conductor 81. The second control pad electrode 31BC and another one of the driver pad electrodes 43A are electrically connected by the second control via conductor 82.

The third switching element 30C and the fourth switching element 30D are electrically connected to the second driver 40B. More specifically, the third control pad electrode 31CC of the third switching element 30C is electrically connected to one of the driver pad electrodes 43B of the second driver 40B. The fourth control pad electrode 31DC of the fourth switching element 30D is electrically connected to another one of the driver pad electrodes 43B of the second driver 40B. The arrangement relationship and the connection structure of the third switching element 30C and the fourth switching element 30D with the second driver 40B are the same as the arrangement relationship and the connection structure of the switching elements 30A and 30B with the driver 40. That is, the third control pad electrode 31CC and one of the driver pad electrodes 43B are electrically connected by a third control via conductor 81A. The fourth control pad electrode 31DC and another one of the driver pad electrodes 43B are electrically connected by a fourth control via conductor 82A.

The arrangement relationship and the connection structure of the switching elements 30A and 30B with the first power supply wire 61A, the first ground wire 62A, and the first output wire 63A are the same as the arrangement relationship and the connection structure of the switching elements 30A and 30B with the power supply wire 61, the ground wire 62, and the output wire 63 of the embodiment.

The first drive pad electrode 31AA of the first switching element 30A and the first power supply wire 61A are connected by a first power supply connection conductor 83A. The first power supply connection conductor 83A and the power supply connection conductor 83 of the embodiment have the same structure.

The second drive pad electrode 31BB of the second switching element 30B and the first ground wire 62A are connected by a first ground connection conductor 84A. The first ground connection conductor 84A and the ground connection conductor 84 of the embodiment have the same structure.

The second drive pad electrode 31AB of the first switching element 30A and the first drive pad electrode 31BA of the second switching element 30B are connected by a first element connection conductor 87A. The first element connection conductor 87A and the element connection conductor 87 of the embodiment have the same structure.

The second drive pad electrode 31AB of the first switching element 30A and the first drive pad electrode 31BA of the second switching element 30B are connected to the first output wire 63A by a first output connection conductor 85A. The first output connection conductor 85A includes the first element connection conductor 87A and first output via conductors 85b. The first output via conductors 85b and the output via conductors 85a of the embodiment have the same structure. The first output via conductors 85b extend in the z-direction and are in contact with the first output wire 63A and the first element connection conductor 87A.

The arrangement relationship and the connection structure of the switching elements 30C and 30D with the second power supply wire 61B, the second ground wire 62B, and the second output wire 63B are the same as the arrangement relationship and the connection structure of the switching elements 30A and 30B with the power supply wire 61, the ground wire 62, and the output wire 63 of the embodiment.

The first drive pad electrode 31CA of the third switching element 30C and the second power supply wire 61B are connected by a second power supply connection conductor 83B. The second power supply connection conductor 83B and the power supply connection conductor 83 of the embodiment have the same structure.

The second drive pad electrode 31DB of the fourth switching element 30D and the second ground wire 62B are connected by a second ground connection conductor 84B. The second ground connection conductor 84B and the ground connection conductor 84 of the embodiment have the same structure.

The second drive pad electrode 31CB of the third switching element 30C and the first drive pad electrode 31DA of the fourth switching element 30D are connected by a second element connection conductor 87B. The second element connection conductor 87B and the element connection conductor 87 of the embodiment have the same structure.

The second drive pad electrode 31CB of the third switching element 30C and the first drive pad electrode 31DA of the fourth switching element 30D are connected to the second output wire 63B by a second output connection conductor 85B. The second output connection conductor 85B includes the second element connection conductor 87B and second output via conductors 85c. The second output via conductors 85c and the output via conductors 85a of the embodiment have the same structure. The second output via conductors 85c extend in the z-direction and are in contact with the second output wire 63B and the second element connection conductor 87B.

The substrate 20 includes control wires 64A that are electrically connected to the first driver 40A and control wires 64B that are electrically connected to the second driver 40B. The control wires 64A and 64B and the control wires 64 of the embodiment have the same structure.

Some of the first control wires 64A are disposed on a portion of the substrate 20 located closer to the substrate side surface 23 than the first driver 40A. Some of the first control wires 64A are disposed on a portion of the substrate 20 located closer to the substrate side surface 25 than the first driver 40A. Some of the second control wires 64B are disposed on a portion of the substrate 20 located closer to the substrate side surface 23 than the second driver 40B. Some of the second control wires 64B are disposed on a portion of the substrate 20 located closer to the substrate side surface 26 than the second driver 40B. The control wires 64A and 64B and the control wires 64 of the embodiment have the same structure.

The first driver 40A and the first control wires 64A are electrically connected by first control connection conductors 86A. The second driver 40B and the second control wires 64B are electrically connected by second control connection conductors 86B. The control connection conductors 86A and 86B and the control connection conductors 86 of the embodiment have the same structure.

The switching elements 30A and 30B are electrically connected to the first driver 40A. The switching elements 30C and 30D are electrically connected to the second driver 40B. The switching elements 30A and 30B and the first driver 40A are insulated from the switching elements 30C and 30D and the second driver 40B.

The method for manufacturing the semiconductor device 10 of the modified example shown in FIGS. 25 and 26 is generally the same as the method for manufacturing the semiconductor device 10 of the embodiment. More specifically, the method for manufacturing the semiconductor device 10 of the modified example mainly includes a wiring layer forming step, a switching element mounting step, a first resin layer forming step, a connection conductor forming step, a driver mounting step, a second resin layer forming step, an external terminal forming step, and a cutting step.

The wiring layer forming step differs from that of the embodiment in that the power supply wires 61A and 61B, the ground wires 62A and 62B, the output wires 63A and 63B, and the control wires 64A and 64B are formed as the conductive portions 60. The base member 820 is formed and ground in the same manner as the embodiment.

The switching element mounting step differs in that in addition to the switching elements 30A and 30B, the switching elements 30C and 30D are mounted on the base member 820. The switching elements 30C and 30D are mounted in the same manner as the embodiment. The first resin layer forming step is the same as that of the embodiment.

The connection conductor forming step differs from that of the embodiment in that the control via conductors 81A and 82A, the power supply connection conductors 83A and 83B, the ground connection conductors 84A and 84B, the output connection conductors 85A and 85B, and the control connection conductors 86A and 86B are formed. The connection conductors 83A, 83B, 84A, 84B, 85A, 85B, 86A, and 86B are formed in the same manner as the embodiment. The driver mounting step and the second resin layer forming step are the same as those of the embodiment.

The external terminal forming step differs from that of the embodiment in that terminals corresponding to the power supply wires 61A and 61B, the ground wires 62A and 62B, the output wires 63A and 63B, and the control wires 64A and 64B are formed as the external terminals 70. The terminals are formed in the same manner as the embodiment. The cutting step is the same as the embodiment.

The semiconductor device 10 of the modified example shown in FIGS. 25 and 26 obtains the advantages (1) to (21) of the embodiment.

In the semiconductor device 10 of the modified example shown in FIGS. 25 and 26, the first driver 40A and the second driver 40B differ in structure (e.g., arrangement of the driver pad electrodes 43A and 43B). Alternatively, for example, the first driver 40A and the second driver 40B may have the same structure. This allows identical drivers to be used as the first driver 40A and the second driver 40B and thus reducing the manufacturing costs of the semiconductor device 10.

The semiconductor device 10 of the modified example shown in FIGS. 25 and 26 may include a driver 40 that drives the switching elements 30A to 30D instead of the first driver 40A and the second driver 40B. That is, the semiconductor device 10 of the modified example may include a single driver 40.

Figure 27:
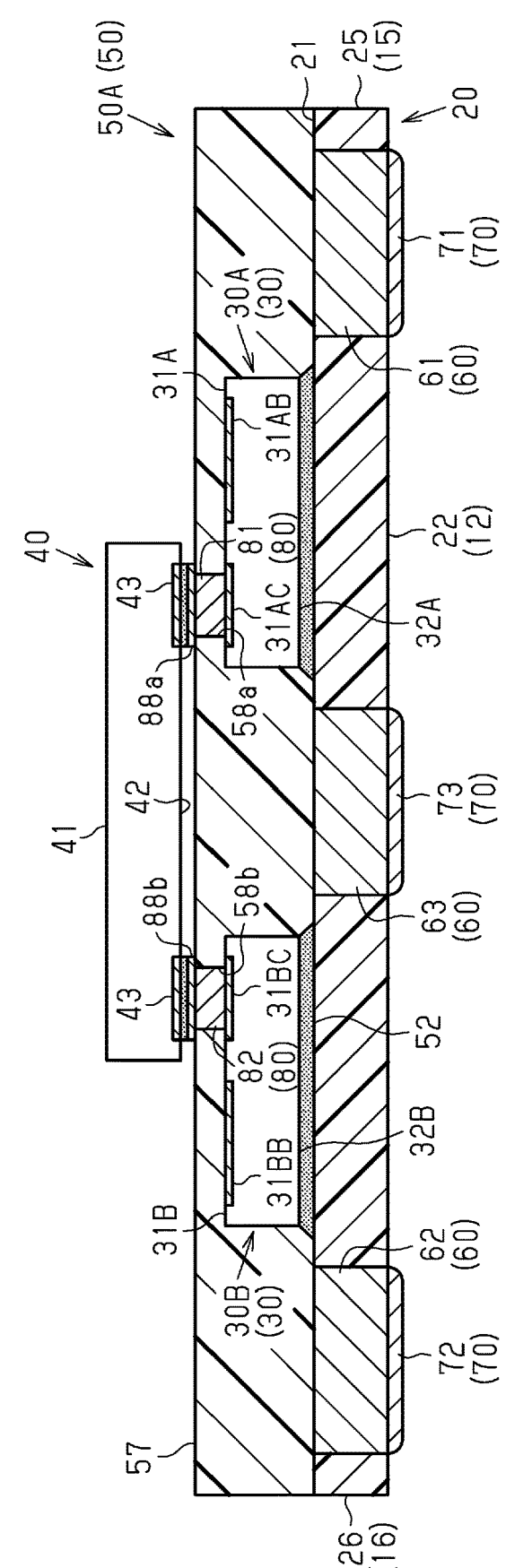
FIG. 27 is a cross-sectional view of a modified example of a semiconductor device showing a cross-sectional structure.
Figure 27:
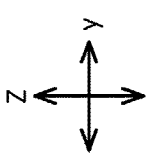

In the embodiment, the driver 40 is encapsulated by the encapsulation resin 50. Alternatively, the driver 40 may be disposed outside the encapsulation resin 50. In an example, as shown in FIG. 27, the second resin layer 50B may be omitted from the encapsulation resin 50. That is, the encapsulation resin 50 is formed of the first resin layer 50A. In this case, the first resin layer 50A corresponds to a resin layer. The driver 40 is disposed on the first resin layer 50A. This structure obtains the advantages (1) to (4) and (6) to (21) of the embodiment.

Figure 28:
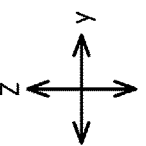
FIG. 28 is a cross-sectional view of a modified example of a semiconductor device showing a cross-sectional structure.

In the embodiment, the driver 40 is disposed in relation to the switching elements 30A and 30B so that the first control pad electrode 31AC of the first switching element 30A is opposed to one of the driver pad electrodes 43 of the driver 40 in the z-direction and the second control pad electrode 31BC of the second switching element 30B is opposed to another one of the driver pad electrodes 43 of the driver 40 in the z-direction. Alternatively, for example, as shown in FIG. 28, the driver 40 may be disposed in relation to the first switching element 30A so that the driver pad electrode 43 of the driver 40 is located closer to the device side surface 13 (the resin side surface 53) than the first control pad electrode 31AC of the first switching element 30A. In the illustrated example, as viewed in the z-direction, the driver 40 is disposed so as not to overlap the first switching element 30A.

The driver pad electrode 43 of the driver 40 and the first control pad electrode 31AC of the first switching element 30A are electrically connected by the first control via conductor 81 and a control connection wire 91. More specifically, the control connection wire 91 is formed on the first resin layer 50A. As viewed in the z-direction, the control connection wire 91 extends in the y-direction to overlap with both the first control via conductor 81 and the driver pad electrode 43. The control connection wire 91 is formed of, for example, a lamination of Ti and Cu. The first control via conductor 81 is in contact with the control connection wire 91. The control connection wire 91 is in contact with the driver pad electrode 43 by a conductive bonding material. Although not shown, the driver 40 and the second switching element 30B are located at different positions in the y-direction in the same manner as the first switching element 30A.

The arrangement relationship of the driver 40 with the first switching element 30A is not limited to that described above such that the driver 40 is disposed so as not to overlap the first switching element 30A as viewed in the z-direction. In an example, when the driver pad electrode 43 is not opposed to the first control pad electrode 31AC in the z-direction, the driver 40 may overlap the first switching element 30A as viewed in the z-direction.

In the embodiment, each of the switching elements 30A and 30B is a lateral transistor in which the first drive pad electrodes 31AA and 31BA, the second drive pad electrodes 31AB and 31BB, and the control pad electrodes 31AC and 31BC are formed on the element main surfaces 31A and 31B. However, the structure of a transistor is not limited to that of the embodiment. For example, each of the switching elements 30A and 30B may be a vertical transistor in which the first drive pad electrodes 31AA and 31BA are formed on the element back surfaces 32A and 32B and the second drive pad electrodes 31AB and 31BB and the control pad electrodes 31AC and 31BC are formed on the element main surfaces 31A and 31B.

Figure 29:
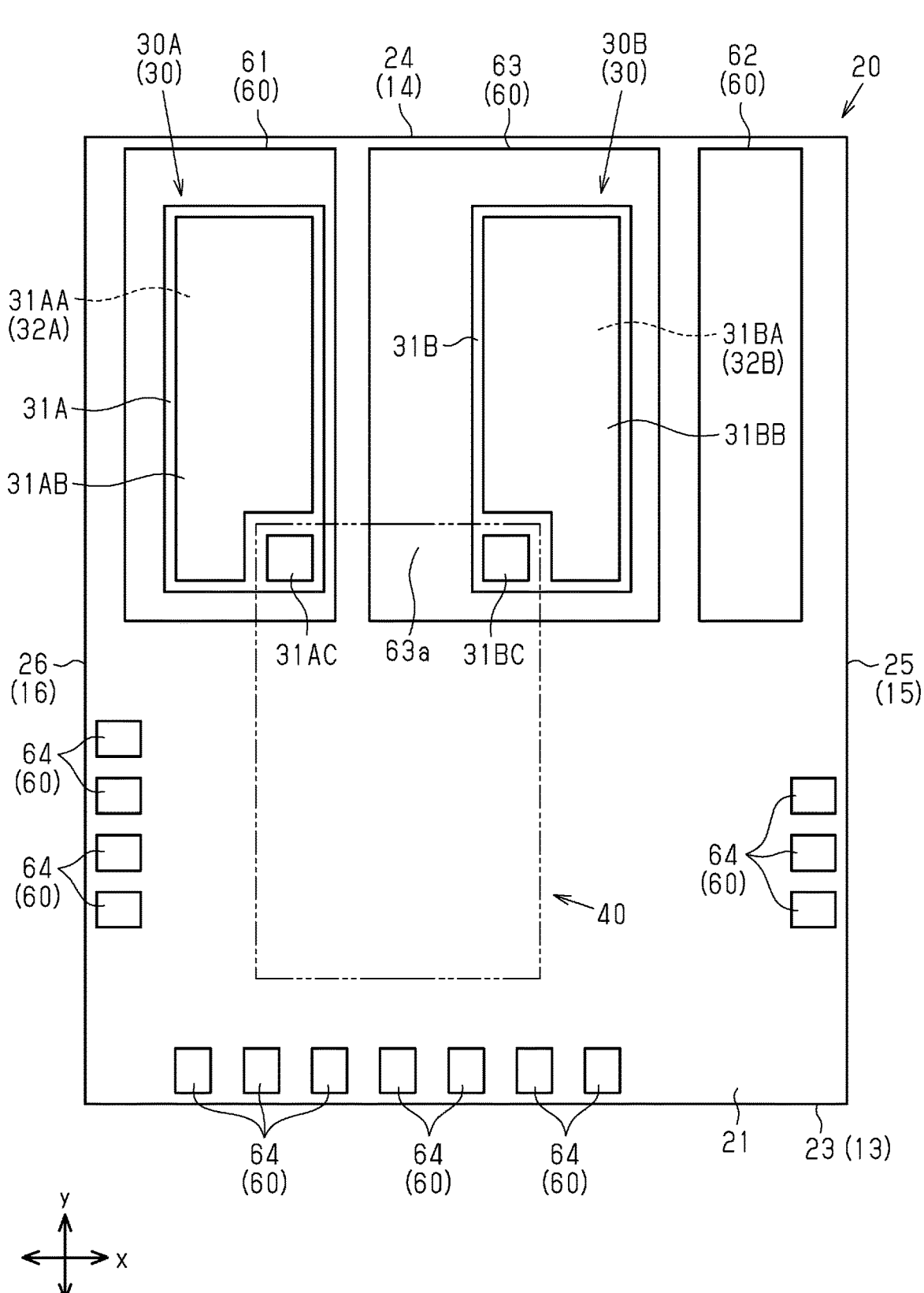
FIG. 29 is a plan view of a substrate on which switching elements of a semiconductor device are mounted in a modified example.
Figure 30:
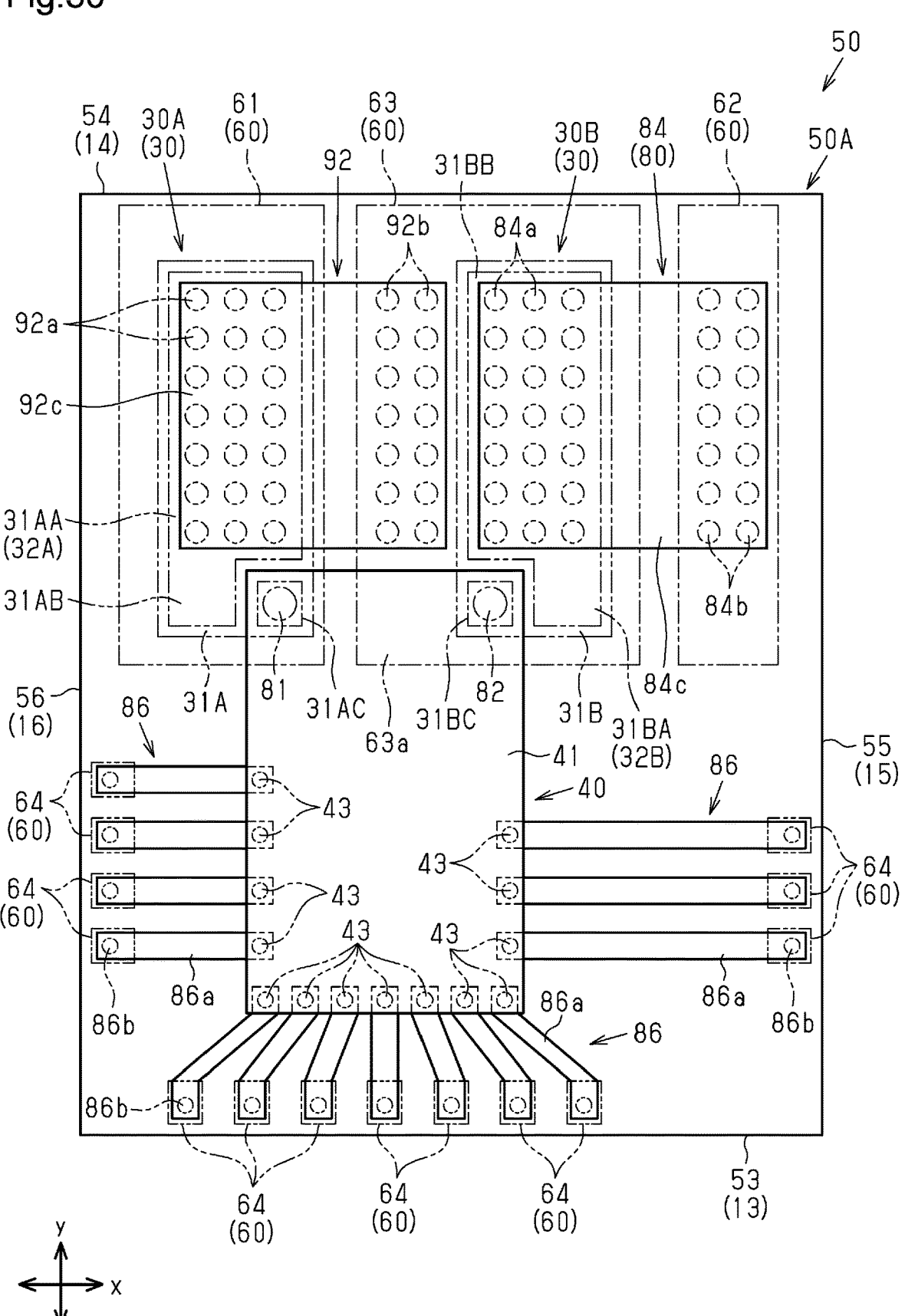
FIG. 30 is a plan view of a resin layer on which a driver of the semiconductor device shown in FIG. 29 is mounted.

FIGS. 29 and 30 show an example of the structure of the substrate 20 and the structure of the wiring portion 80 when each of the switching elements 30A and 30B is a vertical transistor.

As shown in FIG. 29, the substrate 20 includes the power supply wire 61, the ground wire 62, the output wire 63, and the control wires 64. In FIG. 29, in the x-direction, the power supply wire 61 is located closer to the substrate side surface 26 than the output wire 63, and the ground wire 62 is located closer to the substrate side surface 25 than the output wire 63. The power supply wire 61, the ground wire 62, and the output wire 63 may be disposed in the same manner as the power supply wire 61, the ground wire 62, and the output wire 63 of the embodiment.

As shown in FIG. 29, the first switching element 30A is mounted on the power supply wire 61, and the second switching element 30B is mounted on the output wire 63 disposed on the substrate 20. Hence, the power supply wire 61 shown in FIG. 29 is greater than the power supply wire 61 of the embodiment in dimension in the x-direction. The output wire 63 shown in FIG. 29 is greater than the output wire 63 of the embodiment in dimension in the x-direction. As shown in FIG. 29, the output wire 63 is greater than the power supply wire 61 in dimension in the x-direction.

The first element back surface 32A of the first switching element 30A is bonded to the power supply wire 61 by a conductive bonding material. Thus, the first drive pad electrode 31AA of the first switching element 30A is electrically connected to the power supply wire 61.

The second element back surface 32B of the second switching element 30B is bonded to the output wire 63 by a conductive bonding material. Thus, the first drive pad electrode 31BA of the second switching element 30B is electrically connected to the output wire 63.

As shown in FIG. 30, in the same manner as the embodiment, the driver 40 and the switching elements 30A and 30B are located at different positions in the z-direction. The driver 40 is located closer to the device main surface 11 than the element main surfaces 31A and 31B of the switching elements 30A and 30B. The driver 40 is disposed on the first resin layer 50A.

As viewed in the z-direction, the driver 40 overlaps a portion of each of the switching elements 30A and 30B and is located at a position differing from the switching elements 30A and 30B in the y-direction. More specifically, in the same manner as the embodiment, the driver 40 is disposed in relation to the switching elements 30A and 30B so that one driver pad electrode 43 is opposed to the first control pad electrode 31AC of the first switching element 30A in the z-direction and another driver pad electrode 43 is opposed to the second control pad electrode 31BC of the second switching element 30B in the z-direction. As viewed in the z-direction, the driver 40 projects from the switching elements 30A and 30B toward the substrate side surface 23. The connection structure of the driver 40 with the control wires 64 is the same as that of the embodiment.

The first switching element 30A and the second switching element 30B are electrically connected to the driver 40. More specifically, the first control pad electrode 31AC of the first switching element 30A is electrically connected to one of the driver pad electrodes 43 of the driver 40. The second control pad electrode 31BC of the second switching element 30B is electrically connected to another one of the driver pad electrodes 43 of the driver 40. The arrangement relationship and the connection structure of the first switching element 30A and the second switching element 30B with the driver 40 are the same as the arrangement relationship and the connection structure of the switching elements 30A and 30B with the driver 40 of the embodiment. That is, the first control pad electrode 31AC and one of the driver pad electrodes 43 are electrically connected by the first control via conductor 81. The second control pad electrode 31BC and another one of the driver pad electrodes 43 are electrically connected by the second control via conductor 82.

The second drive pad electrode 31AB of the first switching element 30A and the output wire 63 are electrically connected by an output connection conductor 92. The output connection conductor 92 includes first output via conductors 92*a* that are connected to the second drive pad electrode 31AB, second output via conductors 92*b* that are connected to the output wire 63, and an output connection wire 92*c* that connects the first output via conductors 92*a* to the second output via conductors 92*b*.

As viewed in the z-direction, each of the first output via conductors 92*a* overlaps the second drive pad electrode 31AB. The first output via conductors 92*a* are spaced apart from each other in the x-direction and the y-direction. The first output via conductors 92*a* and the first power supply via conductors 83*a* are the same in structure and size. Each of the first output via conductors 92*a* is in contact with the second drive pad electrode 31AB.

The output wire 63 includes an extension 63*a* extending from the second switching element 30B in the x-direction. As viewed in the z-direction, each of the second output via conductors 92*b* overlaps the extension 63*a*. The extension 63*a* extends toward the first switching element 30A with respect to the second switching element 30B in the x-direction. Thus, the second output via conductors 92*b* are disposed between the first switching element 30A and the second switching element 30B in the x-direction. The second output via conductors 92*b* are spaced apart from each other in the x-direction and the y-direction. The second output via conductors 92*b* and the second power supply via conductors 83*b* are the same in structure and size. Each of the second output via conductors 92*b* is in contact with the output wire 63.

As viewed in the z-direction, the output connection wire 92*c* extends to overlap the first output via conductors 92*a* and the second output via conductors 92*b* in the x-direction. The output connection wire 92*c* is in contact with the first output via conductors 92*a* and the second output via conductors 92*b*. The output connection wire 92*c* is disposed on the first resin layer 50A (refer to FIG. 5).

The second drive pad electrode 31BB of the second switching element 30B is electrically connected to the ground wire 62 by a ground connection conductor 84. The ground connection conductor 84 of the modified example and the ground connection conductor 84 of the above embodiment have the same structure.

In the embodiment, the external terminals 70 are disposed on the device back surface 12. Alternatively, the external terminals 70 may be disposed on the device main surface 11. In this case, the substrate 20 is formed on, for example, the second resin layer 50B. That is, the first resin layer 50A, the second resin layer 50B, and the substrate 20 are stacked in the semiconductor device 10X in this order. The switching elements 30A and 30B are encapsulated in the first resin layer 50A. The driver 40 is encapsulated in the second resin layer 50B. The power supply wire 61, the ground wire 62, the output wire 63, and the control wires 64 of the substrate 20 are electrically connected to the switching elements 30A and 30B and the driver 40 by via conductors that extend through the first resin layer 50A and the second resin layer 50B and connection wires that are formed on the second resin layer 50B.

In the embodiment, the second resin layer 50B encapsulates the driver 40 without exposing the driver 40. For example, the second resin layer 50B may encapsulate the driver 40 so that the driver main surface 41 is exposed from the second resin layer 50B in the z-direction.

In the embodiment, the switching elements 30A and 30B are disposed on the substrate main surface 21 of the substrate 20, and the switching elements 30A and 30B are not exposed from the device back surface 12. Alternatively, for example, the element back surfaces 32A and 32B of the switching elements 30A and 30B may be exposed from the device back surface 12 in the z-direction.

In the embodiment, the switching elements 30A and 30B are disposed on the substrate main surface 21 of the substrate 20, and the driver 40 is disposed on the first resin layer 50A. Alternatively, in an example, the driver 40 may be disposed on the substrate main surface 21, and the switching elements 30A and 30B may be disposed on the first resin layer 50A. The driver 40 is encapsulated by the first resin layer 50A. The switching elements 30A and 30B are encapsulated by the second resin layer 50B. The second resin layer 50B may be omitted.

In the embodiment, the connection conductors 88*a* and 88*b* may be omitted. In this case, the first control via conductor 81 is electrically connected to one driver pad electrode 43 of the driver 40 by a conductive bonding material. The second control via conductor 82 is electrically connected to another driver pad electrode 43 of the driver 40 by a conductive bonding material.

In the embodiment, the arrangement relationship of the power supply wire 61, the ground wire 62, and the output wire 63 may be changed in any manner. In an example, the power supply wire 61 is disposed between the ground wire 62 and the output wire 63 in the x-direction.

In the embodiment, the first switching element 30A and the second switching element 30B differ in structure. Instead, for example, the first switching element 30A and the second switching element 30B may have the same structure. This allows identical elements to be used as the first switching element 30A and the second switching element 30B in the semiconductor device 10, thereby reducing the manufacturing costs of the semiconductor device 10.

In the embodiment, the first drive pad electrode 31AA of the first switching element 30A and the power supply wire 61 may be connected by, for example, one or more wires. The second drive pad electrode 31AB of the first switching element 30A and the first drive pad electrode 31BA of the second switching element 30B may be connected by, for example, one or more wires. The second drive pad electrode 31BB of the second switching element 30B and the ground wire 62 may be connected by, for example, one or more wires.

In the embodiment, the number of first control via conductors 81 and the number of second control via conductors 82 may be changed in any manner. In an example, a plurality of first control via conductors 81 may be included, and a plurality of second control via conductors 82 may be included.

In the embodiment, the number of first power supply via conductors 83a and the number of second power supply via conductors 83b in the power supply connection conductor 83 may be changed in any manner. In an example, a single first power supply via conductor 83a may be used, and a single second power supply via conductor 83b may be used.

In the embodiment, the number of first ground via conductors 84a and the number of second ground via conductors 84b in the ground connection conductor 84 may be changed in any manner. In an example, a single first ground via conductor 84a may be used, and a single second ground via conductor 84b may be used.

In the embodiment, the number of output via conductors 85a in the output connection conductor 85 may be changed in any manner. In an example, a single output via conductor 85a may be used.

In the embodiment, the number of first drive via conductors 87a and the number of second drive via conductors 87b in the element connection conductor 87 may be changed in any manner. In an example, a single first drive via conductor 87a may be used, and a single second drive via conductor 87b may be used.

In the embodiment, the diameter of each of the control via conductors 81 and 82, the power supply via conductors 83a and 83b, the ground via conductors 84a and 84b, the output via conductors 85a, and the drive via conductors 87a and 87b may be changed in any manner. In an example, the control via conductors 81 and 82, the power supply via conductors 83a and 83b, the ground via conductors 84a and 84b, the output via conductors 85a, and the drive via conductors 87a and 87b may have the same diameter.

In the embodiment, the switching elements 30A and 30B are encapsulated by the first resin layer 50A. Instead, for example, the first resin layer 50A may be formed of a first encapsulation layer that encapsulates the first switching element 30A and a second encapsulation layer that encapsulates the second switching element 30B. The first encapsulation layer and the second encapsulation layer are formed separately. Thus, the semiconductor device 10 may include resin layers that separately encapsulate switching elements.

In the embodiment, the number and the arrangement of the first drive pad electrode 31AA, the second drive pad electrode 31AB, and the first control pad electrode 31AC of the first switching element 30A may be changed in any manner. In an example, a plurality of drive pad electrodes 31AB and a plurality of drive pad electrodes 31AB may be formed on the first element main surface 31A. In this case, as viewed in the z-direction, the first drive pad electrodes 31AA and the second drive pad electrodes 31AB may be aligned with each other in a direction in which the short sides of the first element main surface 31A extend and be staggered in a direction in which the long sides of the first element main surface 31A extend.

In the embodiment, the number and the arrangement of the first drive pad electrode 31BA, the second drive pad electrode 31BB, and the second control pad electrode 31BC of the second switching element 30B may be changed in any manner. In an example, a plurality of drive pad electrodes 31BA and a plurality of drive pad electrodes 31BB may be formed on the second element main surface 31B. In this case, as viewed in the z-direction, the first drive pad electrodes 31BA and the second drive pad electrodes 31BB may be aligned with each other in a direction in which the short sides of the second element main surface 31B extend and be staggered in a direction in which the long sides of the second element main surface 31B extend. The third switching element 30C and the fourth switching element 30D shown in FIGS. 25 and 26 may be changed in the same manner.

In the embodiment, in the method for manufacturing the semiconductor device 10, the grinding step of grinding the first resin layer 850A in the z-direction may be omitted from the first resin layer forming step.

In the embodiment, the dimension of the first resin layer 50A in the z-direction may be changed in any manner. In an example, the portion of the first resin layer 50A covering the element main surfaces 31A and 31B of the switching elements 30A and 30B may have the same thickness (the distance D) as the portion of the second resin layer 50B covering the driver main surface 41 of the driver 40.

CLAUSES

The technical aspects that are understood from the above embodiment and the modified examples will be described below.

A1. A semiconductor device, comprising:
a switching element; and
a resin layer encapsulating at least the driver, a thickness-wise direction of the resin layer being defined as a height-wise direction of the semiconductor device;
a driver that drives the switching element, the driver and the switching element being disposed at different positions in the height-wise direction of the semiconductor device; and
a control via conductor extending through the resin layer in the height-wise direction of the semiconductor device and electrically connecting the switching element to the driver.
B1. A semiconductor device, comprising:
a switching element; and
a resin layer encapsulating at least the switching element, a thickness-wise direction of the resin layer being defined as a height-wise direction of the semiconductor device;

a driver that drives the switching element, the driver and the switching element being disposed at different positions in the height-wise direction of the semiconductor device; and a control via conductor extending through the resin layer in the height-wise direction of the semiconductor device and electrically connecting the switching element to the driver.

B2. The semiconductor device according to clause B1, wherein as viewed in the height-wise direction of the semiconductor device, the driver overlaps a portion of the switching element.

B3. The semiconductor device according to clause B1, wherein the switching element includes an element main surface on which a control pad electrode is formed, the control pad electrode is electrically connected to the control via conductor, the driver includes a driver main surface and a driver back surface that face in opposite directions in the height-wise direction of the semiconductor device, the driver main surface and the element main surface face in the same direction, a driver pad electrode is formed on the driver back surface and is electrically connected to the control via conductor, the control pad electrode and the driver pad electrode are opposed to each other in the height-wise direction of the semiconductor device, the control pad electrode and the driver pad electrode are connected by the control via conductor, and the control via conductor has a dimension in the height-wise direction of the semiconductor device that is less than 1 mm.

B4. The semiconductor device according to any one of clauses B1 to B3, wherein the driver is disposed on the resin layer.

B5. The semiconductor device according to clause B4, wherein the driver includes a driver main surface and a driver back surface that face in opposite directions in the height-wise direction of the semiconductor device, the driver main surface and the element main surface face in the same direction, a driver pad electrode is formed on the driver back surface and is electrically connected to the control via conductor, and the driver pad electrode is bonded to the control via conductor by a conductive bonding material.

B6. The semiconductor device according to clause B1, wherein the switching element includes a first switching element and a second switching element, and as viewed in the height-wise direction of the semiconductor device, the driver overlaps with a portion of the first switching element and a portion of the second switching element.

B7. The semiconductor device according to clause B1, wherein each of the first element main surface of the first switching element and the second element main surface of the second switching element includes a first drive pad electrode and a second drive pad electrode, the second drive pad electrode of the first switching element is connected to the first drive pad electrode of the second switching element by an element connection conductor, the element connection conductor includes a first drive via conductor connected to the second drive pad electrode of the first switching element, a second drive via conductor connected to the first drive pad electrode of the second switching element, and a drive connection wire connecting the first drive via conductor to the second drive via conductor, and the drive connection wire is disposed on the resin layer.

B8. The semiconductor device according to clause B7, further comprising:

a substrate on which the first switching element and the second switching element are mounted, wherein the substrate includes a power supply wire, a ground wire, and an output wire, the power supply wire is electrically connected to the first drive pad electrode of the first switching element, the ground wire is electrically connected to the second drive pad electrode of the second switching element, the output wire is electrically connected to the second drive pad electrode of the first switching element and the first drive pad electrode of the second switching element, the semiconductor device comprises a power supply connection conductor, a ground connection conductor, and an output connection conductor, the power supply connection conductor electrically connects the first drive pad electrode of the first switching element to the power supply wire, the ground connection conductor electrically connects the second drive pad electrode of the second switching element to the ground wire, the output connection conductor electrically connects the second drive pad electrode of the first switching element and the first drive pad electrode of the second switching element to the output wire, the power supply connection conductor includes a first power supply via conductor connected to the first drive pad electrode of the first switching element, a second power supply via conductor connected to the power supply wire, and a power supply connection wire that connects the first power supply via conductor to the second power supply via conductor, the ground connection conductor includes a first ground via conductor connected to the second drive pad electrode of the second switching element, a second ground via conductor connected to the ground wire, and a ground connection wire that connects the first ground via conductor to the second ground via conductor, the output connection conductor includes the element connection conductor and an output via conductor connected to the drive connection wire of the element connection conductor, and the power supply connection wire and the ground connection wire are disposed on the resin layer.

C1. A method for manufacturing a semiconductor device, the method comprising:

forming a first resin layer that encapsulates a switching element;

forming a through hole in the first resin layer so that the switching element is exposed;

embedding a via conductor in the through hole; and mounting a driver that drives the switching element on the first resin layer so that the driver is electrically connected to the via conductor.

C2. The method according to clause C1, further comprising: forming a second resin layer on the first resin layer so that the second resin layer encapsulates the driver.

C3. The method according to clause C1, wherein the mounting a driver includes flip-chip-mounting the driver on the first resin layer.

REFERENCE SIGNS LIST 10) semiconductor device; 20) substrate; 30) switching element; 30A) first switching element; 30B) second switching element; 30C) third switching element; 30D) fourth switching element; 31) element main surface; 31A) first element main surface; 31AA) first drive pad electrode; 31AB) second drive pad electrode; 31AC) first control pad electrode; 32A) first element back surface; 31B) second element main surface; 31BA) first drive pad electrode; 31BB) second drive pad electrode; 31BC) second control pad electrode; 32B) second element back surface; 31C) third element main surface; 31CA) first drive pad electrode; 31CB) second drive pad electrode; 31CC) third control pad electrode; 31D) fourth element main surface; 31DA) first drive pad electrode; 31DB) second drive pad electrode; 31DC) fourth control pad electrode; 33A) first drive pad electrode; 33B) second drive pad electrode; 33C) control pad electrode; 40) driver; 40A) first driver; 40B) second driver; 41) driver main surface; 42) driver back surface; 43, 43A, 43B) driver pad electrode; 50) encapsulation resin (resin layer); 50A) first resin layer; 50B) second resin layer; 57) interface between first resin layer and a second resin layer; 61, 61A, 61B) power supply wire; 62, 62A, 62B) ground wire; 63, 63A, 63B) output wire; 64, 64A, 64B) control wire; 70) external terminal; 71) power supply terminal; 72) ground terminal; 73) output terminal; 81, 81A) first control via conductor (control via conductor); 82, 82A) second control via conductor (control via conductor); 83, 83A, 83B) power supply connection conductor; 83a) first power supply via conductor; 83b) second power supply via conductor; 83c) power supply connection wire; 84, 84A, 84B) ground connection conductor; 84a) first ground via conductor; 84b) second ground via conductor; 84c) ground connection wire; 85, 85A, 85B) output connection conductor; 85a) output via conductor; 87, 87A, 87B) element connection conductor; 87a) first drive via conductor; 87b) second drive via conductor; 87c) drive connection wire; 90) connection via conductor; 92) output connection conductor; 850A) first resin layer; 850B) second resin layer; 857) interface

The invention claimed is:

1. A semiconductor device, comprising:
a switching element; and
a resin layer encapsulating at least the switching element, a thickness-wise direction of the resin layer being defined as a height-wise direction of the semiconductor device;
a driver that drives the switching element, the driver and the switching element being disposed at different positions in the height-wise direction of the semiconductor device; and
a control via conductor extending through the resin layer in the height-wise direction of the semiconductor device and electrically connecting the switching element to the driver, wherein
the switching element includes an element main surface on which a control pad electrode is formed,
the control pad electrode is electrically connected to the control via conductor, the driver includes a driver main surface and a driver back surface that face in opposite directions in the height-wise direction of the semiconductor device,
the driver main surface and the element main surface face in the same direction,
a driver pad electrode is formed on the driver back surface and is electrically connected to the control via conductor,
the control pad electrode and the driver pad electrode are opposed to each other in the height-wise direction of the semiconductor device,
the control pad electrode and the driver pad electrode are connected by the control via conductor,
the resin layer includes a first resin layer and a second resin layer formed on the first resin layer in the height-wise direction of the semiconductor device,
the first resin layer encapsulates the switching element,
the second resin layer encapsulates the driver,
the control via conductor joins the control pad electrode to an interface between the first resin layer and the second resin layer, and
the control via conductor has a dimension in the height-wise direction of the semiconductor device that is less than a distance between the driver and the second resin layer in the height-wise direction of the semiconductor device.

2. The semiconductor device according to claim 1, wherein
the switching element includes a first switching element, a second switching element, a third switching element, and a fourth switching element, and
the driver includes a first driver that drives each of the first switching element and the second switching element and a second driver that drives each of the third switching element and
the fourth switching element.

3. The semiconductor device according to claim 1, wherein the switching element includes a gallium nitride high electron mobility transistor (GaN HEMT).

4. A semiconductor device, comprising:
a switching element; and
a resin layer encapsulating at least the switching element, a thickness-wise direction of the resin layer being defined as a height-wise direction of the semiconductor device;
a driver that drives the switching element, the driver and the switching element being disposed at different positions in the height-wise direction of the semiconductor device; and
a control via conductor extending through the resin layer in the height-wise direction of the semiconductor device and electrically connecting the switching element to the driver, wherein
the switching element includes a first switching element and a second switching element,
the control via conductor includes a first control via conductor that connects the first switching element to the driver and a second control via conductor that connects the second switching element to the driver,
the first switching element includes a first element main surface on which a first control pad electrode is formed,
the first control pad electrode is electrically connected to the first control via conductor,
the second switching element includes a second element main surface on which a second control pad electrode is formed, the second control pad electrode is electrically connected to the second control via conductor, the second element main surface and the first element main surface face in the same direction, the driver includes a driver main surface and a driver back surface that face in opposite directions in the height-wise direction of the semiconductor device, the driver main surface, the first element main surface, and the second element main surface face in the same direction, the driver back surface includes a first driver pad electrode and a second driver pad electrode, the first driver pad electrode is electrically connected to the first control via conductor, the second driver pad electrode is electrically connected to the second control via conductor, the first control pad electrode is opposed to the first driver pad electrode in the height-wise direction of the semiconductor device, the second control pad electrode is opposed to the second driver pad electrode in the height-wise direction of the semiconductor device, the first control pad electrode and the first driver pad electrode are connected by the first control via conductor, the resin layer includes a first resin layer and a second resin layer formed on the first resin layer in the height-wise direction of the semiconductor device, the first resin layer encapsulates the first switching element and the second switching element, the second resin layer encapsulates the driver, the first control via conductor joins the first control pad electrode to an interface between the first resin layer and the second resin layer, and the second control via conductor joins the second control pad electrode to the interface between the first resin layer and the second resin layer.

5. The semiconductor device according to claim 4, wherein the first control via conductor has a dimension in the height-wise direction of the semiconductor device that is less than a distance between the driver and the second resin layer in the height-wise direction of the semiconductor device, and the second control via conductor has a dimension in the height-wise direction of the semiconductor device that is less than the distance between the driver and the second resin layer in the height-wise direction of the semiconductor device.

6. The semiconductor device according to claim 4, wherein the first switching element includes a first element main surface on which a first control pad electrode is formed, the first control pad electrode is electrically connected to the first control via conductor, the second switching element includes a second element main surface on which a second control pad electrode is formed, the second control pad electrode is electrically connected to the second control via conductor, each of the first element main surface of the first switching element and the second element main surface of the second switching element includes a first drive pad electrode and a second drive pad electrode, the second drive pad electrode of the first switching element is connected to the first drive pad electrode of the second switching element by an element connection conductor, and the element connection conductor includes a first drive via conductor connected to the second drive pad electrode of the first switching element, a second drive via conductor connected to the first drive pad electrode of the second switching element, and a drive connection wire connecting the first drive via conductor to the second drive via conductor.

7. The semiconductor device according to claim 6, wherein the first drive via conductor includes multiple first drive via conductors, and the second drive via conductor includes multiple second drive via conductors.

8. The semiconductor device according to claim 6, further comprising:

a substrate on which the first switching element and the second switching element are mounted, wherein the substrate includes a power supply wire, a ground wire, and an output wire, the power supply wire is electrically connected to the first drive pad electrode of the first switching element, the ground wire is electrically connected to the second drive pad electrode of the second switching element, the output wire is electrically connected to the second drive pad electrode of the first switching element and the first drive pad electrode of the second switching element, the semiconductor device comprises a power supply connection conductor, a ground connection conductor, and an output connection conductor, the power supply connection conductor electrically connects the first drive pad electrode of the first switching element to the power supply wire, the ground connection conductor electrically connects the second drive pad electrode of the second switching element to the ground wire, the output connection conductor electrically connects the second drive pad electrode of the first switching element and the first drive pad electrode of the second switching element to the output wire, the power supply connection conductor includes a first power supply via conductor connected to the first drive pad electrode of the first switching element, a second power supply via conductor connected to the power supply wire, and a power supply connection wire that connects the first power supply via conductor to the second power supply via conductor, the ground connection conductor includes a first ground via conductor connected to the second drive pad electrode of the second switching element, a second ground via conductor connected to the ground wire, and a ground connection wire that connects the first ground via conductor to the second ground via conductor, and the output connection conductor includes the element connection conductor and an output via conductor connected to the drive connection wire of the element connection conductor.

9. The semiconductor device according to claim 8, wherein the first power supply via conductor includes multiple first power supply via conductors, the second power supply via conductor includes multiple second power supply via conductors, the first ground via conductor includes multiple first ground via conductors, the second ground via conductor includes multiple second ground via conductors, and the output via conductor includes multiple output via conductors.

10. The semiconductor device according to claim 6, further comprising:

a substrate on which the first switching element and the second switching element are mounted, wherein the substrate includes a power supply wire electrically connected to the first drive pad electrode of the first switching element, a ground wire electrically connected to the second drive pad of the second switching element, and an output wire electrically connected to the second drive pad electrode of the first switching element and the first drive pad electrode of the second switching element, a power supply terminal, a ground terminal, and an output terminal are disposed on a side of the substrate opposite to a side on which the first switching element and the second switching element are mounted, the power supply terminal is electrically connected to the power supply wire, the ground terminal is electrically connected to the ground wire, and the output terminal is electrically connected to the output wire.

* * * * *